US012347773B2

(12) United States Patent
Sharangpani et al.

(10) Patent No.: US 12,347,773 B2
(45) Date of Patent: Jul. 1, 2025

(54) THREE-DIMENSIONAL MEMORY DEVICE CONTAINING VARIABLE THICKNESS WORD LINES WITH REDUCED LENGTH METAL NITRIDE DIFFUSION BARRIERS AND METHODS FOR FORMING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Fei Zhou, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 596 days.

(21) Appl. No.: 17/662,926

(22) Filed: May 11, 2022

(65) Prior Publication Data

US 2023/0369208 A1 Nov. 16, 2023

(51) Int. Cl.
*H01L 23/528* (2006.01)
*H01L 23/535* (2006.01)
*H10B 41/27* (2023.01)
*H10B 43/27* (2023.01)

(52) U.S. Cl.
CPC ........ *H01L 23/5283* (2013.01); *H01L 23/535* (2013.01); *H10B 41/27* (2023.02); *H10B 43/27* (2023.02)

(58) Field of Classification Search
CPC ... H01L 23/5283; H01L 23/535; H10B 41/27; H10B 43/27; H10B 43/50
See application file for complete search history.

(56) References Cited

U.S. PATENT DOCUMENTS

| 5,915,167 | A | 6/1999 | Leedy |
| 9,716,105 | B1 | 7/2017 | Tsutsumi |
| 10,083,982 | B2 | 9/2018 | Shigemura et al. |
| 10,276,583 | B2 | 4/2019 | Sharangpani et al. |
| 10,361,213 | B2 | 7/2019 | Sharangpani et al. |

(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Shih Tsun A Chou
(74) *Attorney, Agent, or Firm* — THE MARBURY LAW GROUP PLLC

(57) ABSTRACT

A semiconductor structure includes an alternating stack of insulating layers and electrically conductive layers, memory openings vertically extending through the alternating stack, memory opening fill structures located in the memory openings and including a respective vertical semiconductor channel and a respective vertical stack of memory elements, and a first backside trench fill structure and a second backside trench fill structure. Each of the electrically conductive layers includes a respective metal nitride liner and a respective metal fill material region. The respective metal fill material region includes a respective first-thickness portion having a respective first vertical thickness and a respective second-thickness portion having a respective second vertical thickness that is greater than the respective first vertical thickness.

11 Claims, 42 Drawing Sheets

(56) References Cited

U.S. PATENT DOCUMENTS

| | | | |
|---|---|---|---|
| 10,453,854 | B2 | 10/2019 | Kanno et al. |
| 10,461,163 | B2 | 10/2019 | Kanakamedala et al. |
| 10,529,620 | B2 | 1/2020 | Sharangpani et al. |
| 10,608,010 | B2 | 3/2020 | Terasawa et al. |
| 10,615,123 | B2 | 4/2020 | Hinoue et al. |
| 10,629,616 | B1 | 4/2020 | Kai et al. |
| 10,651,196 | B1 | 5/2020 | Sharangpani et al. |
| 10,700,089 | B1 | 6/2020 | Hojo et al. |
| 10,741,572 | B2 | 8/2020 | Sharangpani et al. |
| 11,195,781 | B2 | 12/2021 | Okina et al. |
| 11,201,107 | B2 | 12/2021 | Okina et al. |
| 11,217,532 | B2 | 1/2022 | Sharangpani et al. |
| 2017/0352669 | A1* | 12/2017 | Sharangpani ........... H10B 41/40 |
| 2017/0373079 | A1 | 12/2017 | Sharangpani et al. |
| 2018/0033646 | A1 | 2/2018 | Sharangpani et al. |
| 2018/0090373 | A1 | 3/2018 | Sharangpani et al. |
| 2018/0138194 | A1 | 5/2018 | Shigemura et al. |
| 2019/0148392 | A1 | 5/2019 | Kanno et al. |
| 2019/0148506 | A1 | 5/2019 | Kanakamedala et al. |
| 2019/0189630 | A1* | 6/2019 | Greenlee ........... H01L 21/28562 |
| 2019/0280001 | A1 | 9/2019 | Terasawa et al. |
| 2019/0287916 | A1 | 9/2019 | Sharangpani et al. |
| 2019/0287982 | A1* | 9/2019 | Hinoue ............. H01L 23/53266 |
| 2021/0335805 | A1 | 10/2021 | Kai et al. |
| 2021/0335999 | A1 | 10/2021 | Kai et al. |
| 2022/0028879 | A1 | 1/2022 | Mochizuki et al. |
| 2023/0043163 | A1* | 2/2023 | Surthi .................... H10B 41/10 |

OTHER PUBLICATIONS

U.S. Appl. No. 17/082,629, filed Oct. 28, 2020, SanDisk Technologies LLC.
U.S. Appl. No. 17/189,548, filed Mar. 1, 2021, SanDisk Technologies LLC.
U.S. Appl. No. 17/573,429, filed Jan. 11, 2022, SanDisk Technologies LLC.
U.S. Appl. No. 17/573,452, filed Jan. 11, 2022, SanDisk Technologies LLC.
U.S. Appl. No. 17/678,499, filed Feb. 23, 2022, SanDisk Technologies LLC.
Al-Shareef, H.N. et al., "Gate Dielectrics Formed by Remote Plasma Nitridation of Ultrathin IN-SITU Steam Generated (ISSG) Oxides," Electrochemical Society, Proceedings—Electrochemical Society, vol. 9, pp. 231-233, (2000).
Chiu, H. K. et al., "Characterization of Titanium Nitride Etch Rate and Selectivity to Silicon Dioxide in a Cl2 Helicon-Wave Plasma," Journal of Vacuum Science & Technology, vol. A 19, pp. 455-459, (2001); https://doi.org/10.1116/1.1342866.
Kim, H. et al., "Dielectric barrier characteristics of Si-rich silicon nitride films deposited by plasma enhanced atomic layer deposition," Journal of Vacuum Science & Technology, vol. A 35, pp. 01A101-1 to 01A101-07 (2017); https://doi.org/10.1116/1.4964889.
Shioya, Y. et al., "Effect of fluorine in chemical-vapor-deposited tungsten silicide film on electrical breakdown of SiO2 film," Journal of Applied Physics, vol. 61, pp. 5102-5109, (1987); https://doi.org/10.1063/1.338336.
Moslehi, M. M. et al., "Thermal Nitridation of Si and SiO2 for VLSI," IEEE Transactions on Electron Devices, vol. ED-32, No. 2, pp. 106-123, (1985).

* cited by examiner

THREE-DIMENSIONAL MEMORY DEVICE CONTAINING VARIABLE THICKNESS WORD LINES WITH REDUCED LENGTH METAL NITRIDE DIFFUSION BARRIERS AND METHODS FOR FORMING THE SAME

FIELD

The present disclosure relates generally to the field of semiconductor devices, and particularly to a three-dimensional memory device with variable thickness word lines and reduced length metal nitride diffusion barriers and methods for forming the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36. Support circuitry for performing write, read, and erase operations of the memory cells in the vertical NAND strings typically are provided by complementary metal oxide semiconductor (CMOS) devices formed on a same substrate as the three-dimensional memory device.

SUMMARY

According to an aspect of the present disclosure, a semiconductor structure is provided, which comprises: an alternating stack of insulating layers and electrically conductive layers; memory openings vertically extending through the alternating stack; memory opening fill structures located in the memory openings and comprising a respective vertical semiconductor channel and a respective vertical stack of memory elements; and a first backside trench fill structure and a second backside trench fill structure that laterally extend along a first horizontal direction and are spaced apart along a second horizontal direction. Each of the electrically conductive layers comprises a respective metal nitride liner and a respective metal fill material region. The respective metal fill material region comprises: a respective first-thickness portion having a respective first vertical thickness and contacting the respective metal nitride liner; and a respective second-thickness portion having a respective second vertical thickness that is greater than the respective first vertical thickness and not contacting the respective metal nitride liner, wherein the second-thickness portion located closer to the first backside trench fill structure than the first first-thickness portion.

According to another aspect of the present disclosure, a method of forming a semiconductor structure is provided, which comprises: forming an alternating stack of insulating layers and sacrificial material layers over a substrate; forming memory openings vertically extending through the alternating stack; forming memory opening fill structures in the memory openings, wherein each of the memory opening fill structures comprises a respective vertical semiconductor channel and a respective vertical stack of memory elements; forming backside trenches vertically extending through the alternating stack; forming backside recesses by removing the sacrificial material layers selective to the insulating layers and the memory opening fill structures; forming metal nitride liners in first volumes of the backside recesses that are more distal from the backside trenches than a threshold lateral spacing such that the metal nitride liners are not present in second volumes of the backside recesses that are less distal from the backside trenches than the threshold lateral spacing; and forming respective metal fill material regions both in the second volumes of the backside recesses and on the metal nitride liners in the first volumes of the backside recesses.

DETAILED DESCRIPTION

Figure 1:
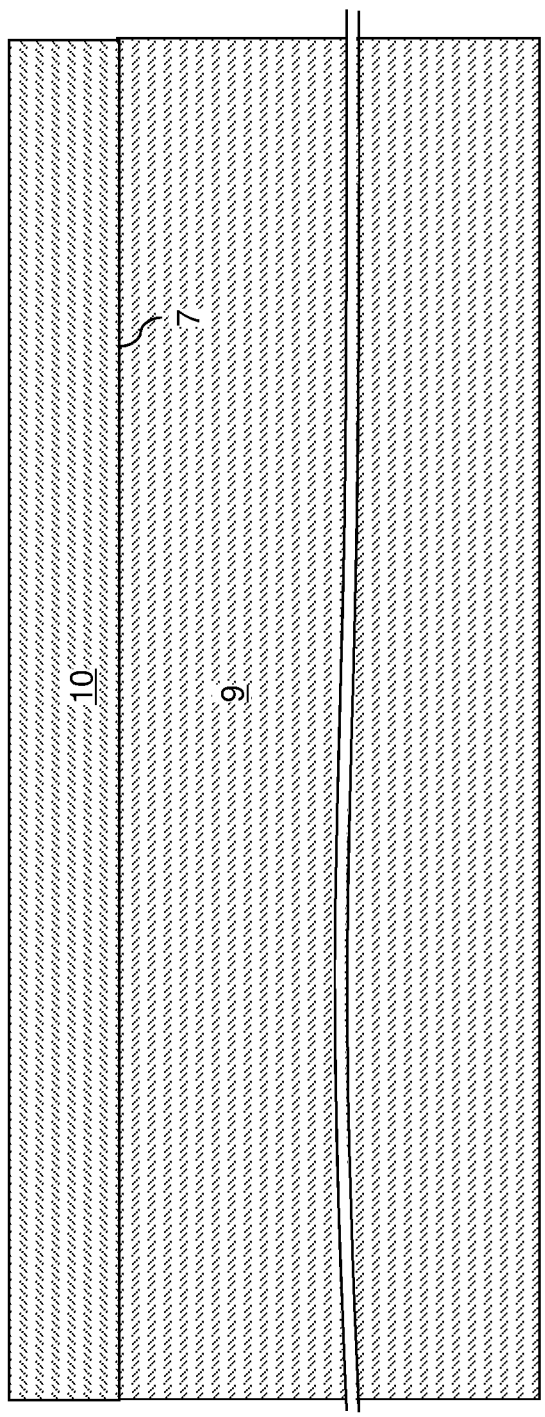
FIG. 1 is a schematic vertical cross-sectional view of an exemplary structure including a carrier substrate according to an embodiment of the present disclosure.

As discussed above, the embodiments of the present disclosure are directed to a three-dimensional memory device with variable thickness word lines and reduced length metal nitride diffusion barriers and methods for forming the same which provide enhanced fill properties for the word lines, the various aspects of which are described below. The embodiments of the present disclosure can be used to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices according to various embodiments of the present disclosure include a monolithic three-dimensional NAND string memory device, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Referring to FIG. 1, an exemplary structure according to an embodiment of the present disclosure is illustrated, which can be used, for example, to fabricate a device structure containing vertical NAND memory devices. The exemplary structure includes a carrier substrate 9 and a semiconductor material layer 10 located on a top surface of the carrier substrate 9. The carrier substrate 9 can include a substrate material layer, which may include a semiconductor material (such as silicon), a dielectric material (such as silicon oxide), or a conductive material (such as a metal). In one embodiment, the carrier substrate 9 and the semiconductor material layer 10 may be provided as a commercially available single crystalline silicon wafer. A surface portion of the single crystalline silicon wafer can include the semiconductor material layer 10 (which may comprise a doped well in the wafer or a semiconductor layer deposited on the wafer), and a bulk portion of the single crystalline silicon wafer can include the carrier substrate 9 that is subsequently removed, for example, by backside grinding. An interface 7 between the carrier substrate 9 and the semiconductor material layer 10 can be located at a depth that corresponds to a target stopping plane for the backside grinding process. Alternatively, the semiconductor material layer 10 can include a single crystalline or polycrystalline semiconductor material layer provided on the carrier substrate 9 including a material different from the material of the semiconductor material layer 10. In this case, the carrier substrate 9 can include an insulating material (such as sapphire or silicon oxide), a conductive material, or a semiconductor material different from the material of the semiconductor material layer 10. The thickness of the carrier substrate 9 can be thick enough to mechanically support the semiconductor material layer 10 and structures to be subsequently formed thereupon. For example, the carrier substrate 9 can have a thickness in a range from 60 microns to 1,000 microns. The thickness of the semiconductor material layer 10 may be in a range from 100 nm to 5,000 nm, although lesser and greater thicknesses can also be used. The semiconductor material layer 10 includes at least one elemental semiconductor material (e.g., a doped well in a single crystal silicon wafer or a deposited silicon layer), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 2:
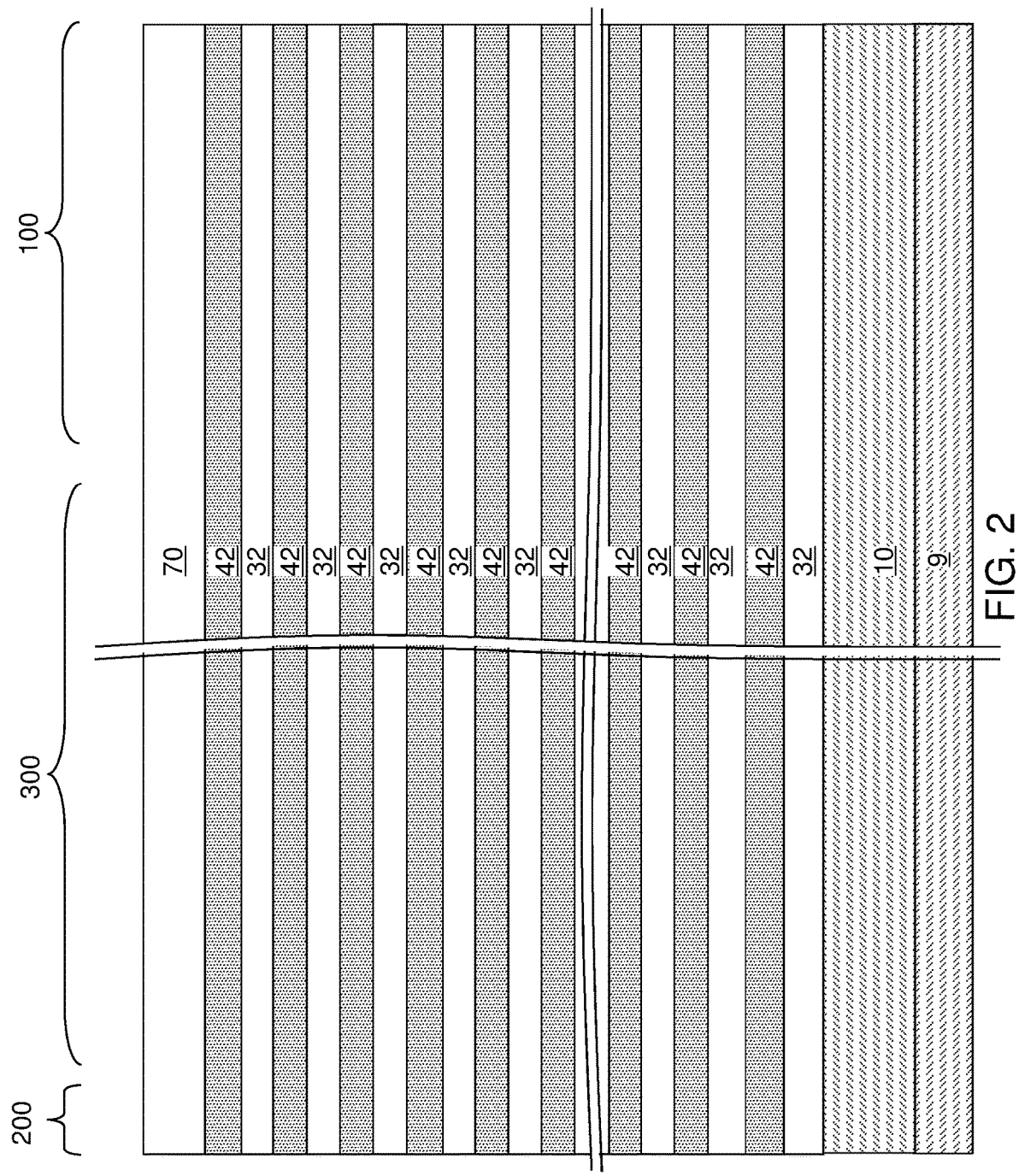
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the three-dimensional NAND string memory devices to be subsequently formed.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While an embodiment is described above in which the spacer material layers are sacrificial material layers 42 that are subsequently replaced with electrically conductive layers, in other embodiments the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The exemplary structure can include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed. In one alternative embodiment, a peripheral device region containing the at least one semiconductor device for a peripheral circuitry may be located in the memory array region 100 under the alternating stack (32, 42) in a CMOS under array configuration.

Figure 3:
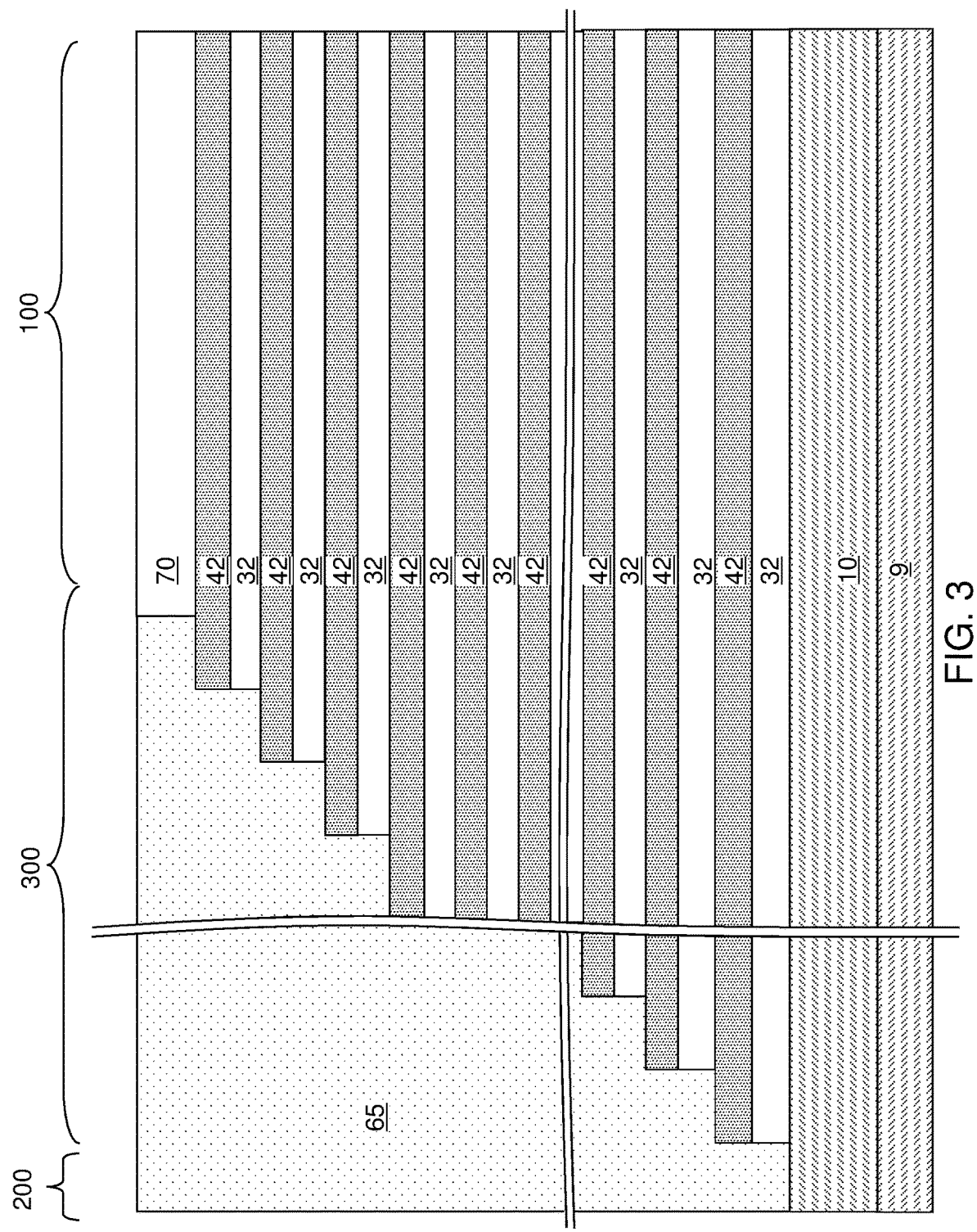
FIG. 3 is a schematic vertical cross-sectional view of the exemplary structure after formation of stepped surfaces and a stepped dielectric material portion according to an embodiment of the present disclosure.

Referring to FIG. 3, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
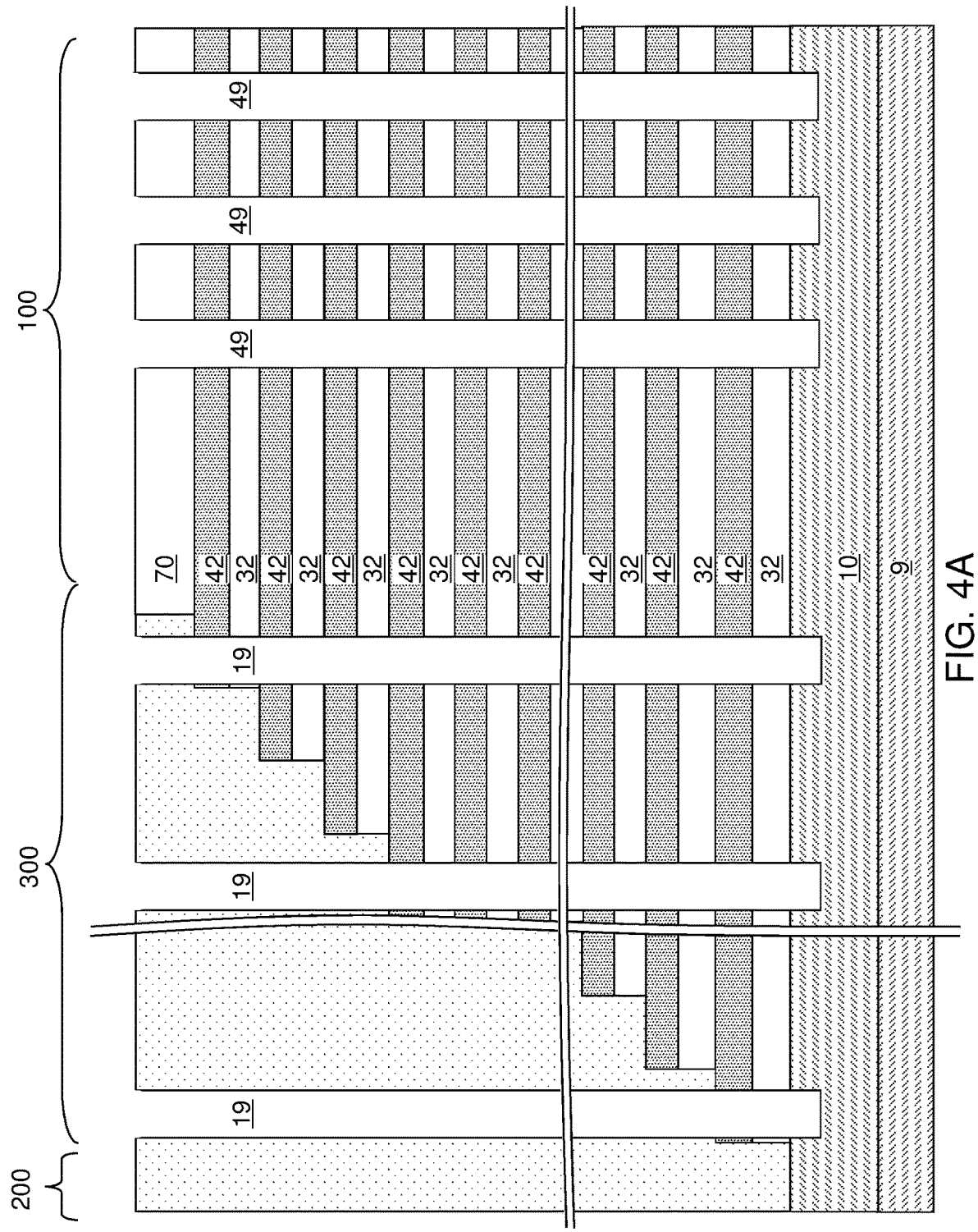
FIG. 4A is a schematic vertical cross-sectional view of the exemplary structure after formation of memory openings and support openings according to an embodiment of the present disclosure.
Figure 4B:
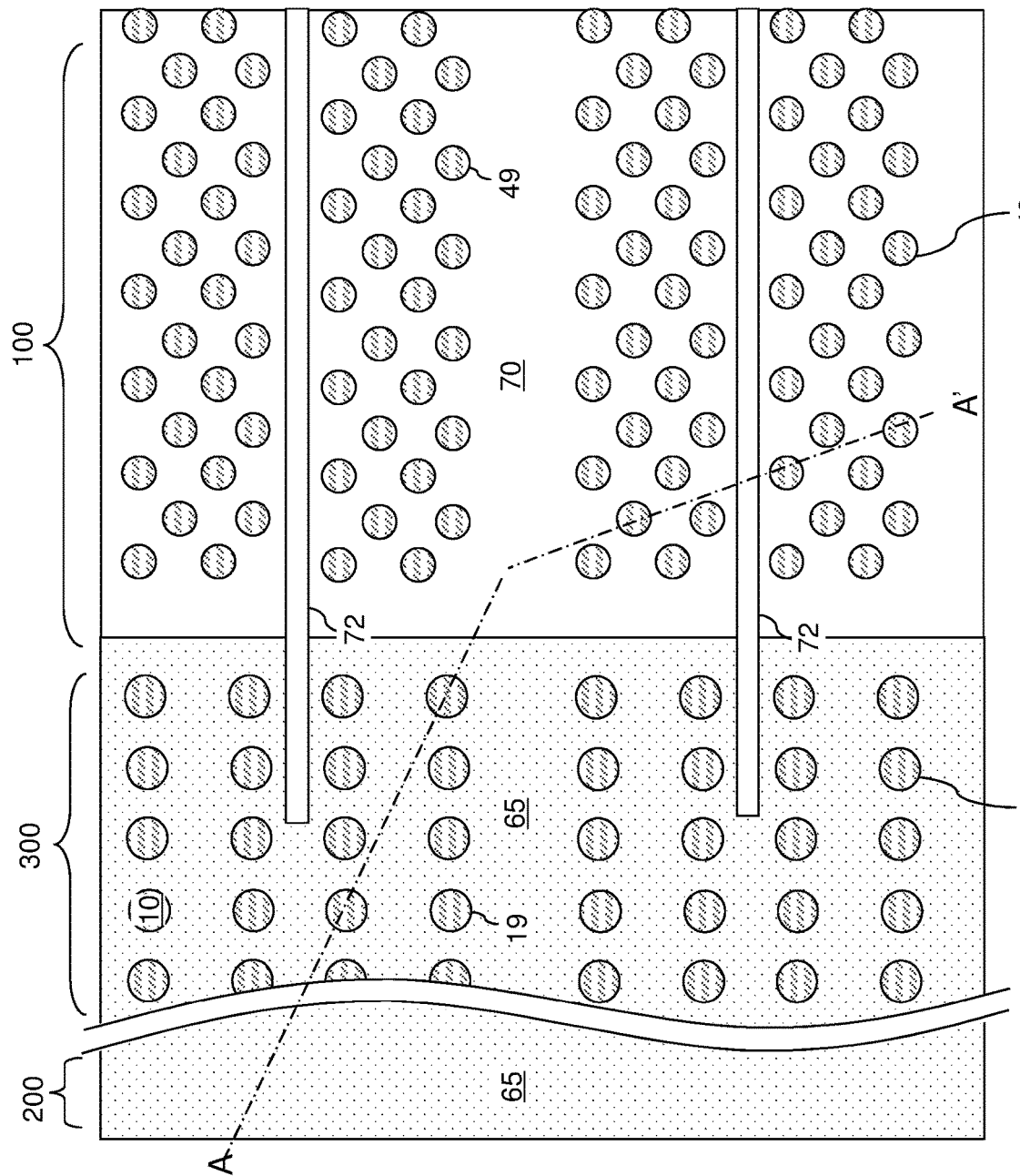
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100.

A two-dimensional array of support openings 19 can be formed in the staircase region 300.

FIGS. 5A-5E are sequential schematic vertical cross-sectional views of a memory opening within the exemplary structure during formation of a first exemplary memory opening fill structure therein according to an embodiment of the present disclosure. The same structural change occurs simultaneously in each of the other memory openings 49 and in each support opening 19.

FIGS. 5A-5E illustrate structural changes in a memory opening 49, which is one of the memory openings 49 in the exemplary structure of FIGS. 4A and 4B. The same structural change occurs simultaneously in each of the other memory openings 49 and in each support opening 19.

Figure 5B:
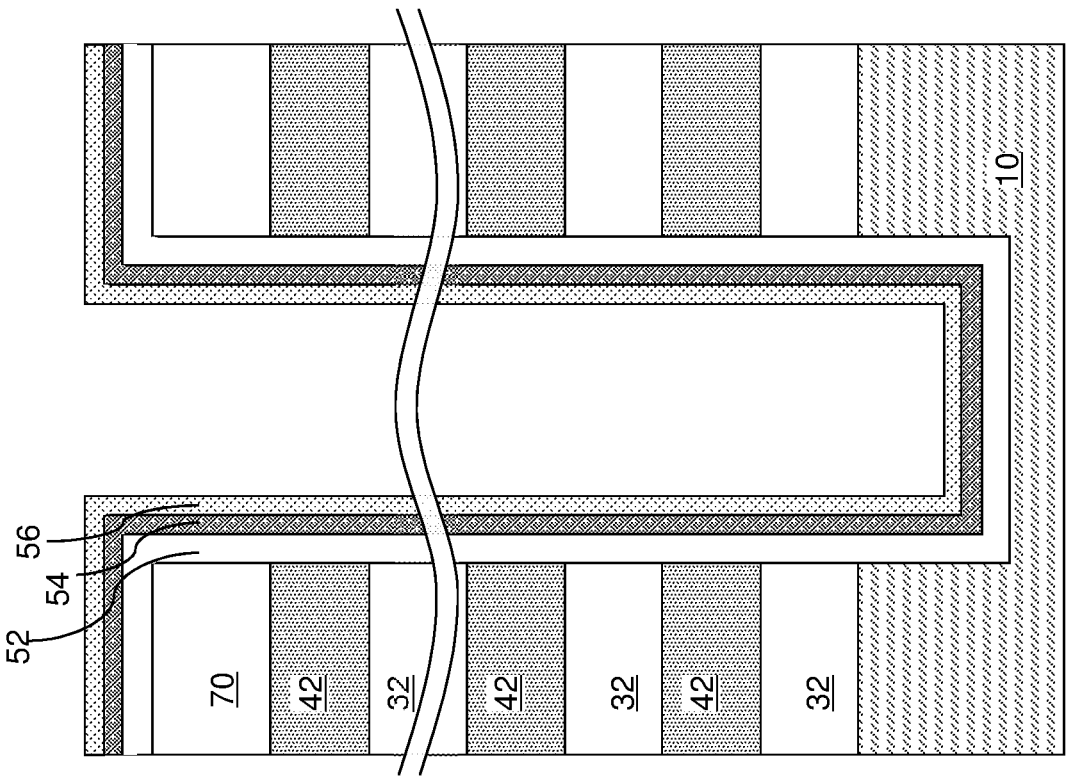
FIGS. 5A-5E are sequential schematic vertical cross-sectional views of a memory opening within the exemplary structure during formation of a memory opening fill structure therein according to an embodiment of the present disclosure.
Figure 5A:
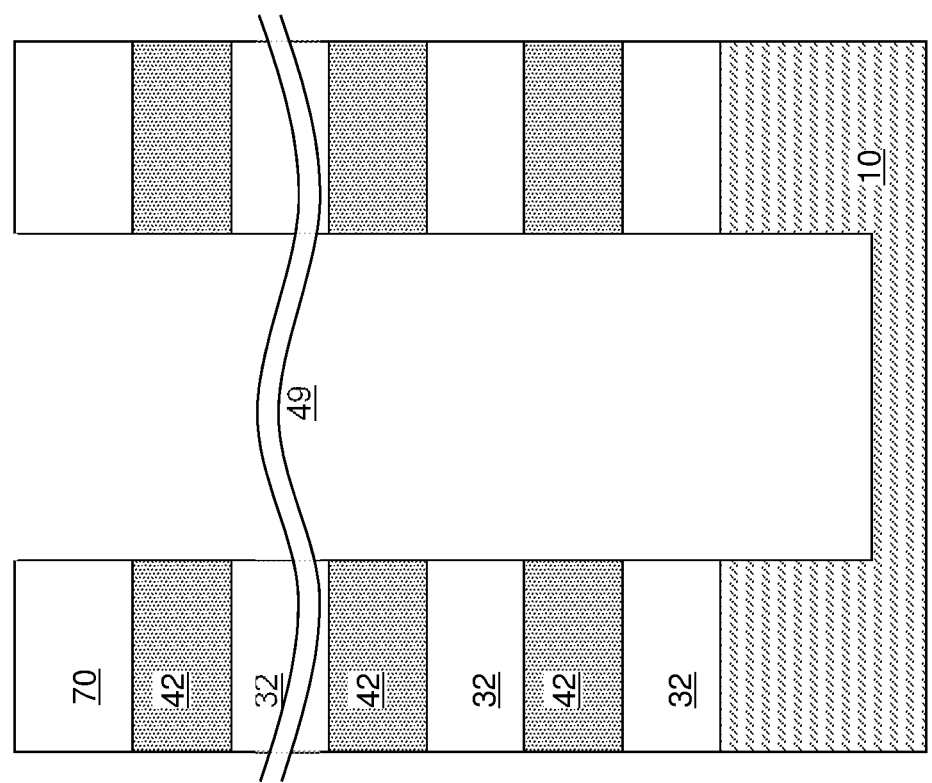

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the stepped dielectric material portion 65, a subset of layers in the alternating stack (32, 42), and into the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, a stack of layers including a blocking dielectric layer 52, a charge storage layer 54, and a tunneling dielectric layer 56 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metal element and at least oxygen. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In one embodiment, the blocking dielectric layer 52 may comprise a layer stack including a dielectric metal oxide blocking dielectric layer that is deposited directly on sidewalls of the memory openings 49 and sidewalls of the support openings 19, and a silicon oxide blocking dielectric layer that is deposited on the dielectric metal oxide blocking dielectric layer. For example, the blocking dielectric layer 52 may comprise a layer stack including an aluminum oxide blocking dielectric layer and a silicon oxide blocking dielectric layer. The thickness of the blocking dielectric layer 52 can be in a range from 3 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

Figures 5C, 5D:
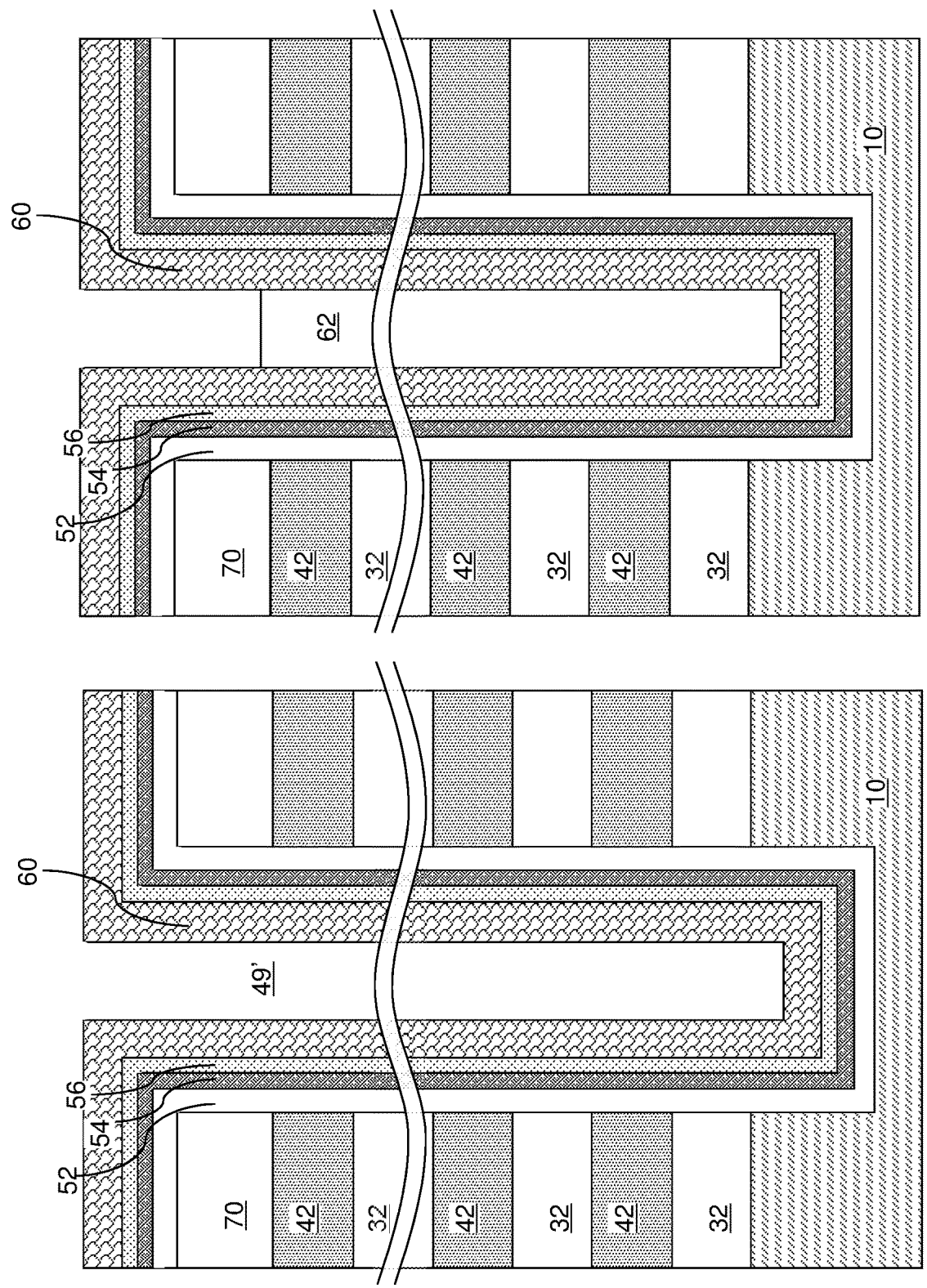

Referring to FIG. 5C, a semiconductor channel layer 60L can be deposited over the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). In one embodiment, the semiconductor channel layer 60L can be deposited as an amorphous semiconductor material. The thickness of the semiconductor channel layer 60L can be in a range from 2 nm to 10 nm, although lesser and greater thicknesses can also be used. A memory cavity 49' is formed in the volume of each memory opening 49 that is not filled with the deposited material layers (52, 54, 56, 60L).

Referring to FIG. 5D, in case the memory cavity 49' in each memory opening is not completely filled by the semiconductor channel layer 60L, a dielectric core layer can be deposited in the memory cavity 49' to fill any remaining portion of the memory cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The dielectric core layer can be subsequently recessed selective to the material of the semiconductor channel layer 60L, for example, by a recess etch. The material of the dielectric core layer is vertically recessed below the horizontal plane including the top surface of the insulating cap layer 70. Each remaining portion of the dielectric core layer constitutes a dielectric core 62.

Figure 5E:
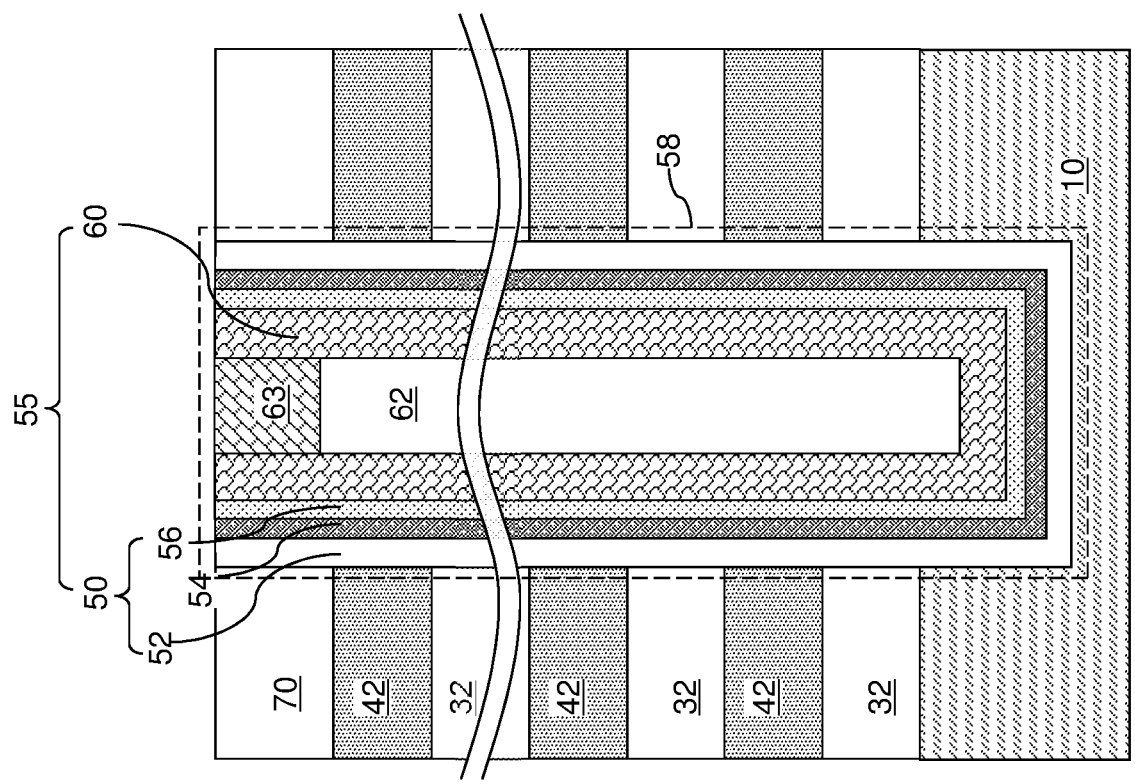

Referring to FIG. 5E, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. In one embodiment, the doped semiconductor material may be deposited as an amorphous semiconductor material. The dopant concentration in the doped semiconductor material having a doping of the second conductivity type can be in a range from $5.0 \times 10^{18}/cm^3$ to $2.0 \times 10^{21}/cm^3$, although lesser and greater dopant concentrations can also be used.

A planarization process can be performed to remove portions of the doped semiconductor material having a doping of the second conductivity type, the semiconductor channel layer 60L, the tunneling dielectric layer 56, the charge storage layer 54, and the blocking dielectric layer 52 from above the top surface of the insulating cap layer 70, for example, by chemical mechanical planarization (CMP) or a recess etch to form the drain regions 63. Each remaining portion of the semiconductor material having a doping of the second conductivity type constitutes a drain region 63. Each remaining portion of the semiconductor channel layer 60L constitutes a vertical semiconductor channel 60. Electrical current can flow through each vertical semiconductor channel 60 when a vertical NAND device including the vertical semiconductor channel 60 is turned on. Within each memory opening 49, a tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours. Each combination of a memory film 50 and a vertical semiconductor channel 60 constitutes a memory stack structure 55.

Each contiguous combination of a vertical semiconductor channel 60 and a memory film 50 constitutes a memory stack structure 55. Thus, each memory stack structure 55 can include a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 is herein referred to as a memory opening fill structure 58. Each combination of a memory film 50, a vertical semiconductor channel 60, a dielectric core 62, and a drain region 63 within each support opening 19 constitutes a support pillar structure. In one embodiment, the vertical semiconductor channel 60 and the drain region 63 within each memory opening fill structure 58 can be amorphous.

Figure 6:
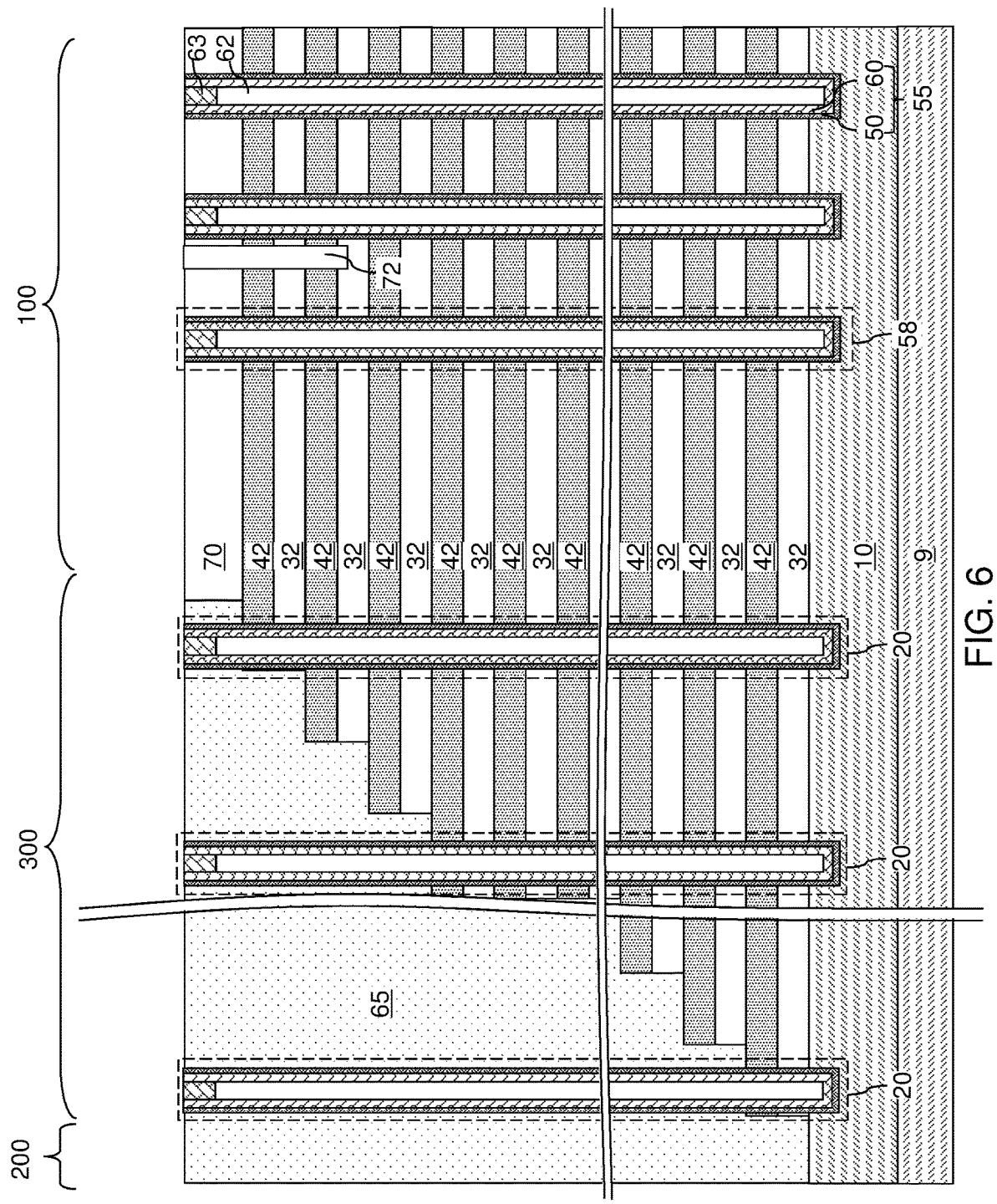
FIG. 6 is a schematic vertical cross-sectional view of the exemplary structure after formation of memory opening fill structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described using the illustrated configuration for the memory stack structure, the methods of the present disclosure can be applied to alternative memory stack structures including different layer stacks or structures for the memory film 50 and/or for the vertical semiconductor channel 60.

Figure 7A:
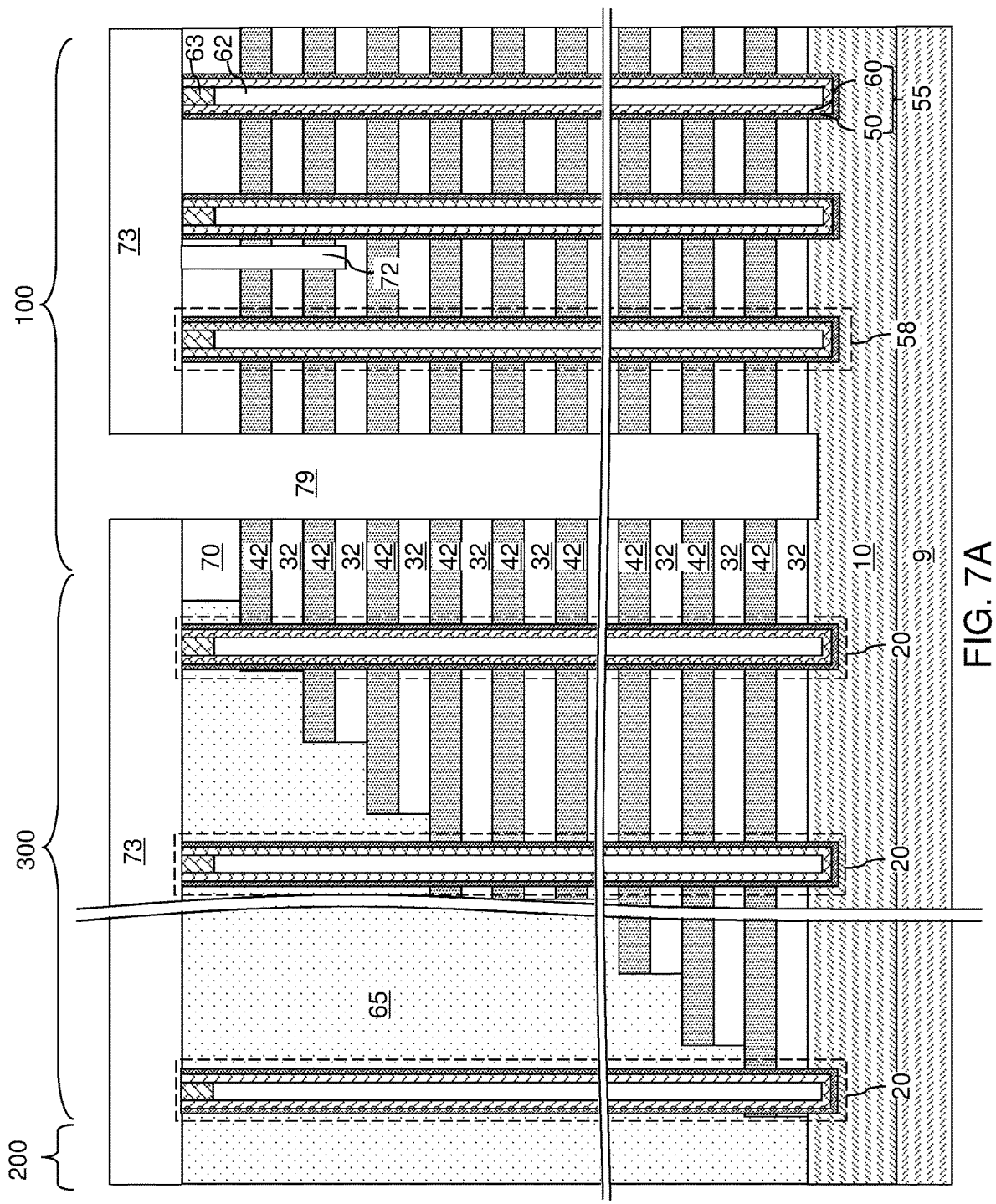
FIG. 7A is a schematic vertical cross-sectional view of the exemplary structure after formation of a contact-level dielectric layer and backside trenches according to an embodiment of the present disclosure.
Figure 7B:
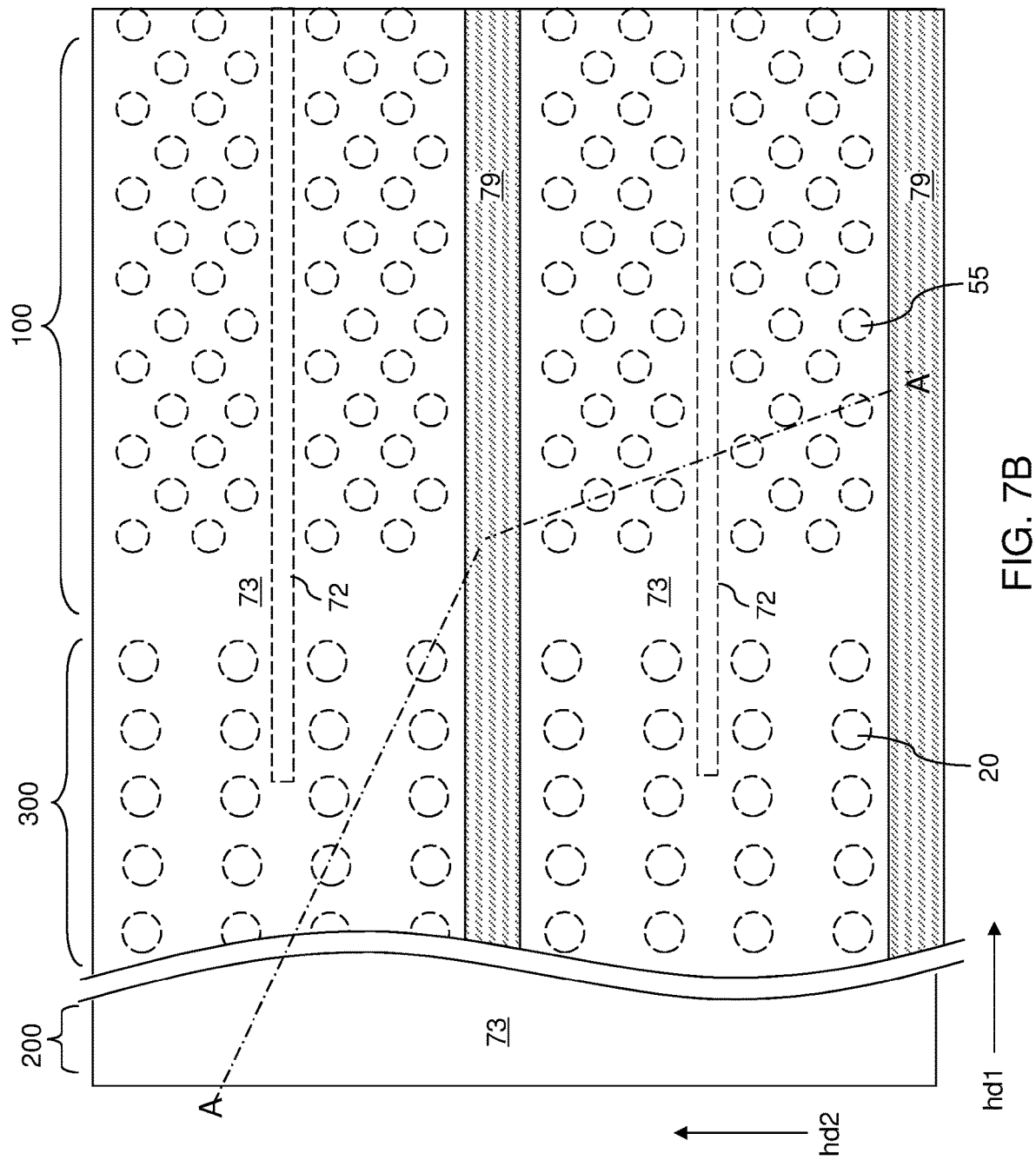
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the stepped dielectric material portion 65 using an anisotropic etch to form backside trenches 79, which vertically extend from the top surface of the contact level dielectric layer 73 at least to the top surface of the semiconductor material layer 10, and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 8:
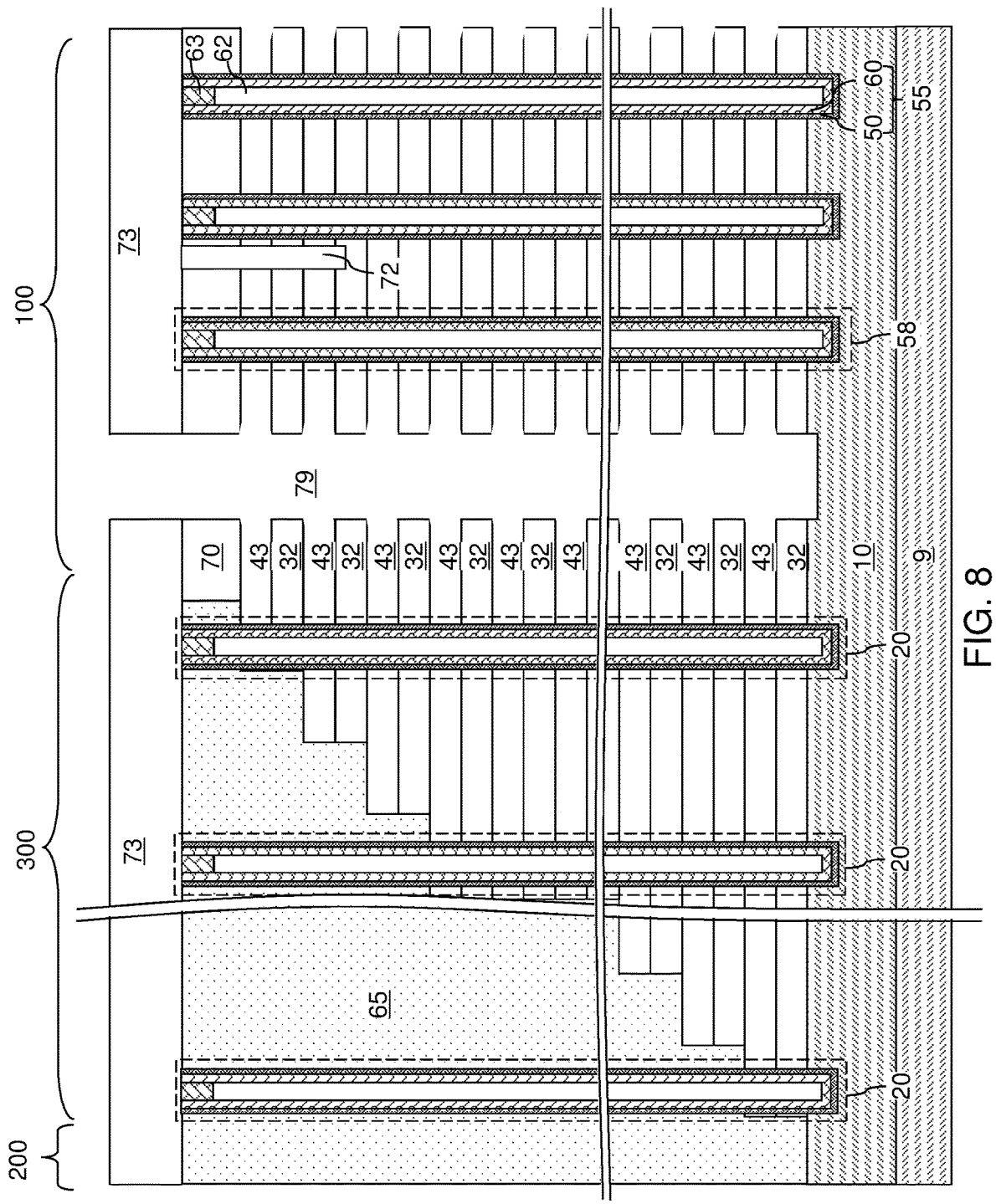
FIG. 8 is a schematic vertical cross-sectional view of the exemplary structure after formation of backside recesses according to an embodiment of the present disclosure.
Figure 9A:
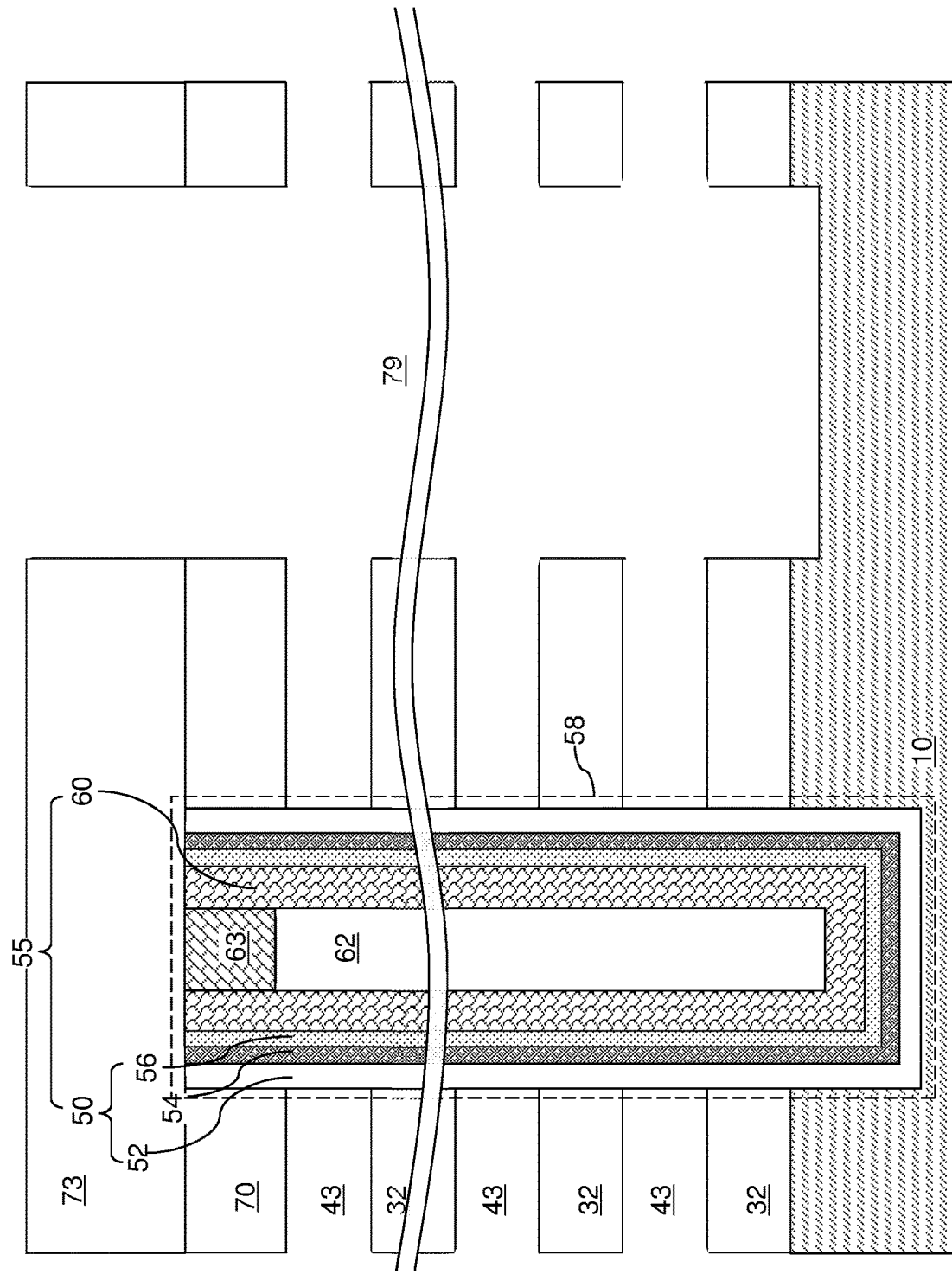
FIGS. 9A-9G are sequential schematic vertical cross-sectional views of a region of a first configuration of the exemplary structure including a memory opening fill structure and a backside trench during formation of electrically conductive layers and a backside trench fill structure according to a first embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials used in the art. The support pillar structure 20, the stepped dielectric material portion 65, and the memory opening fill structures 58 provide structural support while the backside recesses 43 are present within volumes previously occupied by the sacrificial material layers 42. Generally, the backside recesses 43 can be formed by removing the sacrificial material layers 42 selective to the insulating layers 32 and the memory opening fill structures 58.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the semiconductor material layer 10. In this case, each backside recess 43 can define a space for receiving a respective word line of the array of three-dimensional NAND strings. Each of the plurality of backside recesses 43 can extend substantially parallel to the top surface of the semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

Figure 9B:
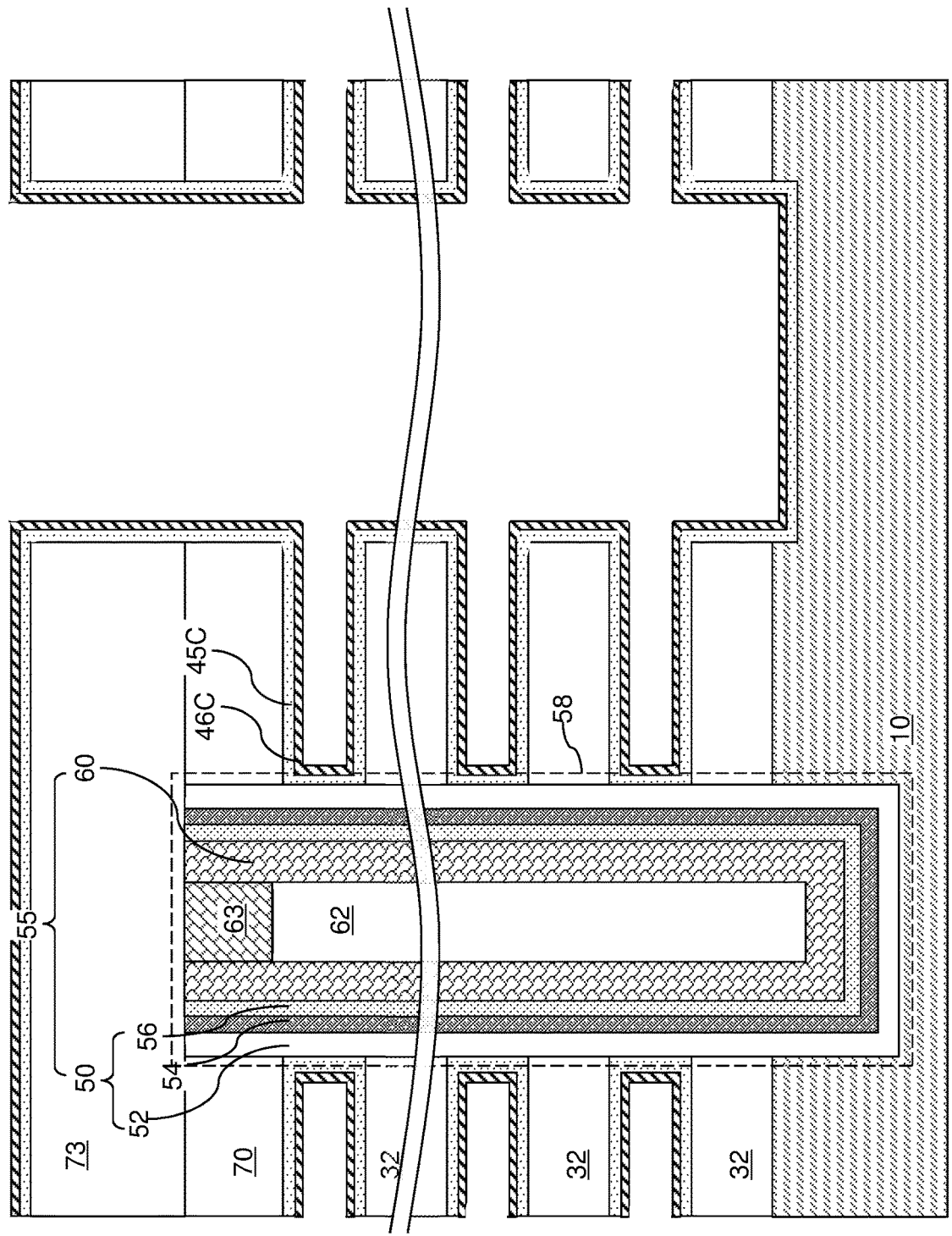

Referring to FIG. 9B, a backside blocking dielectric layer (not shown) can be optionally formed by a conformal deposition on physically exposed surfaces of the memory opening fill structures 58, the support pillar structures 20, the insulating layers 32, the contact-level dielectric layer 73, and the semiconductor material layer 10. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer 44 is present.

According to an aspect of the present disclosure, a continuous metal nitride liner layer 45C can be deposited on physically exposed surfaces around the backside recesses 43 and the backside trenches 79. In case a backside blocking dielectric layer is not employed, the continuous metal nitride liner layer 45C can be formed directly on physically exposed surfaces of the memory opening fill structures 58, the support pillar structures 20, the insulating layers 32, the contact-level dielectric layer 73, and the semiconductor material layer 10. In case a backside blocking dielectric layer is employed, the continuous metal nitride liner layer 45C can be deposited directly on the backside blocking dielectric layer.

The continuous metal nitride liner layer 45C includes an electrically conductive diffusion barrier material that can prevent or reduce metal diffusion therethrough. In one embodiment, the continuous metal nitride liner layer 45C may comprise, and/or may consist essentially of, a material such as TiN, TaN, WN, and/or WCN (i.e., tungsten carbonitride). The continuous metal nitride liner layer 45C may be deposited by a conformal deposition process such as a chemical vapor deposition (CVD) process and/or an atomic layer deposition (ALD) process. The thickness of the continuous metal nitride liner layer 45C may be in a range from 1 nm to 10 nm, such as from 2 nm to 6 nm and/or from 3 nm to 5 nm, although lesser and greater thicknesses may also be employed.

Subsequently, a nucleation layer is deposited on the physically exposed surfaces of the continuous metal nitride liner layer 45C to form a continuous nucleation layer 46C. The continuous nucleation layer 46C may comprise any comprise any material which promotes nucleation of a subsequently deposited metal layer. For example, the continuous nucleation layer 46C may comprise silicon, boron, metal silicide, titanium oxide or an elemental metal. For example, to selectively nucleate subsequently deposited tungsten layer, silicon, boron, ruthenium or tungsten may be used as the continuous nucleation layer 46C. The tungsten of the continuous nucleation layer 46C may be undoped or doped (i.e., alloyed) with at least one of silicon or boron). The average thickness of the continuous nucleation layer 46C may be in a range from 1 atomic monolayer to 10 atomic monolayers, which corresponds to a thickness range from 0.3 nm to 3 nm.

Figure 9C:
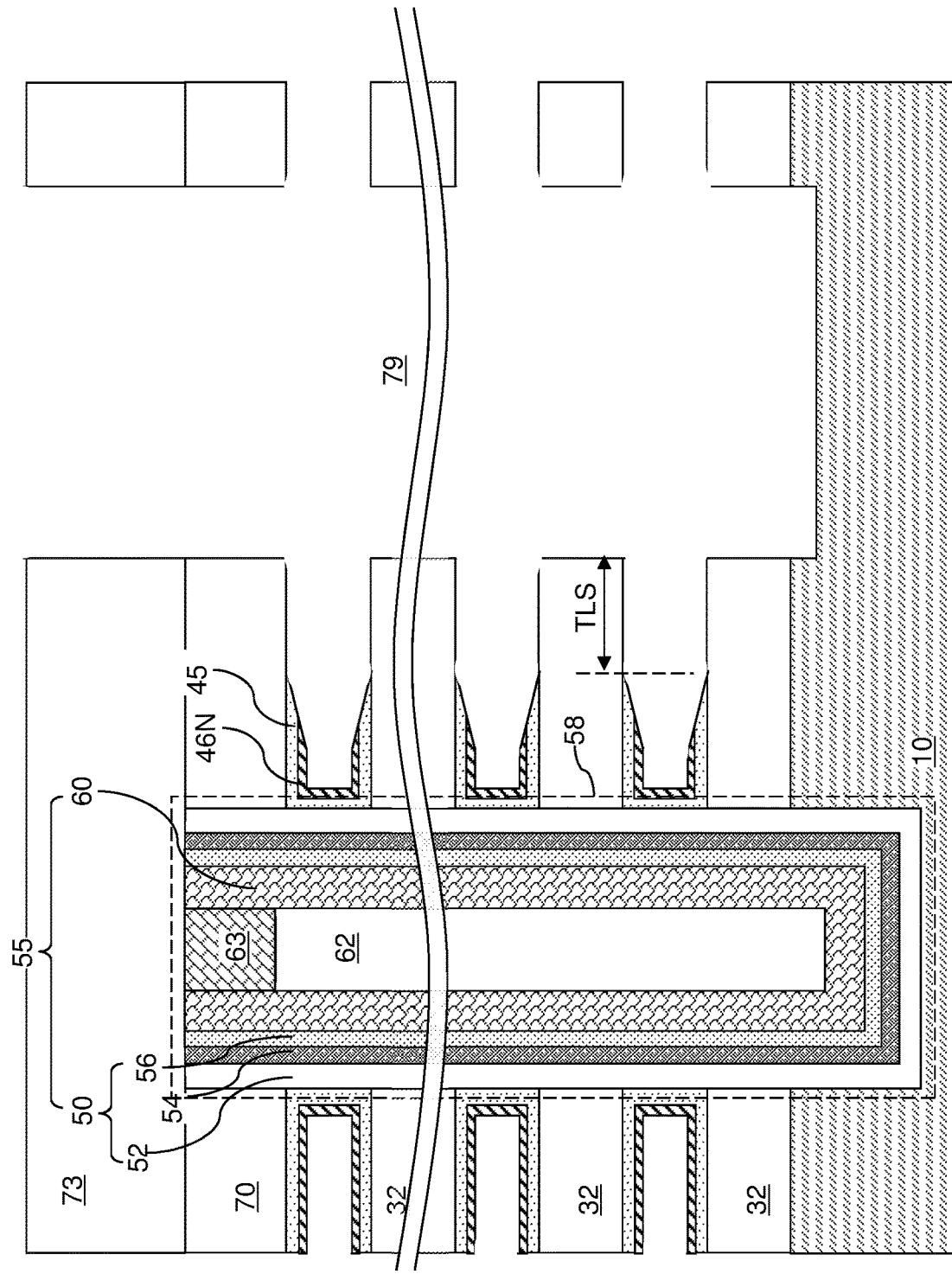

Referring to FIG. 9C, an anisotropic etch process can be performed to remove portions of the continuous nucleation layer 46C and the continuous metal nitride liner layer 45C that overlie the contact-level dielectric layer 73, are located within the backside trenches 79, or are proximal to the backside trenches 79. The anisotropic etch process can be a dry etch process employing an etch chemistry that is predominantly anisotropic with a relatively slow lateral etch component. For example, a chlorine plasma etch may be used to etch a TiN metal nitride liner layer 45C selective to silicon oxide insulating layers 32. In one embodiment, the anisotropic etch process may be a depletive etch process in which the etch rate for the material of the continuous nucleation layer 46C and for the material of the continuous metal nitride liner layer 45C decreases with a lateral distance from a most proximal one of the backside trenches 79 inside each backside recess 43. A depletive etch process refers to an etch process in which the etch rate of a material is limited by the supply rate of an etchant at each location. In this case, the supply rate of etchant ions or molecules in the backside recesses 43 decreases with a lateral distance from the backside trenches 79, and as a result, the etch rate of the materials of the continuous nucleation layer 46C and the continuous metal nitride liner layer 45C decreases with a lateral distance from a most proximal one of the backside trenches 79 within each of the backside recesses.

Portions of the continuous nucleation layer 46C that are proximal to the backside trenches 79, located within the backside trenches 79, or located above the contact-level dielectric layer 73 are removed by the depletive etch process. Remaining portions of the continuous nucleation layer 46C comprise nucleation layers 46N that are located within a respective backside recess 43 between a respective neighboring pair of backside trenches 79. Each nucleation layer 46N may be located between a respective neighboring pair of backside trenches 79, and may be laterally offset from the backside trenches 79.

Portions of the continuous metal nitride liner layer 45C that are proximal to the backside trenches 79, located within the backside trenches 79, or located above the contact-level dielectric layer 73 are removed by the depletive etch process. Remaining portions of the continuous metal nitride liner layer 45C comprise metal nitride liners 45 that are located within a respective backside recess 43 between a respective neighboring pair of backside trenches 79. Each metal nitride liner 45 may be located between a respective neighboring pair of backside trenches 79, and may be laterally offset from the backside trenches 79 by at least a minimum lateral spacing, which is herein referred to as a threshold lateral spacing TLS. In one embodiment, each of the nucleation layer 46 may be laterally offset from the backside trenches 79 by more than the threshold lateral spacing TLS. The threshold lateral spacing TLS may be in a range from 10 nm to 200 nm, such as from 20 nm to 100 nm, although lesser and greater threshold lateral spacings may also be employed.

The metal nitride liners 45 can be formed in first volumes of the backside recesses 43 that are more distal from the backside trenches 79 than the threshold lateral spacing TLS. Thus, the metal nitride liners 45 are not present in second volumes of the backside recesses that are less distal from the backside trenches 79 than the threshold lateral spacing TLS. In one embodiment, each of the metal nitride liner 45 comprises a respective two-dimensional array of tubular metal nitride barrier portions laterally surrounding and contacting each of the memory opening fill structures 58 located between a neighboring pair of backside trenches 79, a respective upper horizontally-extending metal nitride barrier portion adjoined to an upper end of each respective tubular metal nitride barrier portion, and a respective lower horizontally-extending metal nitride barrier portion adjoined to a lower end of each respective tubular metal nitride barrier portion. In one embodiment, the respective upper horizontally-extending metal nitride barrier portion comprises a first tapered end portion including a horizontal top surface segment and a tapered bottom surface segment that adjoins the horizontal top surface segment at a first edge, and the respective lower horizontally-extending metal nitride barrier portion comprises a second tapered end portion including a horizontal bottom surface segment and a tapered top surface segment that adjoins the horizontal bottom surface segment at a second edge. The first edge and the second edge may laterally extend straight along the first horizontal direction (e.g., word line direction) hd1 parallel to the lengthwise direction of the backside trenches 79. In one embodiment, the first edge and the second edge are parallel to the first horizontal direction hd1, and are equidistant from a proximal one among the first backside trench fill structure (74, 76) and the second backside trench fill structure (74, 76) that will be subsequently formed in the backside trenches 79. The distance between each of the first edges and the second edges and a respective proximal one of the backside trenches 79 may be the threshold lateral spacing TLS.

Figure 9D:
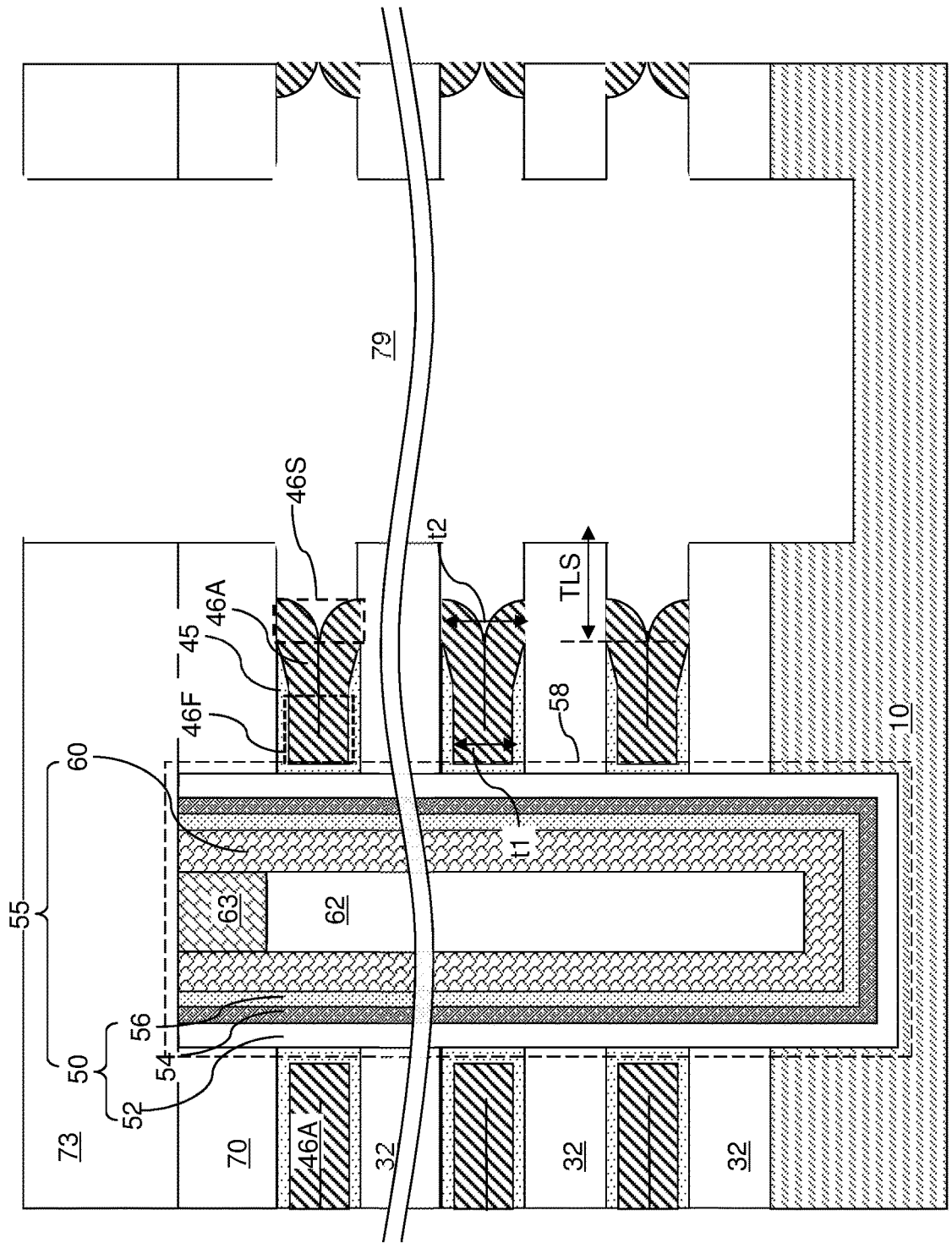

Referring to FIG. 9D, a first selective metal deposition process can be performed to selectively grow a first metal from the physically exposed surfaces of the nucleation layers 46N, while suppressing growth of the first metal from dielectric surfaces such as physically exposed surfaces of the insulating layers 32 and the contact-level dielectric layer 73. The first metal may comprise W, Ru, Co or Mo. Thus, the first metal may comprise the same material as the nucleation layers 46N or a different material from the nucleation layers 46N. A first metal fill material portion 46A comprising the first metal is formed in the backside recesses 43.

The first metal fill material portions 46A can be grown by a selective conformal deposition process such as a chemical vapor deposition process or an atomic layer deposition process employing a metallic precursor gas that nucleates on the nucleation layer and does not nucleate on dielectric surfaces such as silicon oxide surfaces. For example, tungsten first metal fill material portions 46A may be grown using a tungsten hexafluoride precursor gas. The duration of the selective conformal deposition process may be selected such that an upper portion and a lower portion within each of the first metal fill material portions 46A merge. In one embodiment, a horizontal seam is formed in the first metal fill material portions 46A, such that the seam laterally surrounds each memory opening fill structure 58 between a neighboring pair of backside trenches 79. In another embodiment, a seamless deposition process may be used which grows the first metal fill material portions 46A laterally without forming a seam. In some embodiments, portions (not shown) of the first metal may be deposited on the physically exposed portions of the semiconductor material layer 10. Such portions of the first metal, if formed, may be removed during a subsequent processing step after formation of electrically conductive layers and prior to formation of backside trench fill structures.

Each nucleation layer 46N can be incorporated into a respective first metal fill material portion 46A if they comprise the same material (e.g., tungsten). Alternatively, if the nucleation layer 46N comprises silicon or boron and the first metal fill material portion 46A comprises tungsten, then the nucleation layer 46N may be converted to a gas phase by a tungsten displacement reaction and pumped out from the deposition chamber during chemical vapor deposition or atomic layer deposition of the first metal fill material portion 46A. Thus, in one embodiment, the first metal fill material portion 46A can be formed on each metal nitride liner 45.

In one embodiment, each first metal fill material portion 46A can be in direct contact with the respective metal nitride liner 45. In one embodiment, the inner part of each of the first metal fill material portions 46A which contacts the respective metal nitride liner 45 may comprise a respective first-thickness portion having a respective first vertical thickness t1. The respective first vertical thickness t1 is a distance between an upper horizontally-extending portion of the respective metal nitride liner 45 and a lower horizontally-extending portion of the respective metal nitride liner 45. In one embodiment, the outer end part of each first metal fill material portion 46A which extends past the end of the respective metal nitride liner 45 can be in direct contact with a bottom surface of an overlying insulating layer 32 or the insulating cap layer 70, and with a top surface of an underlying insulating layer 32. The outer end part of each first metal fill material portion 46A has a second vertical thickness t2 which is greater than the first vertical thickness t1.

In one embodiment, at least one or each of the first metal fill material portions 46A may comprise a top surface that contains a first planar top surface segment that contacts a bottom surface of an upper horizontally-extending portion of the respective metal nitride liner 45; a second planar top surface segment that contacts a bottom surface of a respective one of the insulating layers 32 (or an insulating cap layer 70); and a tapered top surface segment connecting the first planar top surface segment and the second planar top surface segment and contacting a tapered portion of the upper horizontally-extending portion of the respective metal nitride liner 45. In one embodiment, at least one of the first metal fill material portions 46A may comprise a bottom surface that contains a first planar bottom surface segment that contacts a top surface of a lower horizontally-extending portion of the respective metal nitride liner 45; a second planar bottom surface segment that contacts a top surface of a respective one of the insulating layers 32; and a tapered bottom surface segment connecting the first planar bottom surface segment and the second planar bottom surface segment and contacting a tapered portion of the lower horizontally-extending portion of the respective metal nitride liner 45.

The first metal fill material portion 46A comprises a respective first-thickness portion 46F having a respective first vertical thickness t1 and contacting the respective metal nitride liner 45; and a respective second-thickness portion 46S having a respective second vertical thickness t2 that is greater than the respective first vertical thickness t1 and not contacting the respective metal nitride liner 45, wherein the second-thickness portion 46S located closer to the first backside trench fill structure (74, 76) than the first first-thickness portion 46F.

Figure 9E:
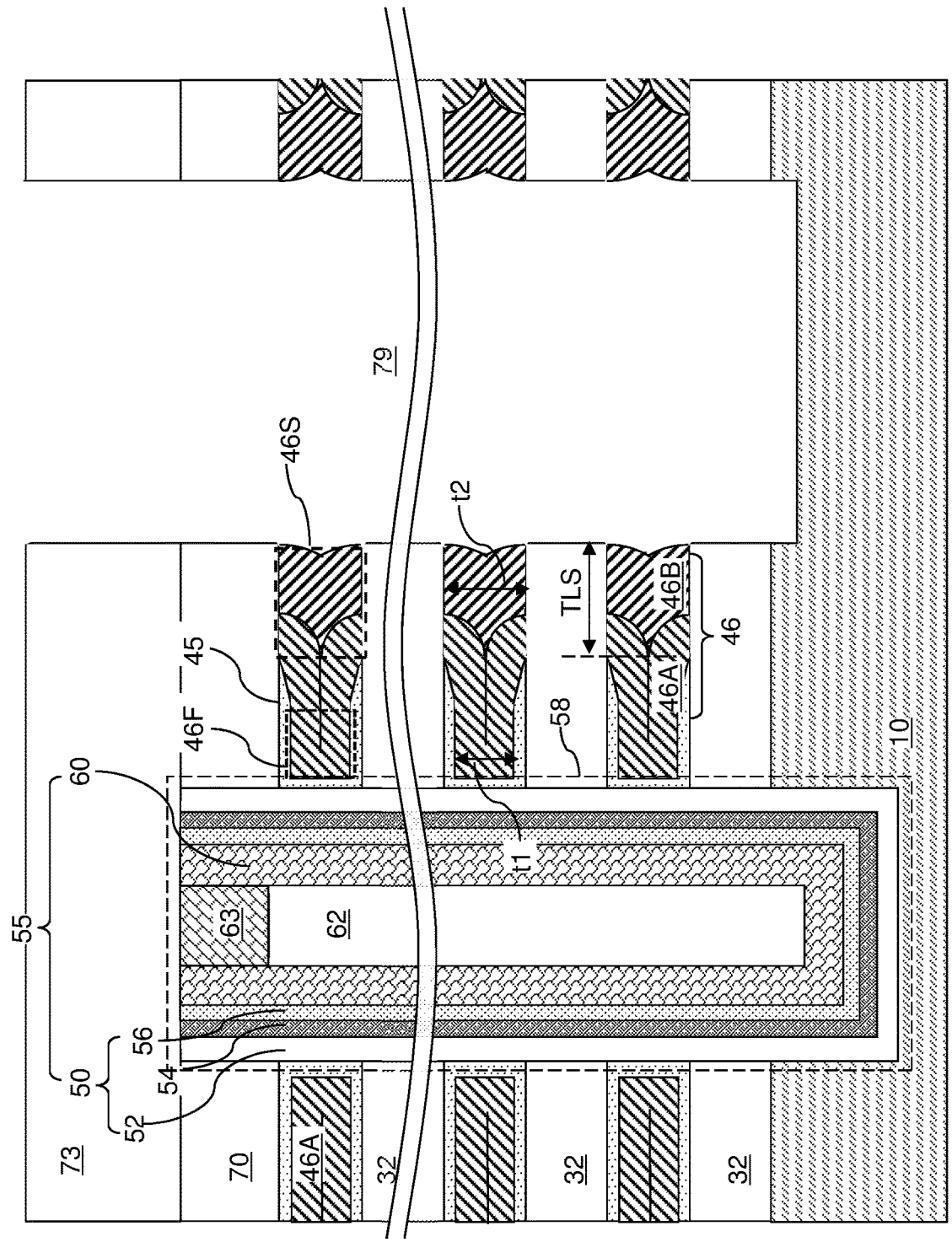

Referring to FIG. 9E, a second selective metal deposition process can be performed to selectively grow a second metal from the physically exposed surfaces of the first metal fill material portions 46A, while suppressing growth of the second metal from dielectric surfaces, such as physically exposed surfaces of the insulating layers 32 and the contact-level dielectric layer 73. The second metal comprises any metal that may be selectively grown from the surfaces of the first metal of the first metal fill material portions 46A. The second metal may be selected from, for example, W, Co, Ru, Mo or Cu. The second metal fill material portions 46B can be formed on each first metal fill material portion 46A in the outer portions of the backside recesses 43 adjacent to the backside trenches 79. A first one of the two second metal fill material portions 46B may be formed on a side of a first backside trench 79, and a second one of the two second metal fill material portions 46B may be formed on a side of a second backside trench 79.

The second metal fill material portions 46B can be grown by a selective conformal deposition process, such as a chemical vapor deposition process or an atomic layer deposition process employing a metallic precursor gas that nucleates on metallic surfaces and does not nucleate on dielectric surfaces such as silicon oxide surfaces. The duration of the selective conformal deposition process may be selected such that terminal surfaces of the second metal fill material portions 46B are formed at or in proximity to a peripheral region of a respective backside trench 79. In some embodiments, portions (not shown) of the second metal may be deposited at the bottom of the backside trenches 79. Such portions of the second metal, if formed, may be removed during a subsequent processing step after formation of electrically conductive layers and prior to formation of backside trench fill structures.

Each second metal fill material portion 46B can be in direct contact with a respective first metal fill material portion 46A. In one embodiment, each of the second metal fill material portions 46B may comprises a respective second-thickness portion having the respective second vertical thickness t2. The respective second vertical thickness t2 can be a distance between an overlying insulating layer 32 (or the topmost insulating layer 70) and an underlying insulating layer 32. In one embodiment, each second metal fill material portion 46B can be in direct contact with a bottom surface of an overlying insulating layer 32 or the insulating cap layer 70, and with a top surface of an underlying insulating layer 32.

Each contiguous combination of a first metal fill material portion 46A and two second metal fill material portions 46B constitutes a metal fill material region 46. Each contiguous combination of a metal nitride liner 45 and a metal fill material region 46 constitutes an electrically conductive layer (45, 46). Generally, each of the electrically conductive layers (45, 46) comprises a respective one of the metal nitride liners 45 and a respective metal fill material region 46 that is formed by selective growth of at least one metal material. In one embodiment, the second metal fill material portions 46B may be formed of a low cost, low resistivity metal, such as tungsten. Since a majority of the current conduction in the electrically conductive layers 46 is believed to occur in the outer regions of the electrically conductive layers 46 occupied by the second metal fill material portions 46B, a good overcall conductivity for the electrically conductive layers (e.g., word lines) 46 at a low cost is obtained. Thus, it is not necessary to form the entire electrically conductive layer 46 of a higher cost, low resistivity metal, such as ruthenium, to obtain a high overall word line conductivity.

The metal fill material region 46 comprises the respective first-thickness portion 46F having a respective first vertical thickness t1 and contacting the respective metal nitride liner 45; and the respective second-thickness portion 46S having a respective second vertical thickness t2 that is greater than the respective first vertical thickness t1 and not contacting the respective metal nitride liner 45, wherein the second-thickness portion 46S located closer to the first backside trench fill structure (74, 76) than the first first-thickness portion 46F.

In one embodiment, at least one and/or each of the first metal fill material portions 46A may comprise a laterally-extending seam at which an upper portion and a lower portion of a selectively deposited first metal merge. The second selective metal deposition process can be performed after formation of the laterally-extending seams to grow two second metal fill material portions 46B directly on each of the first metal fill material portions 46A. In an alternative embodiment, the seam may be omitted if a seamless deposition process is used.

In one embodiment, the first metal fill material portions 46A and the second metal fill material portions 46B of the electrically conductive layers (45, 46) may consist essentially of the same or different metal, and/or may include non-metal impurity atoms (e.g., Si or B) at different average atomic concentrations that differ at least by 0.1 part per million. Each of the metal fill material regions 46 may comprise a respective second-thickness portion having a respective second vertical thickness t2 that is greater than the respective first vertical thickness t1. The difference between the second vertical thickness t2 and the first vertical thickness t1 may be twice the thickness of a metal nitride liner 45 that contacts the metal fill material region 46.

In one embodiment, for at least one of the electrically conductive layers (45, 46), a top surface of the respective second-thickness portion and a top surface of the respective metal nitride liner 45 are located within a respective first horizontal plane, and a bottom surface of the respective second-thickness portion and a bottom surface of the respective metal nitride liner 45 are located within a respective second horizontal plane. In one embodiment, each of the electrically conductive layers (45, 46) comprises a respective horizontal top surface located within a respective first horizontal plane and including a top surface segment of the respective metal nitride liner 45 and a top surface segment of the respective second-thickness portion. In one embodiment, each of the electrically conductive layers (45, 46) comprises a respective horizontal bottom surface located within a respective second horizontal plane and including a bottom surface segment of the respective metal nitride liner 45 and a bottom surface segment of the respective second-thickness portion.

In one embodiment, each metal fill material region 46 comprises a first metal fill material portion 46A in direct contact with the respective metal nitride liner 45, and two second metal fill material portions 46B laterally spaced from the respective metal nitride liner 45 by the first metal fill material potion 46A. In one embodiment, the respective first-thickness portion of each metal fill material region 46 consists of a first segment of the first metal fill material portion 46A, and the respective second-thickness portion of each metal fill material region 46 comprises a second segment of the first metal fill material portion 46A and one of the two second metal fill material portions 46B.

In one embodiment, one, a plurality, or each of the second metal fill material portions 46B may comprise a pair of convex surfaces that are physically exposed to a respective one of the backside trenches 79, and are adjoined to each other at a horizontally-extending edge that laterally extends along the first horizontal direction hd1. An alternating stack of insulating layers 32 and electrically conductive layers (45, 46) can be formed over the semiconductor material layer 10.

Figure 9F:
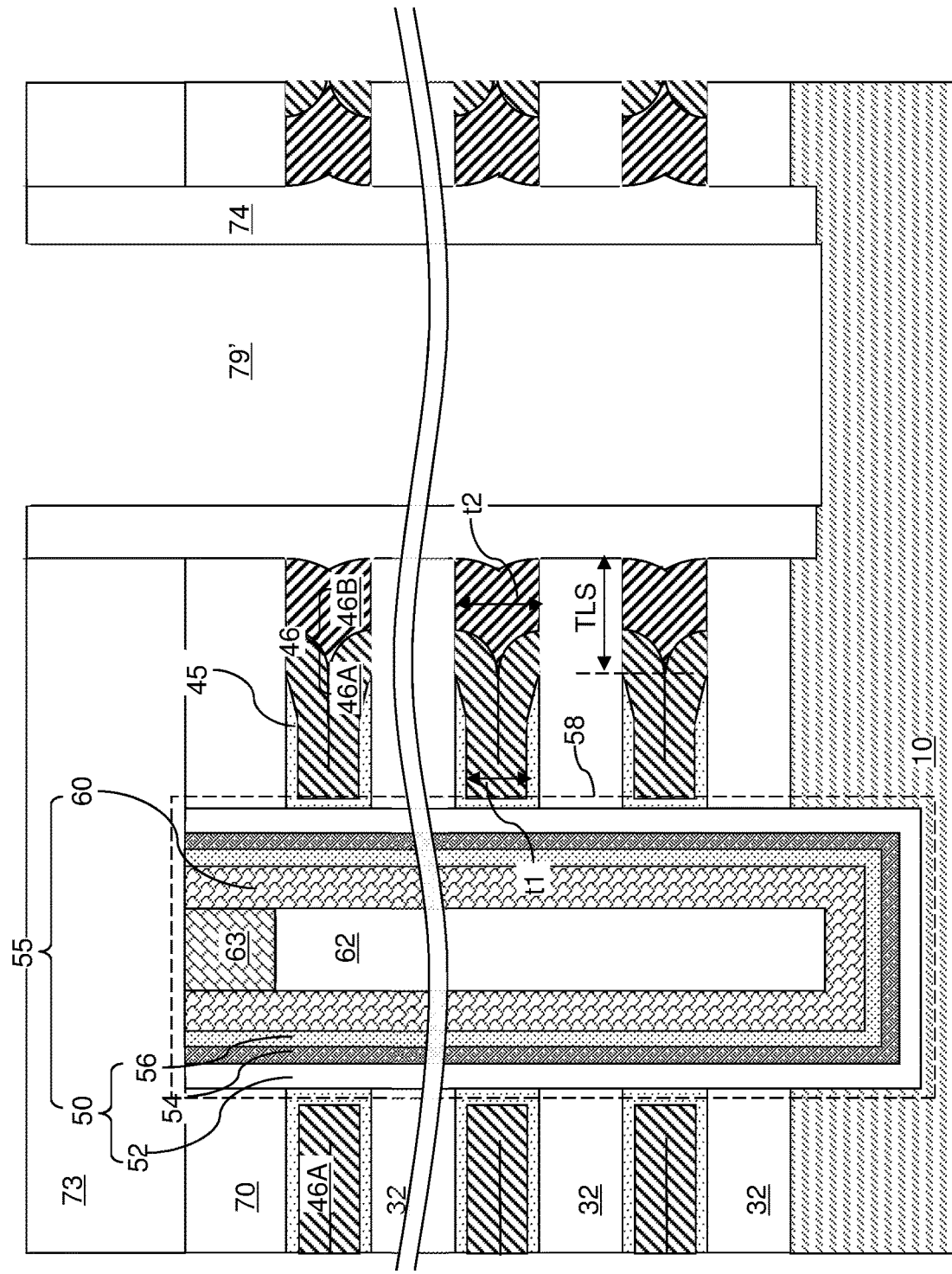

Referring to FIG. 9F, an anisotropic etch process may be performed to remove any metal material from the bottom regions of the backside trenches 79 and/or protruding from the backside recesses 43 into the backside trenches 79. An insulating material, such as silicon oxide, can be conformally deposited in peripheral regions of the backside trenches 79 and over the contact-level dielectric layer 73 to form a conformal insulating material layer. An anisotropic etch process can be performed to remove horizontally-extending portions of the conformal insulating material layer. Each remaining portion of the conformal insulating layer that covers sidewalls of each alternating stack {32, (45, 46)} constitutes an insulating spacer 74. The lateral thickness of each insulating spacer 74, as measured over sidewalls of the insulating layers 32 between an inner sidewall and an outer sidewall, may be in a range from 5 nm to 200 nm, such as from 10 nm to 100 nm, although lesser and greater lateral thicknesses may also be employed. A backside cavity 79' can be present within each backside trench 79.

Figure 9G:
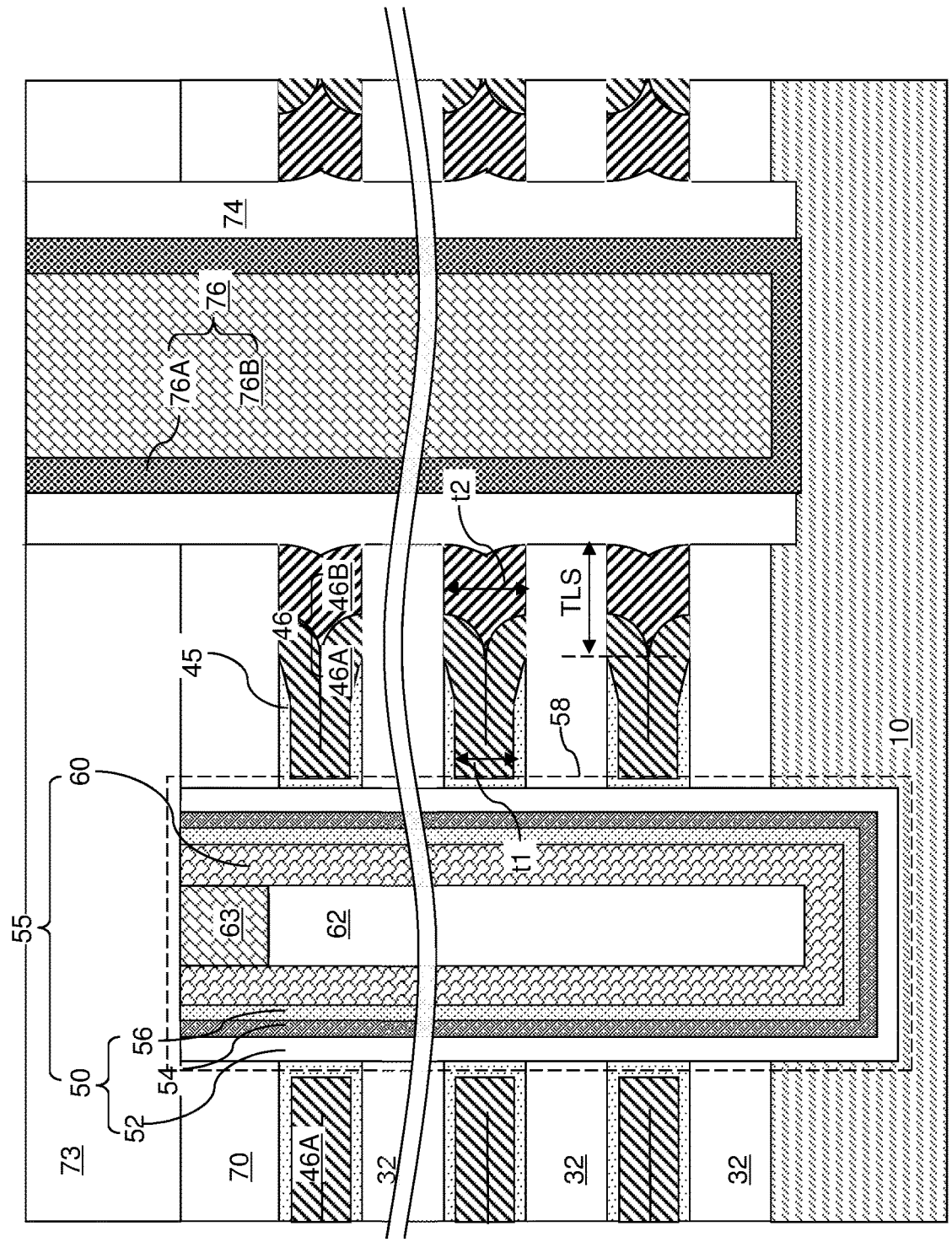

Referring to FIG. 9G, a backside contact via structure 76 can be formed within each backside cavity 79'. The backside contact via structures 76 can be formed by depositing at least one conductive material in the remaining unfilled volumes (i.e., the backside cavity 79') of the backside trenches 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. Each structure that fills a backside trench 79 is herein referred to as a backside trench fill structure (74, 76). While the present disclosure is described employing an embodiment in which each backside trench fill structure (74, 76) comprises a respective insulating spacer 74 and a backside contact via structure 76, embodiments are expressly contemplated herein in which the backside trenches 79 are filled with other types of backside trench fill structures having insulating vertically-extending surfaces that contact a respective set of electrically conductive layers (45, 46).

In one embodiment, an alternating stack of insulating layers and electrically conductive layers {32, (45, 46)} can be provided between a first backside trench fill structure (74, 76) and a second backside trench fill structure (74, 76) that laterally extend along a first horizontal direction hd1 and are spaced apart along a second horizontal direction hd2. In one embodiment, each of the electrically conductive layers (45, 46) may comprises a first pair of convex surfaces that contacts the first backside trench fill structure (74, 76) and are adjoined at a first horizontal edge that laterally extends along the first horizontal direction hd1, and a second pair of convex surfaces that contacts the second backside trench fill structure (74, 76) and are adjoined at a second horizontal edge that laterally extends along the first horizontal direction hd1.

In one embodiment, for at least one or each of the electrically conductive layers (45, 46), an entirety of the respective first-thickness portion is laterally offset from the first backside trench fill structure (74, 76) and the second backside trench fill structure (74, 76) by a lateral distance that is greater than a threshold lateral spacing TLS, and an entirety of the respective second-thickness portion is located within a volume defined by a lateral offset distance that equals the threshold lateral spacing TLS from a proximal one of the first backside trench fill structure (74, 76) and the second backside trench fill structure (74, 76).

FIGS. 10A-10D are sequential schematic vertical cross-sectional views of a region of a second configuration of the exemplary structure including a memory opening fill structure 58 and a backside trench 79 during formation of electrically conductive layers (45, 46) and a backside trench fill structure (74, 76) according to a second embodiment of the present disclosure.

Figure 10A:
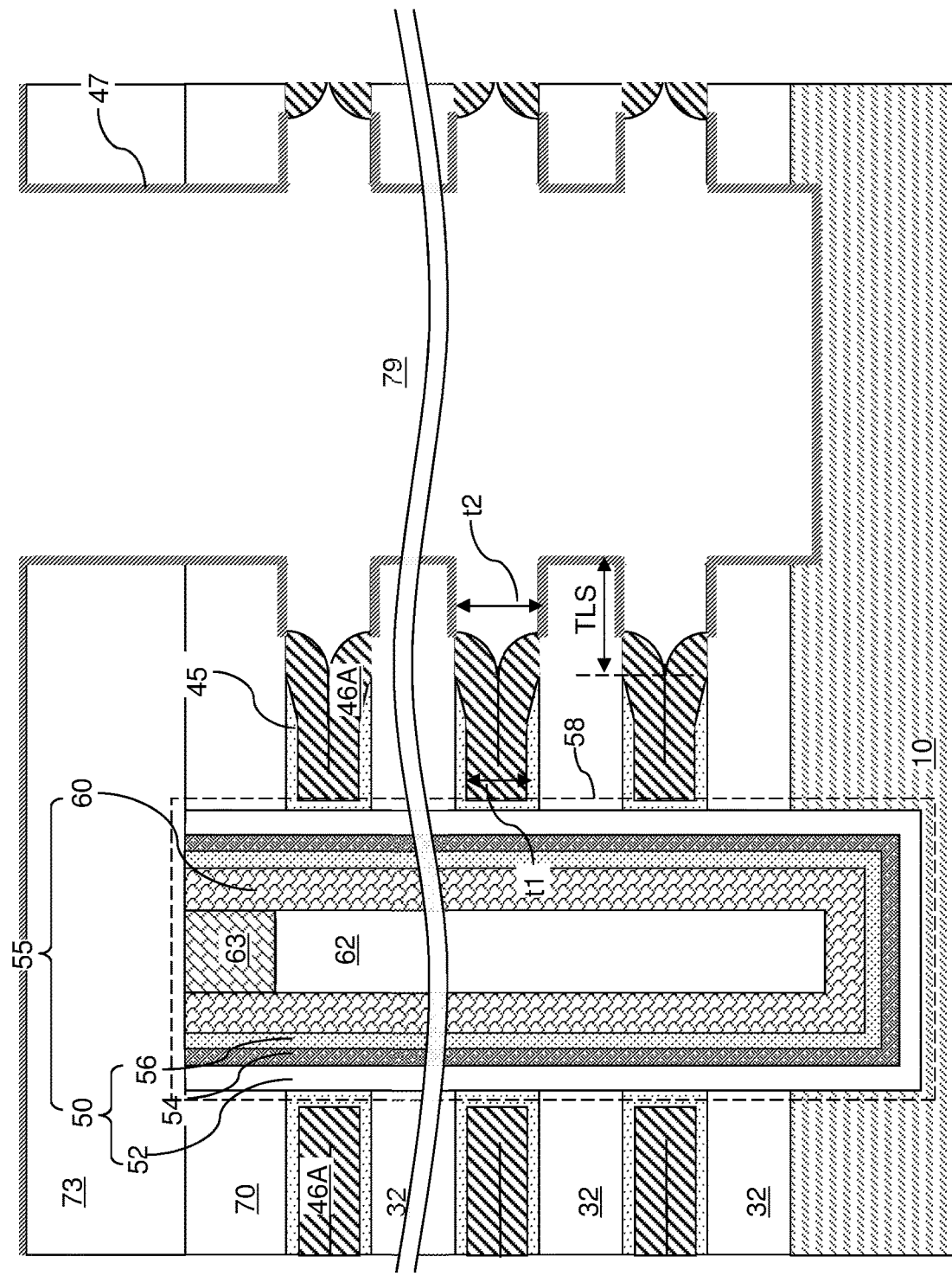
FIGS. 10A-10D are sequential schematic vertical cross-sectional views of a region of a second configuration of the exemplary structure including a memory opening fill structure and a backside trench during formation of electrically conductive layers and a backside trench fill structure according to a second embodiment of the present disclosure.

Referring to FIG. 10A, the second configuration of the exemplary structure may be derived from the first configuration of the exemplary structure illustrated in FIG. 9D by performing a nitridation process. In this case, the insulating layers 32 and the contact-level dielectric layer 73 may comprise silicon oxide, and the nitridation process converts physically exposed surface portions of the insulating layers 32 and the contact-level dielectric layer 73 into a silicon nitride liner 47. The nitridation process may comprise a N2 plasma nitridation process and/or an ammonia thermal nitridation process. The silicon nitride liner 47 acts as a diffusion barrier for fluorine. The silicon nitride liner 47 prevents or reduces fluorine diffusion into various insulating layers of the device when tungsten second metal fill material portions 46B are subsequently deposited using a fluorine containing precursor (e.g., tungsten hexafluoride) over the silicon nitride liner 47. The silicon nitride liner also prevents or reduces metal (e.g., tungsten) diffusion from the second metal fill material portions 46B into the insulating layers. This decreases damage to the insulating layers. In one embodiment, the silicon nitride liner 47 may include residual oxygen atoms therein, and the atomic concentration of oxygen within the silicon nitride liner 47 decreases with an increase in the distance from the interface with the insulating layers 32 and the contact-level dielectric layer 73. The thickness of the silicon nitride liner 47 may be in a range from 1 nm to 6 nm, such as from 2 nm to 5 nm, although lesser and greater thicknesses may also be employed.

Figure 10B:
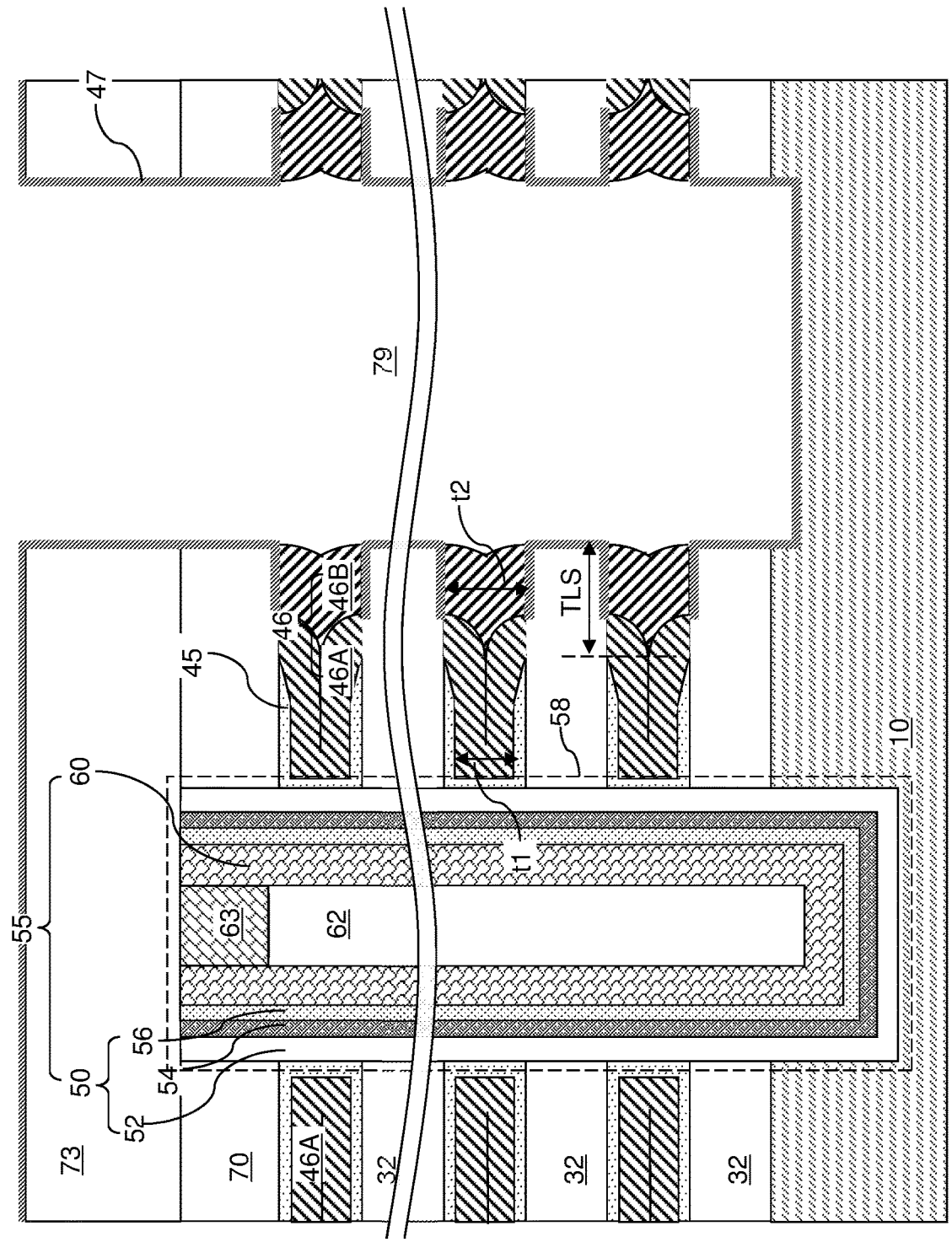

Referring to FIG. 10B, the processing steps of FIG. 9E (including a second selective metal deposition process) can be performed to form second metal fill material portions 46B.

Figure 10C:
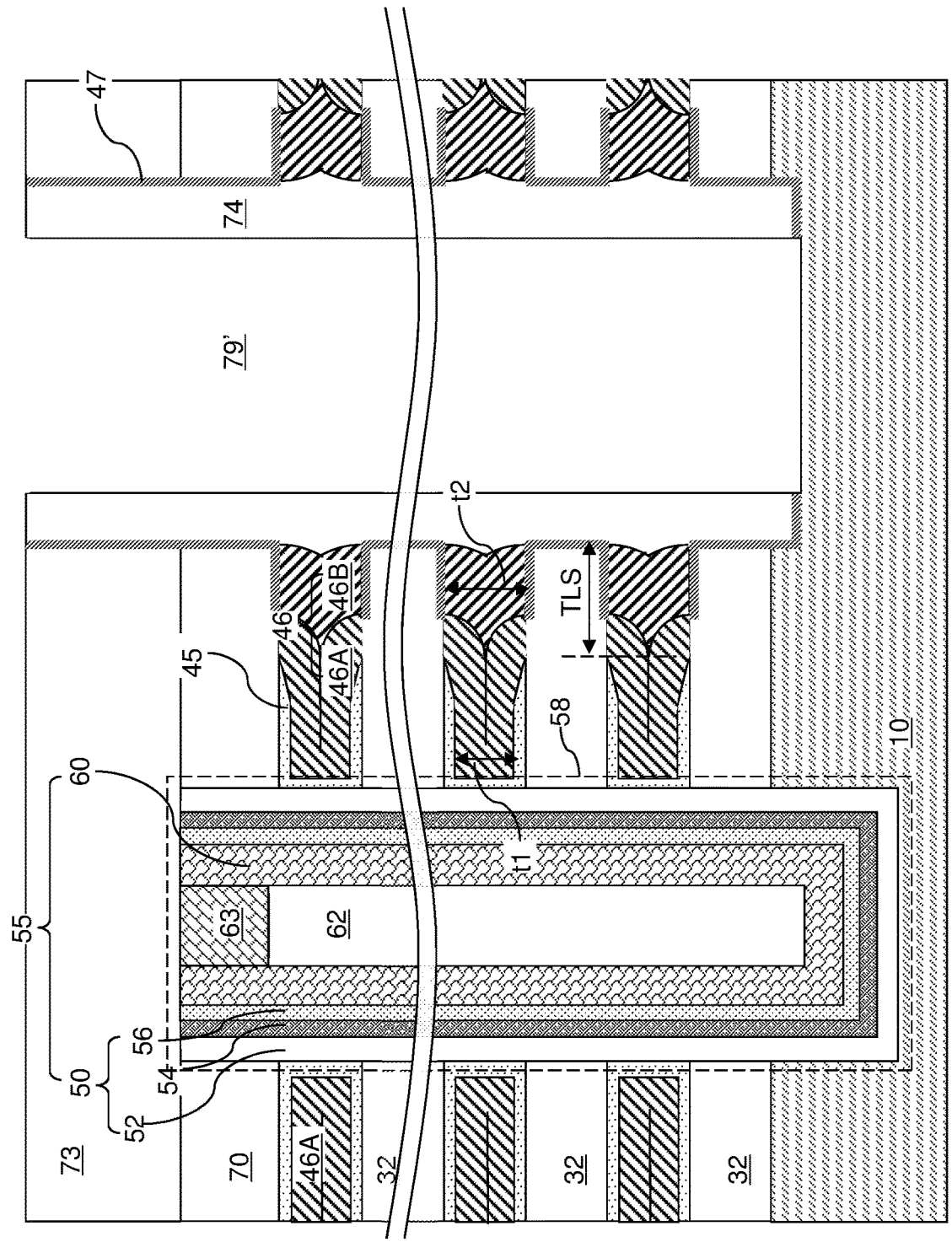

Referring to FIG. 10C, the processing steps of FIG. 9F can be performed to form an insulating spacer 74 in each backside trench 79.

Figure 10D:
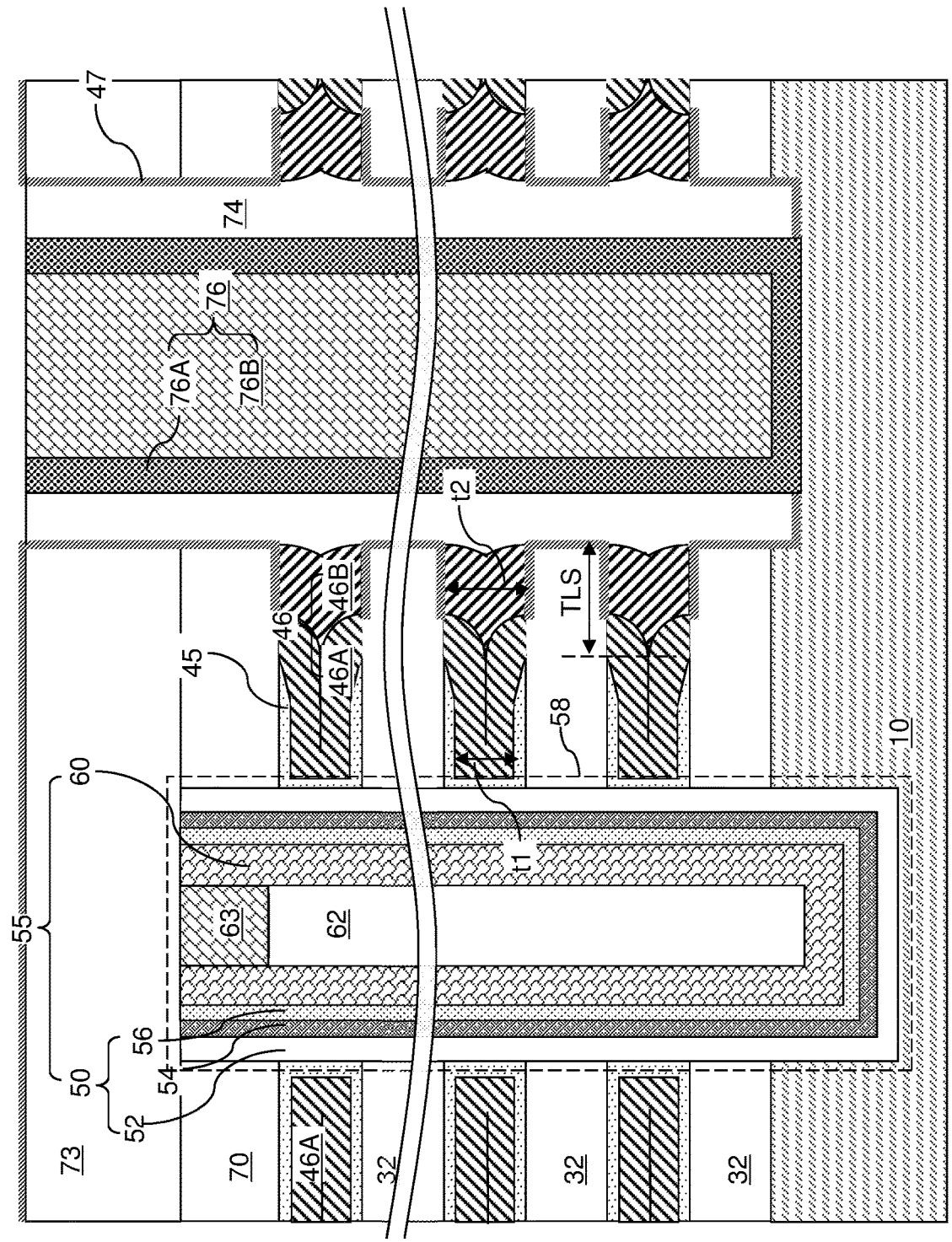

Referring to FIG. 10D, the processing steps of FIG. 9G can be performed to form a backside trench fill structure (74, 76) in each backside trench 79.

FIGS. 11A-11D are sequential schematic vertical cross-sectional views of a region of a third configuration of the exemplary structure including a memory opening fill structure 58 and a backside trench 79 during formation of electrically conductive layers (45, 46) and a backside trench fill structure (74, 76) according to a third embodiment of the present disclosure.

Figure 11A:
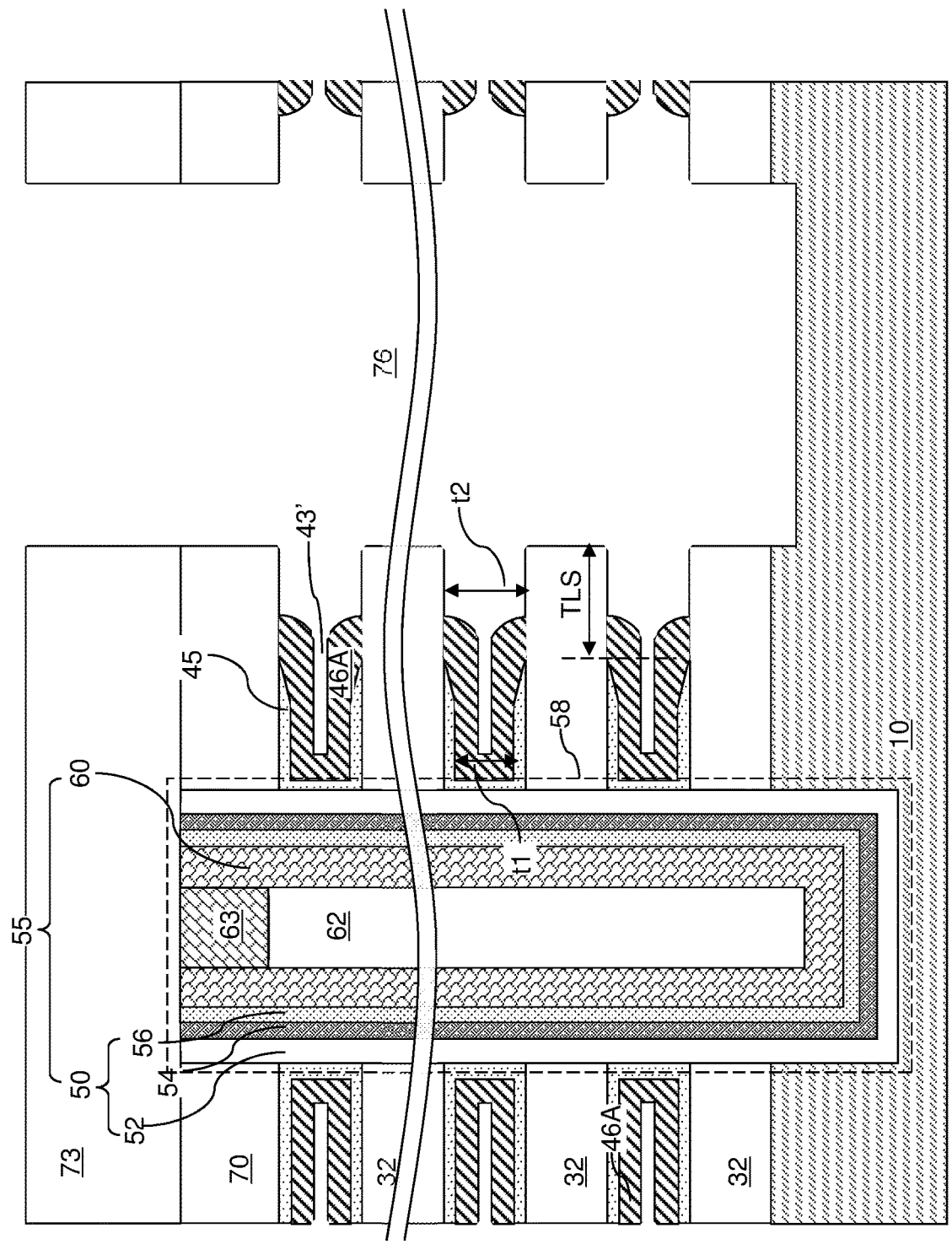
FIGS. 11A-11D are sequential schematic vertical cross-sectional views of a region of a third configuration of the exemplary structure including a memory opening fill structure and a backside trench during formation of electrically conductive layers and a backside trench fill structure according to a third embodiment of the present disclosure.

Referring to FIG. 11A, the third configuration of the exemplary structure may be derived from the first configuration of the exemplary structure illustrated in FIG. 9C by performing the first selective metal deposition process (i.e., the deposition process described with reference to FIG. 9D) with a shortened duration for the first selective metal deposition process. Specifically, the duration of the first selective metal deposition process can be selected such that the upper horizontally-extending portion and the lower horizontally-extending portion of each first metal fill material portion 46A do not merge. In one embodiment, at least one, and/or each, of the first metal fill material portions 46A comprises an upper laterally-extending portion and a lower laterally-extending portion that are separated from each other by a laterally-extending cavity 43' after the first selective metal deposition process. The thickness of each laterally-extending portion of the first metal fill material portions 46A can be less than one half of the first vertical thickness t1.

Figure 11B:
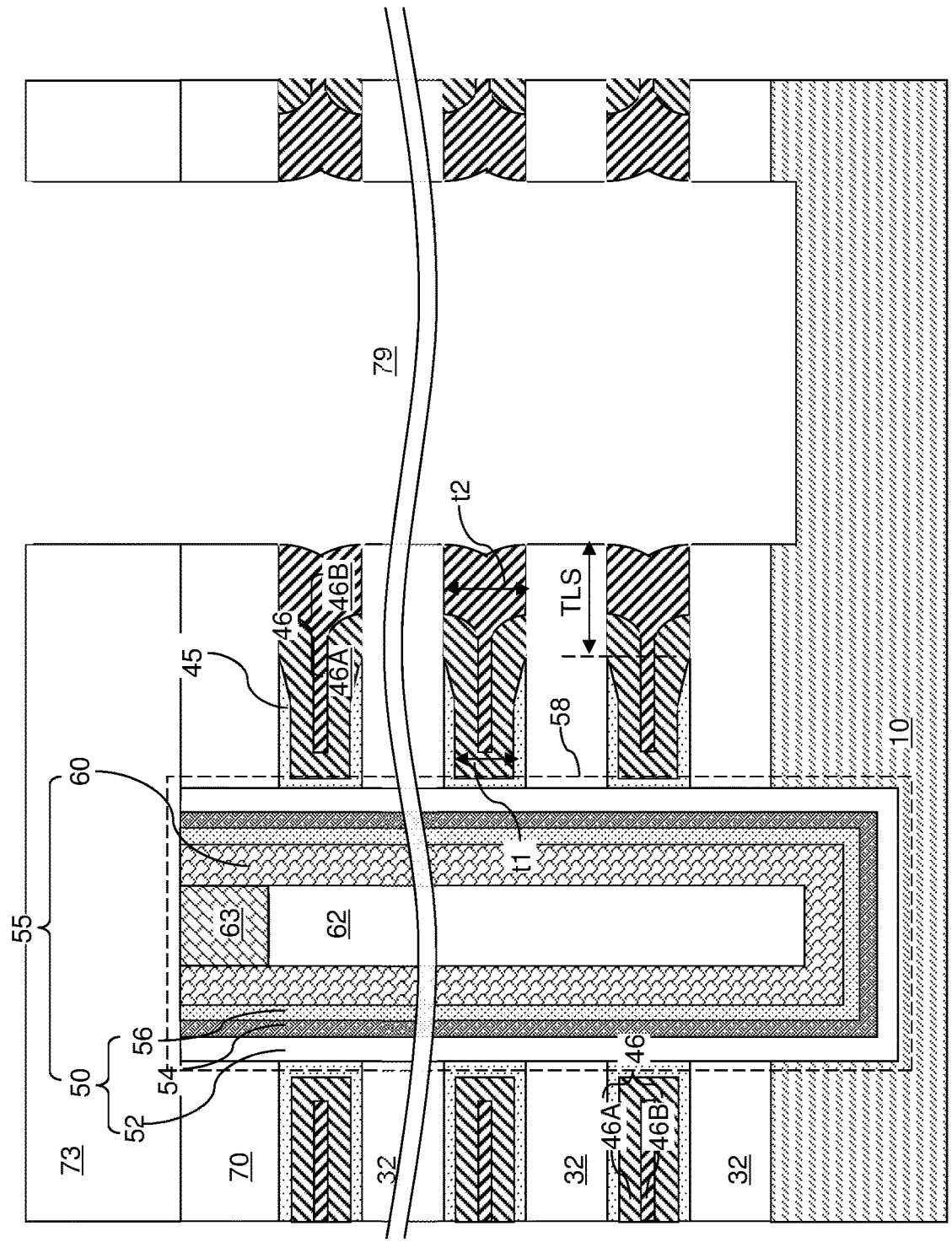

Referring to FIG. 11B, the processing steps of FIG. 9E (including a second selective metal deposition process) can be performed to form second metal fill material portions 46B. The second metal fill material portions 46B are formed within and fills the laterally-extending cavities 43' between laterally-extending portions of the first metal fill material portions 46A. Electrically conductive layers (45, 46) are formed in the backside recesses 43. Each electrically conductive layer (45, 46) may comprise a metal nitride liner 45 and a metal fill material region 46. Each metal fill material region 46 includes a respective first-thickness portion having the first vertical thickness t1 and two second-thickness regions having the second vertical thickness t2. In one embodiment, the first-thickness portion may comprise of a first segment of the first metal fill material portion 46A and a first segment of one of the second metal fill material portions 46B. Each second-thickness portion may comprise a second segment of the first metal fill material portion 46A and a second segment of the one of the two second metal fill material portions 46B.

FIGS. 12A-12D are sequential schematic vertical cross-sectional views of a region of a fourth configuration of the exemplary structure including a memory opening fill structure 58 and a backside trench 79 during formation of electrically conductive layers (45, 46) and a backside trench fill structure (74, 76) according to a fourth embodiment of the present disclosure.

Figure 12A:
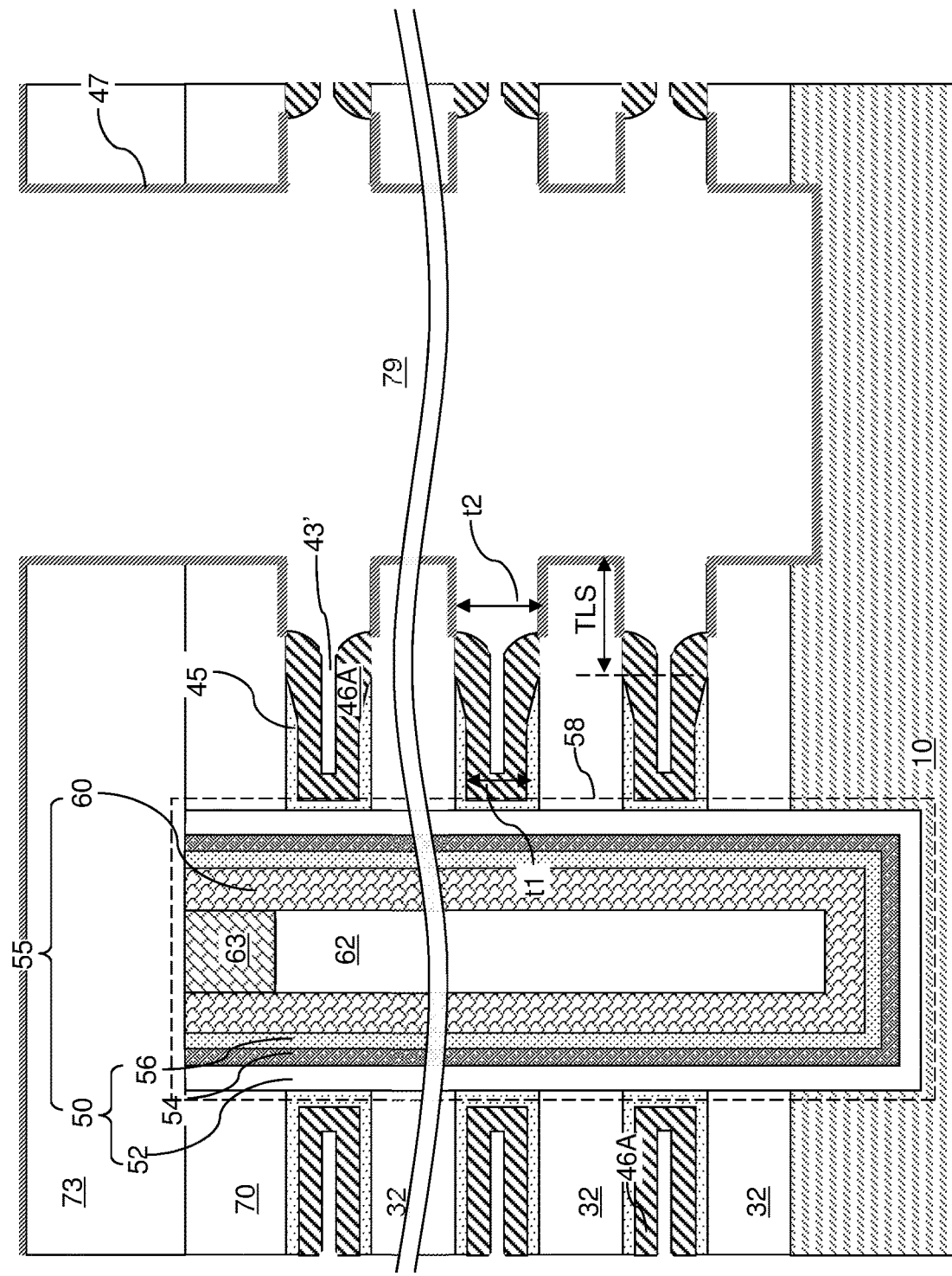
FIGS. 12A-12D are sequential schematic vertical cross-sectional views of a region of a fourth configuration of the exemplary structure including a memory opening fill structure and a backside trench during formation of electrically conductive layers and a backside trench fill structure according to a fourth embodiment of the present disclosure.

Referring to FIG. 12A, the fourth configuration of the exemplary structure may be derived from the third configuration of the exemplary structure illustrated in FIG. 11A by performing a nitridation process, as described above with respect to FIG. 10A. The nitridation process converts physically exposed surface portions of the insulating layers 32 and the contact-level dielectric layer 73 into the silicon nitride liner 47. In one embodiment, the silicon nitride liner 47 may include residual oxygen atoms therein, and the atomic concentration of oxygen within the silicon nitride liner 47 decreases with an increase in the distance from the interface with the insulating layers 32 and the contact-level dielectric layer 73. The thickness of the silicon nitride liner 47 may be in a range from 1 nm to 6 nm, such as from 2 nm to 5 nm, although lesser and greater thicknesses may also be employed.

Figure 12B:
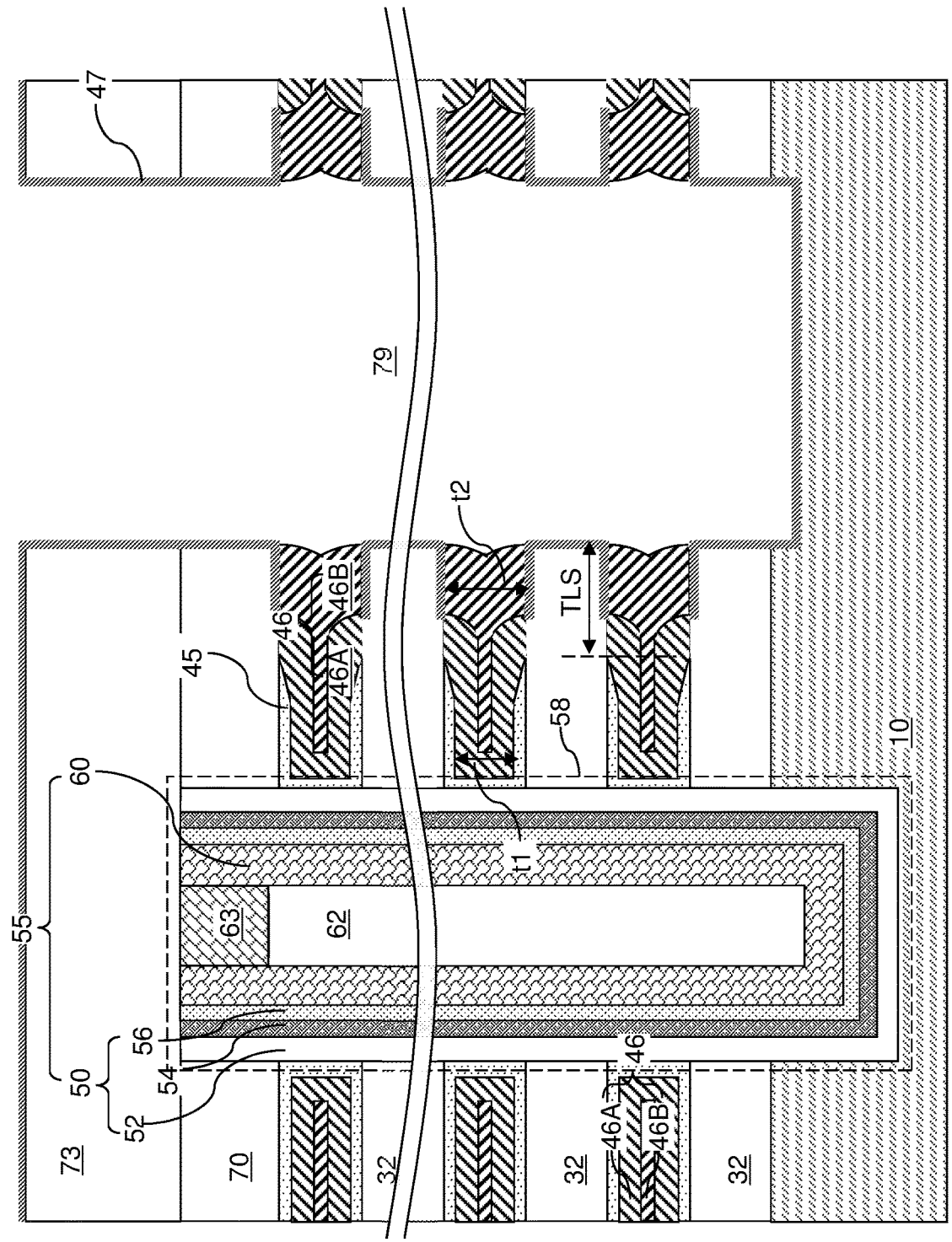

Referring to FIG. 12B, the processing steps of FIG. 11B (including a second selective metal deposition process) can be performed to form second metal fill material portions 46B.

Figure 11C:
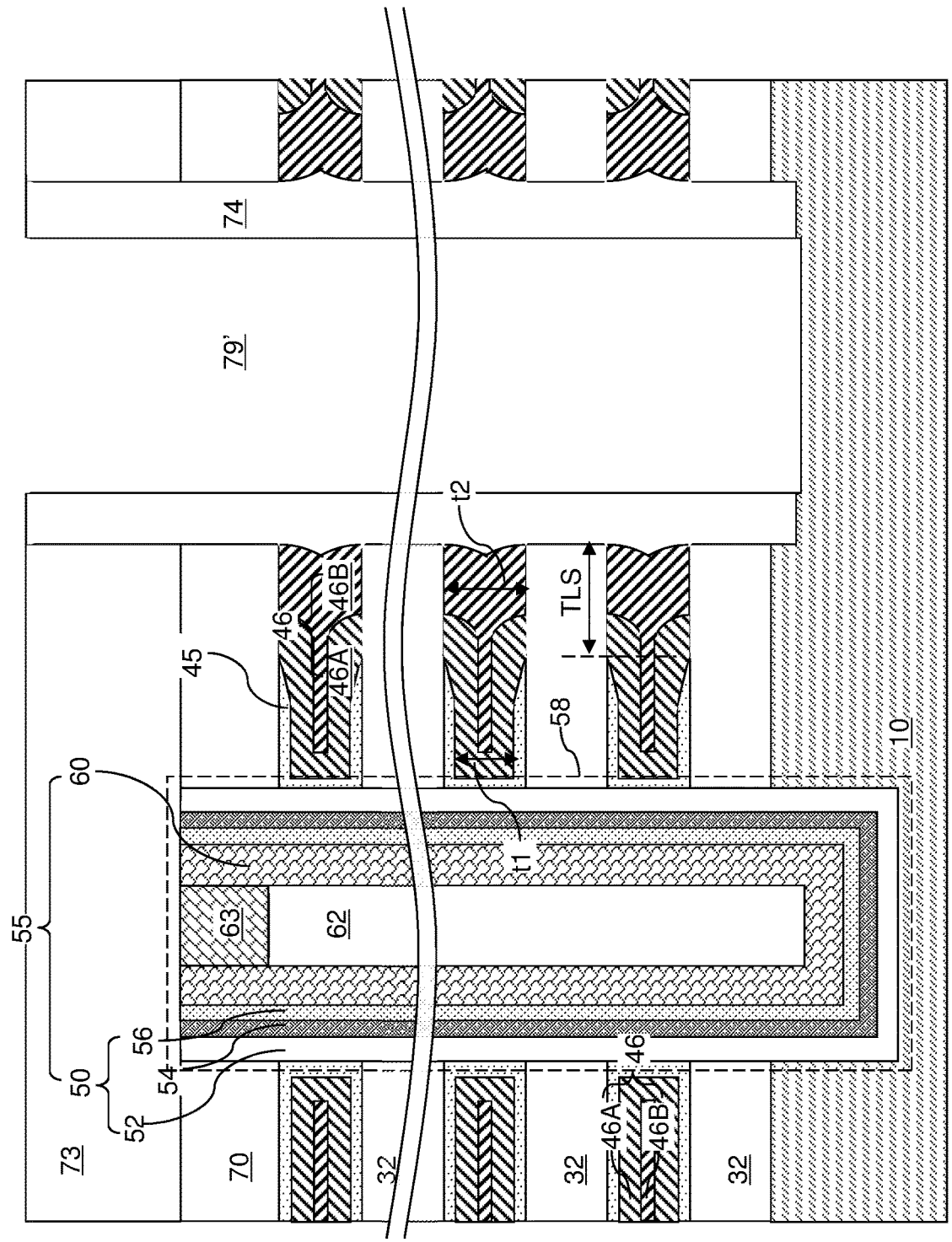
Figure 12C:
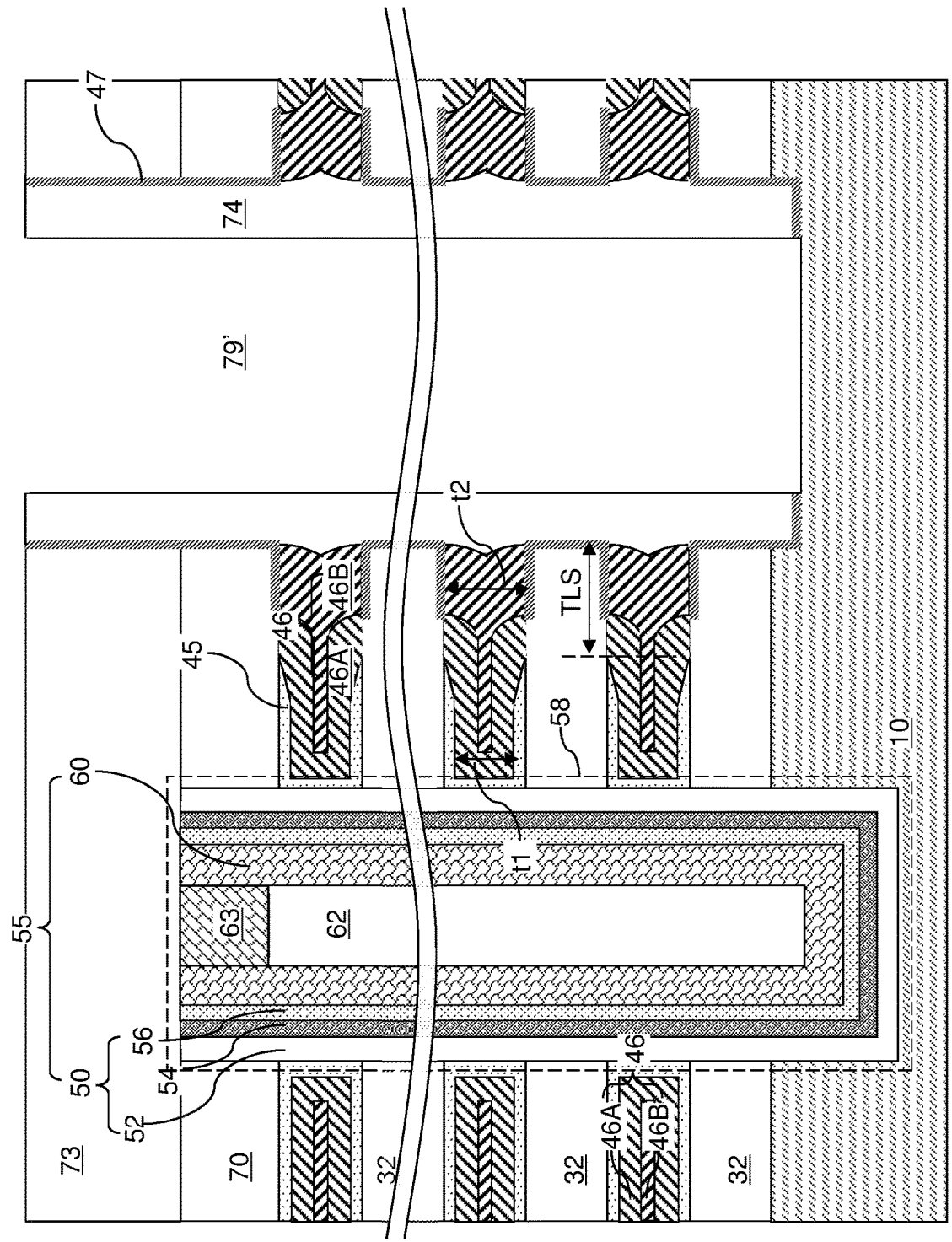

Referring to FIG. 12C, the processing steps of FIG. 11C can be performed to form an insulating spacer 74 in each backside trench 79.

Figure 11D:
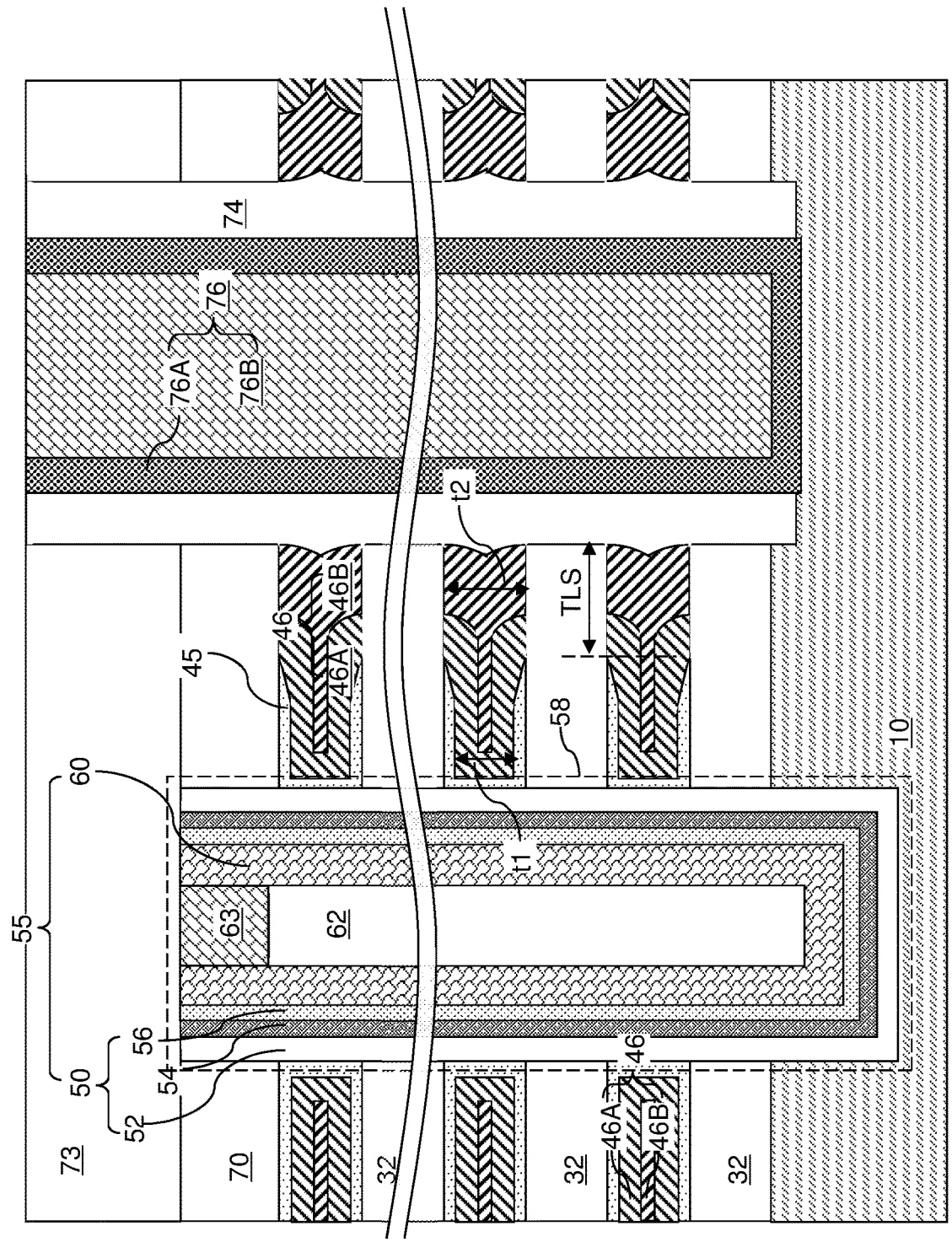
Figure 12D:
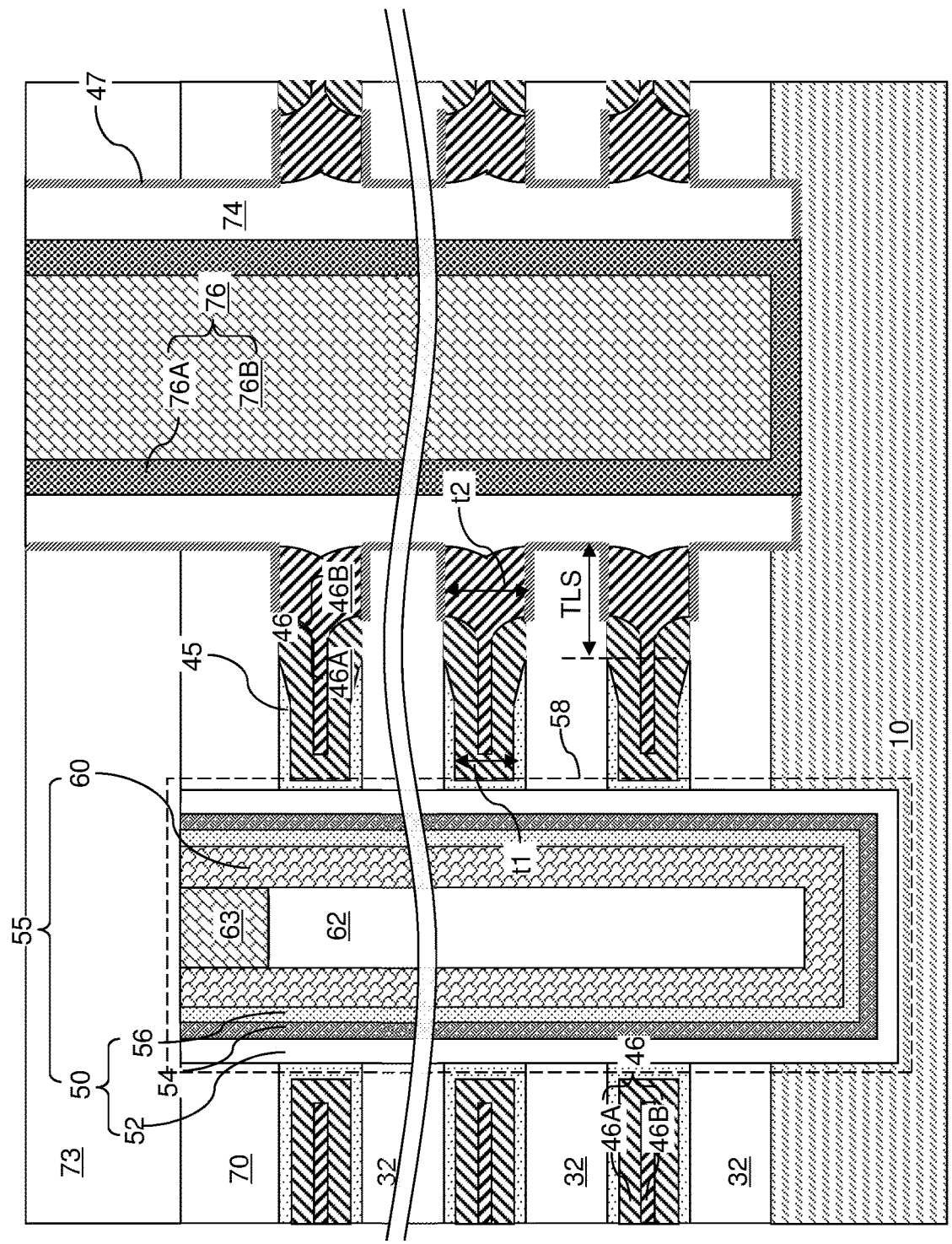

Referring to FIG. 12D, the processing steps of FIG. 11D can be performed to form a backside trench fill structure (74, 76) in each backside trench 79.

Figure 13A:
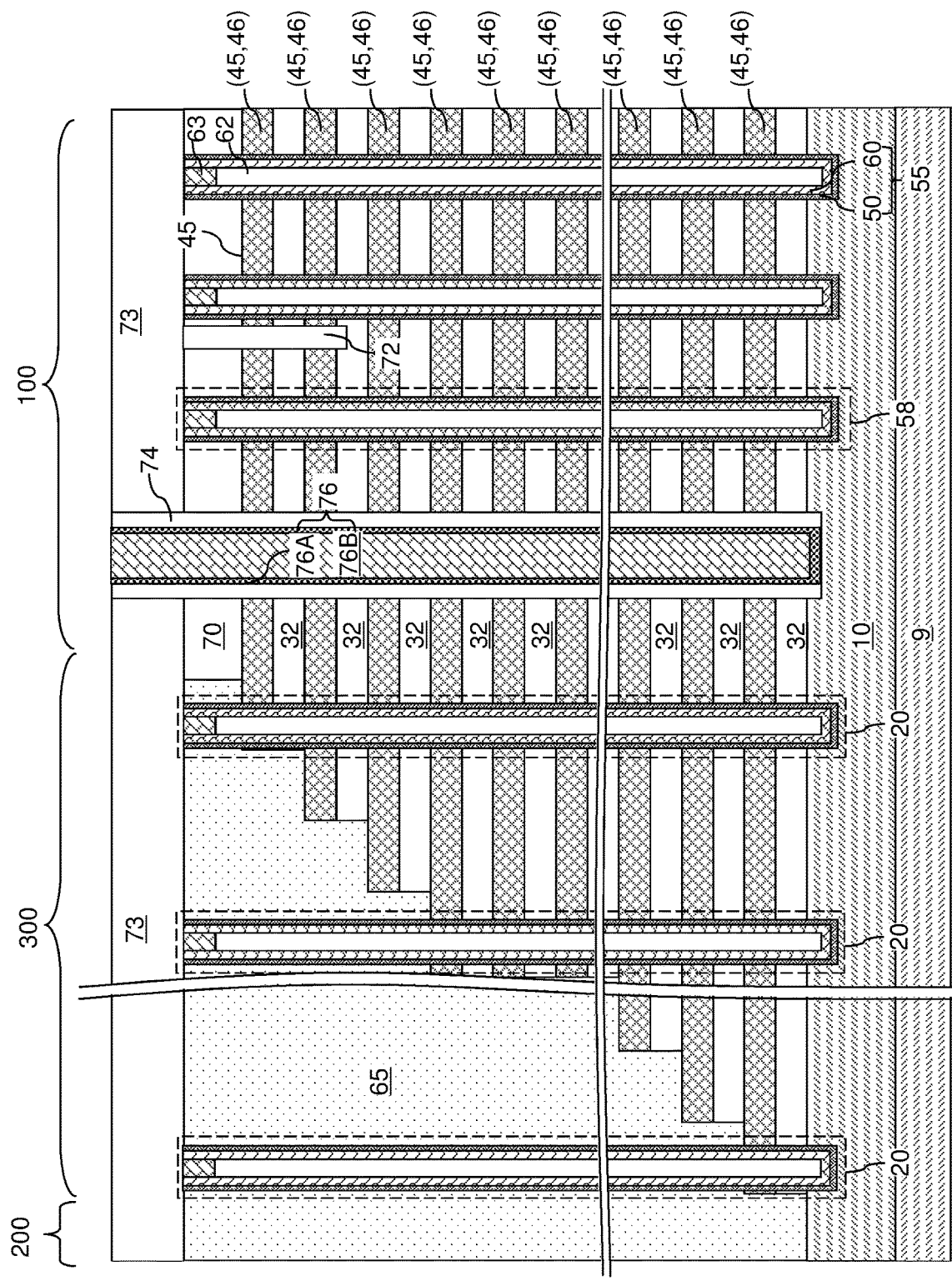
FIG. 13A is a schematic vertical cross-sectional view of the exemplary structure after formation of backside trench fill structures according to an embodiment of the present disclosure.
Figure 13B:
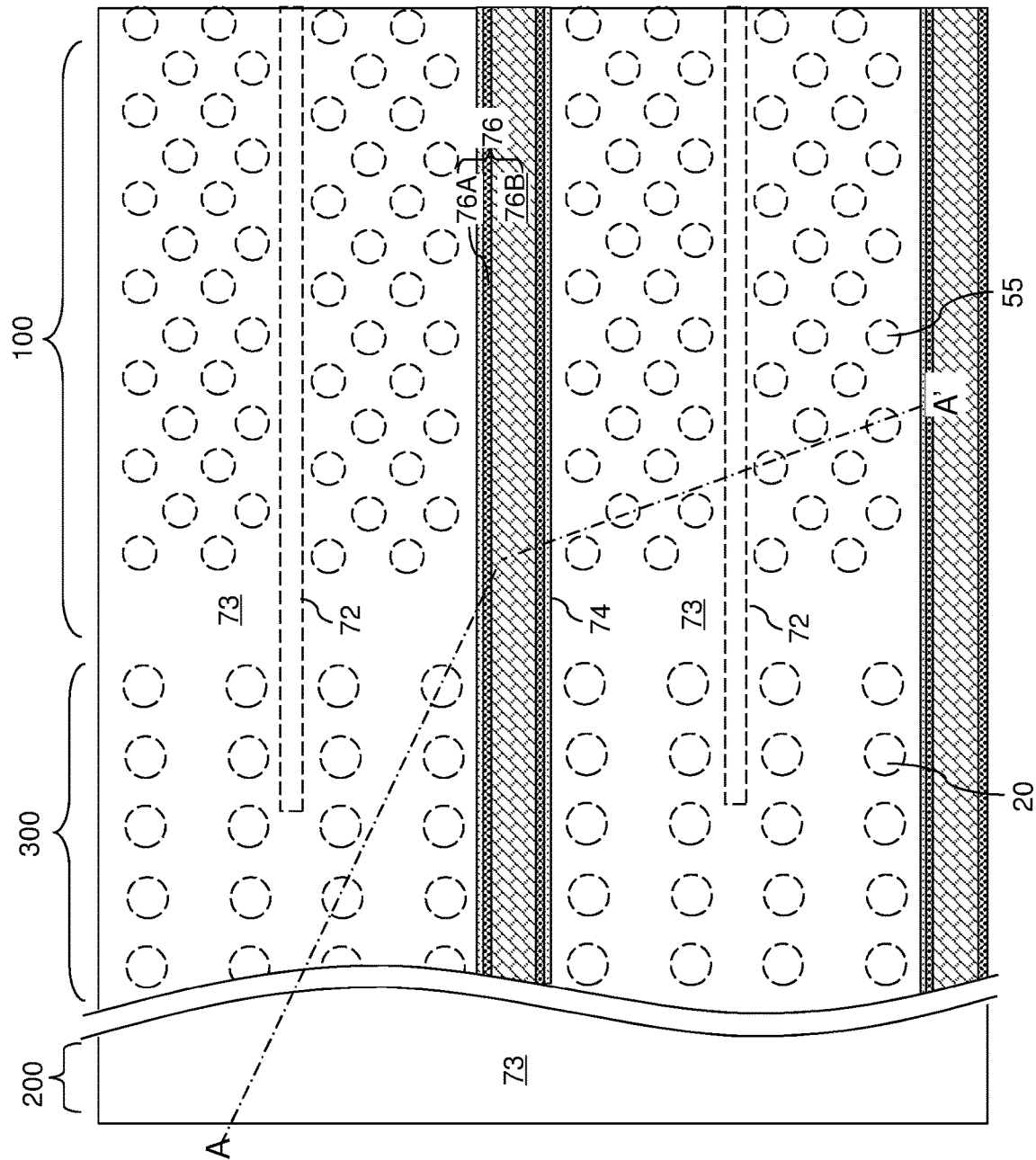
FIG. 13B is a magnified view of a region of the exemplary structure of FIG. 13A.

Referring to FIGS. 13A and 13B, the exemplary structure is illustrated after formation of the backside trench fill structures (74, 76). The processing steps of FIGS. 13A and 13B corresponds to the processing steps of FIG. 9G, 10D, 11D, or 12D. In an alternative embodiment, the backside trench fill structures may be formed as dielectric wall structures consisting essentially of at least one dielectric material such as silicon oxide, silicon nitride, a dielectric metal oxide, an organosilicate glass, or a combination thereof. In one embodiment, the insulating material layer can include silicon oxide.

Figure 14A:
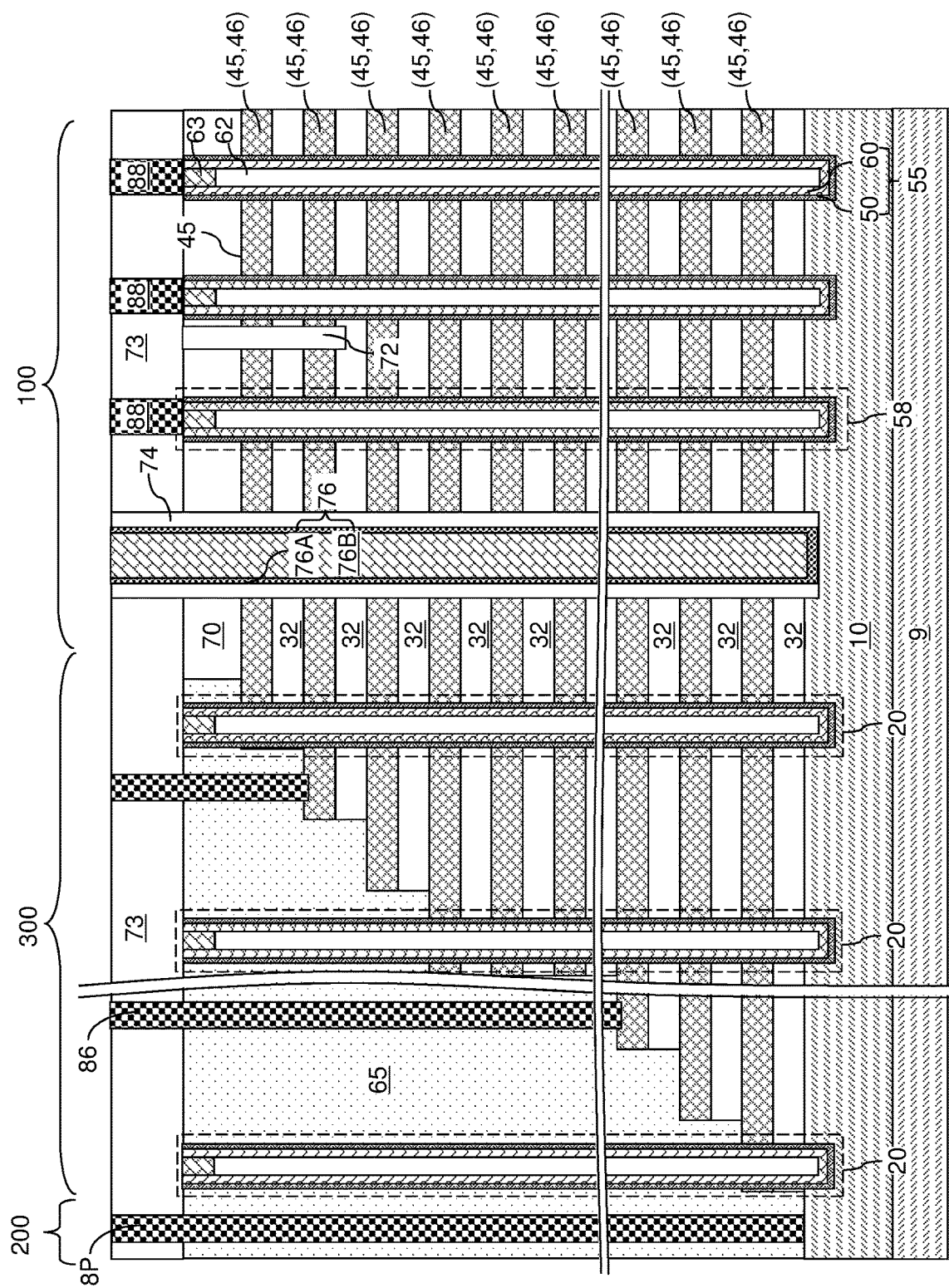
FIG. 14A is a schematic vertical cross-sectional view of the exemplary structure after formation of contact via structures according to an embodiment of the present disclosure.
Figure 14B:
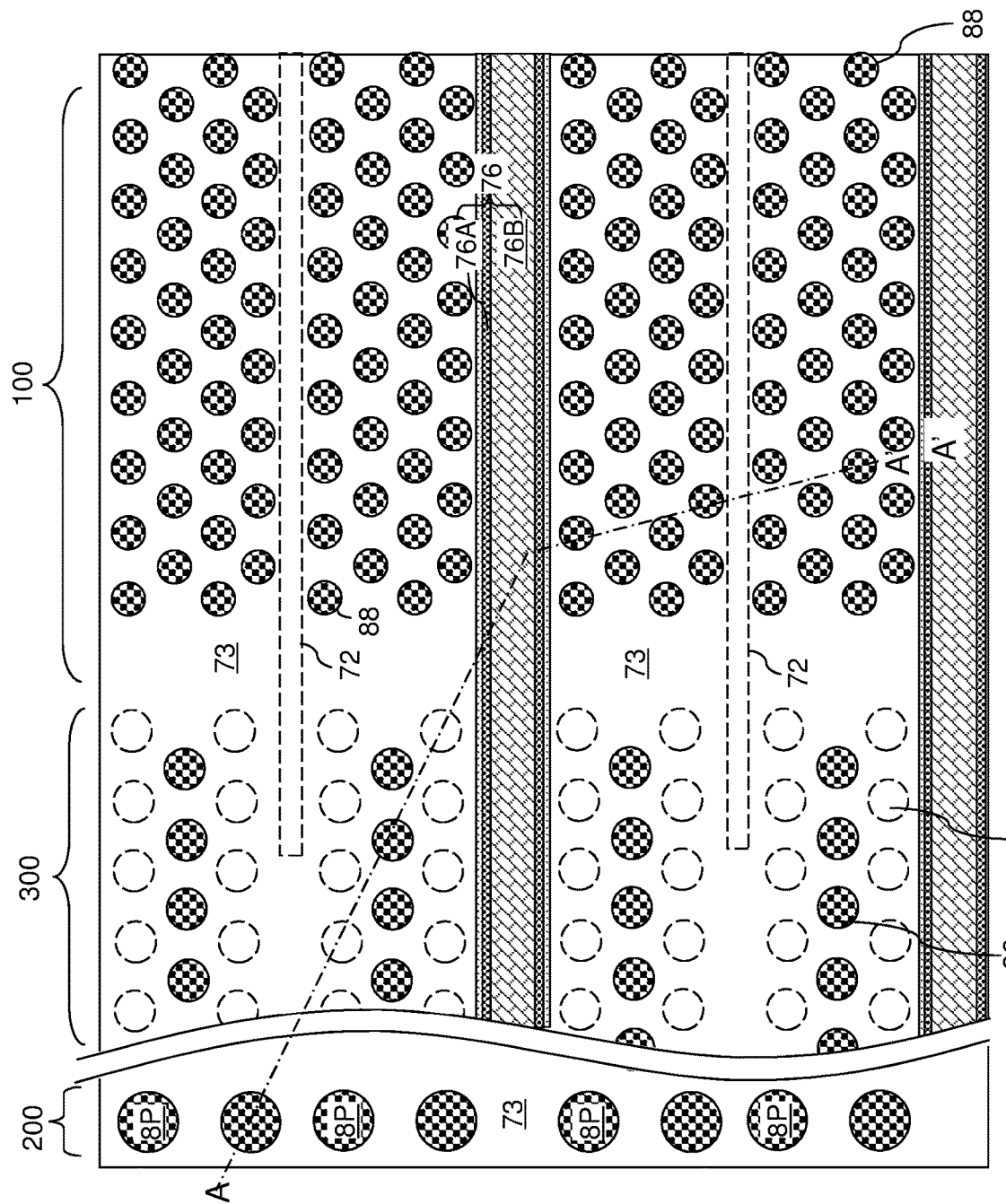
FIG. 14B is a top-down view of the exemplary structure of FIG. 14A. The vertical plane A-A' is the plane of the schematic vertical cross-sectional view of FIG. 14A.

Referring to FIGS. 14A and 14B, additional contact via structures (88, 86, 8P) can be formed through the contact level dielectric layer 73, and optionally through the stepped dielectric material portion 65. For example, drain contact via structures 88 can be formed through the contact level dielectric layer 73 on each drain region 63. Word line contact via structures 86 can be formed on the electrically conductive layers (45, 46) through the contact level dielectric layer 73, and through the stepped dielectric material portion 65. Pass-through via structures 8P can be formed through the stepped dielectric material portion 65 to the semiconductor material layer 10.

Figure 15A:
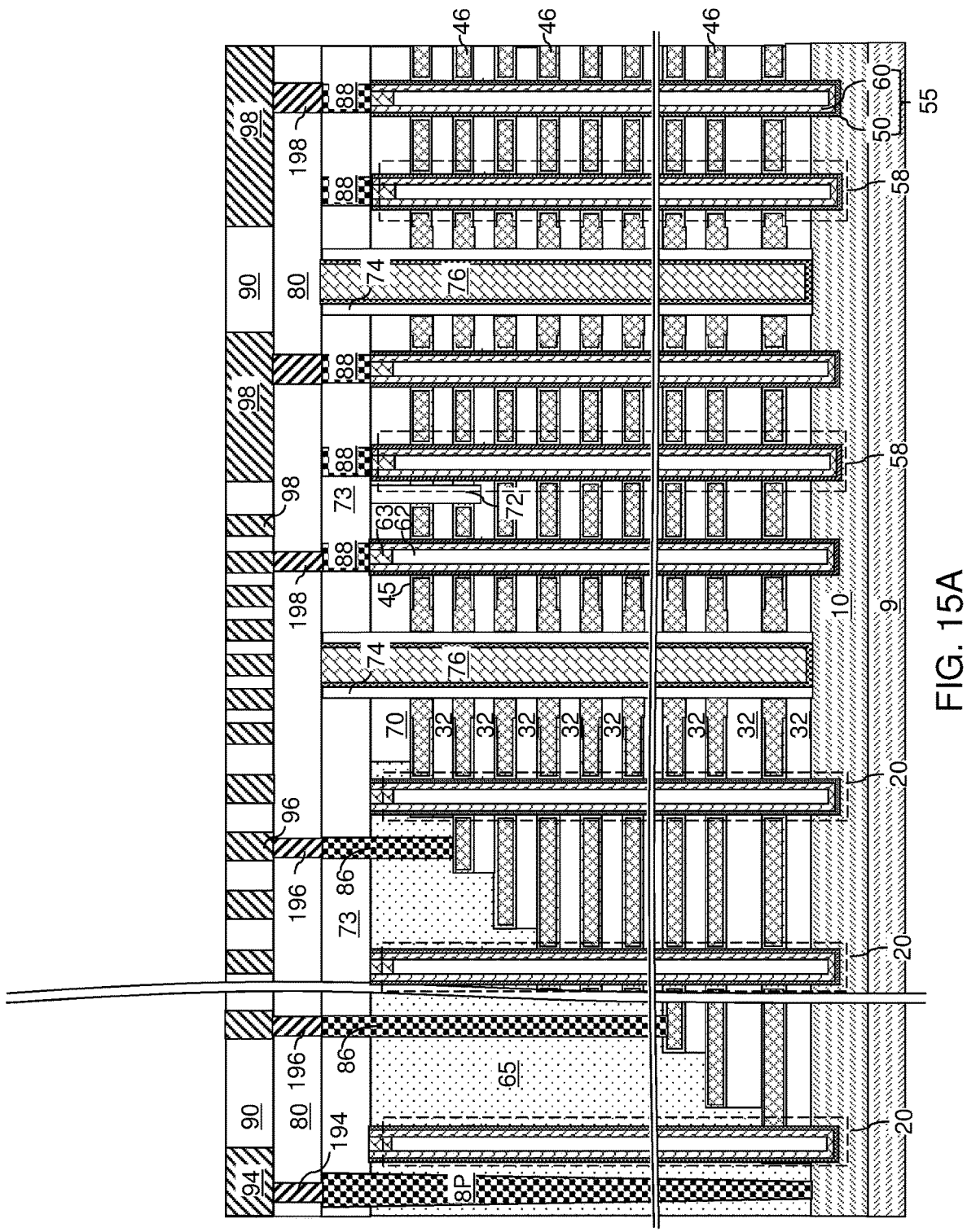
FIG. 15A is a schematic vertical cross-sectional view of the exemplary structure after formation of first via level metal interconnect structures and first line level metal interconnect structures according to an embodiment of the present disclosure.
Figure 15B:
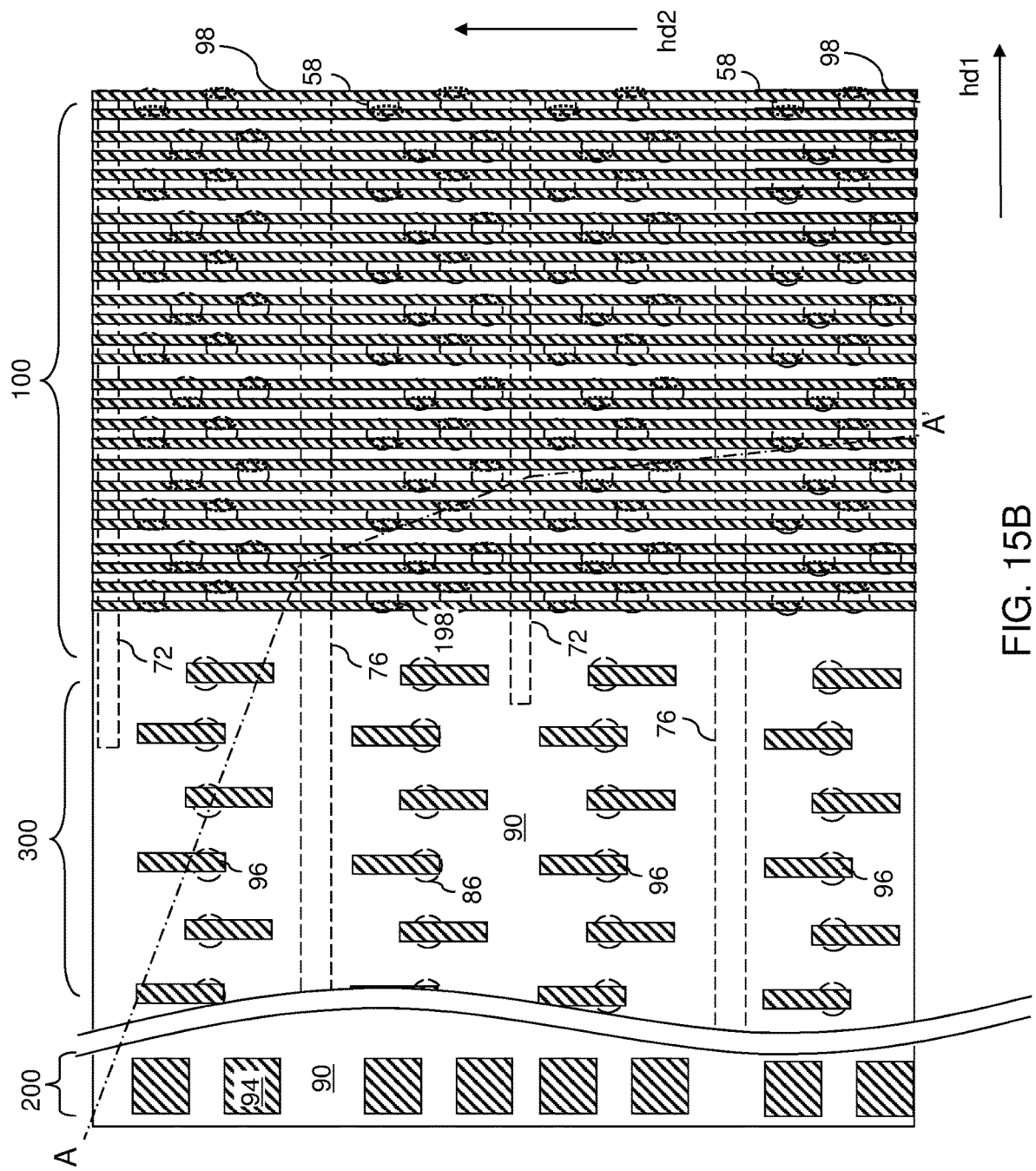
FIG. 15B is a partial see-through top-down view of the exemplary structure of FIG. 15A. The vertical plane A-A' is the plane of the schematic vertical cross-sectional view of FIG. 15A.

Referring to FIGS. 15A and 15B, a via level dielectric layer 80 is formed over the contact level dielectric layer 73. Various contact via structures (198, 196, 194) can be formed through the via level dielectric layer 80. For example, bit line connection via structures 198 can be formed on the drain contact via structures 88, word line connection via structures 196 can be formed on the word line contact via structures 86, and peripheral extension via structures 194 can be formed on the pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical semiconductor channels 60 in the memory stack structures 55 in the memory array region 100. In one embodiment, the memory stack structures 55 are arranged in rows that extend along the first horizontal direction hd1, and the bit lines 98 laterally extend along the second horizontal direction hd2.

Figure 16:
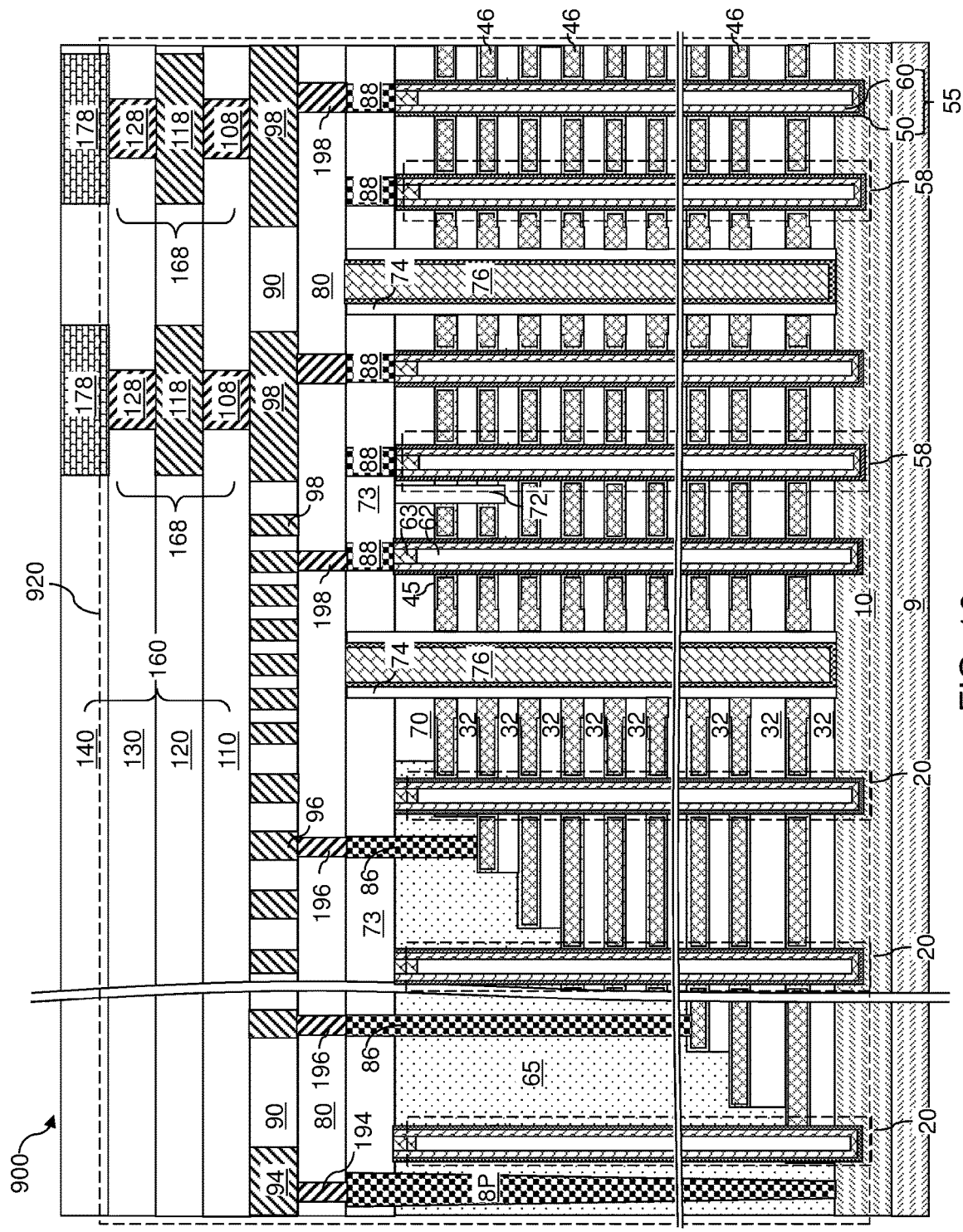
FIG. 16 is a schematic vertical cross-sectional view of the exemplary structure that forms a memory die after formation of additional metal interconnect structures according to an embodiment of the present disclosure.

Referring to FIG. 16, a memory die 900 is formed by optionally performing additional processing steps on the exemplary structure of FIG. 15. Specifically, additional metal interconnect structures 168 included in additional interconnect level dielectric layers 160 are formed. In an illustrative example, the additional interconnect level dielectric layers 160 can include a via level dielectric layer 110, a second line level dielectric layer 120, a second via level dielectric layer 130, and a metallic pad structure level dielectric layer 140. The metal interconnect structures 168 can include first metal via structures 108 included in the first via level dielectric layer 110, second metal line structures 118 included within the second line level dielectric layer 120, second metal via structures 128 included in the second via level dielectric layer 130, and memory-side bonding pads 178 (such as metallic pad structures) included in the metallic pad structure level dielectric layer 140. While an embodiment is described in which the additional interconnect level dielectric layers 160 include the first via level dielectric layer 110, the second line level dielectric layer 120, the second via level dielectric layer 130, and the metallic pad structure level dielectric layer 140, embodiments are expressly contemplated herein in which the additional interconnect level dielectric layers 160 include a different number and/or different combinations of dielectric material layers. The memory die 900 includes a three-dimensional array of memory elements. Electrical connection paths can be provided between each memory-side bonding pad 178 and a respective set of metal interconnect structures {(194, 94, 108, 118, 128), (196, 96, 108, 118, 128), or (198, 98, 108, 118, 128)}. The memory die 900 includes a memory device 920, which may include a three-dimensional memory array of memory-side metal interconnect structures (86, 88, 194, 94, 196, 96, 198, 98, 168). Generally, memory-side dielectric material layers 160 embedding memory-side metal interconnect structures (86, 88, 194, 94, 196, 96, 198, 98, 168) and memory-side bonding pads 178 can be formed over the alternating stack {32, (45, 46)} to provide a memory die 900.

Figure 17:
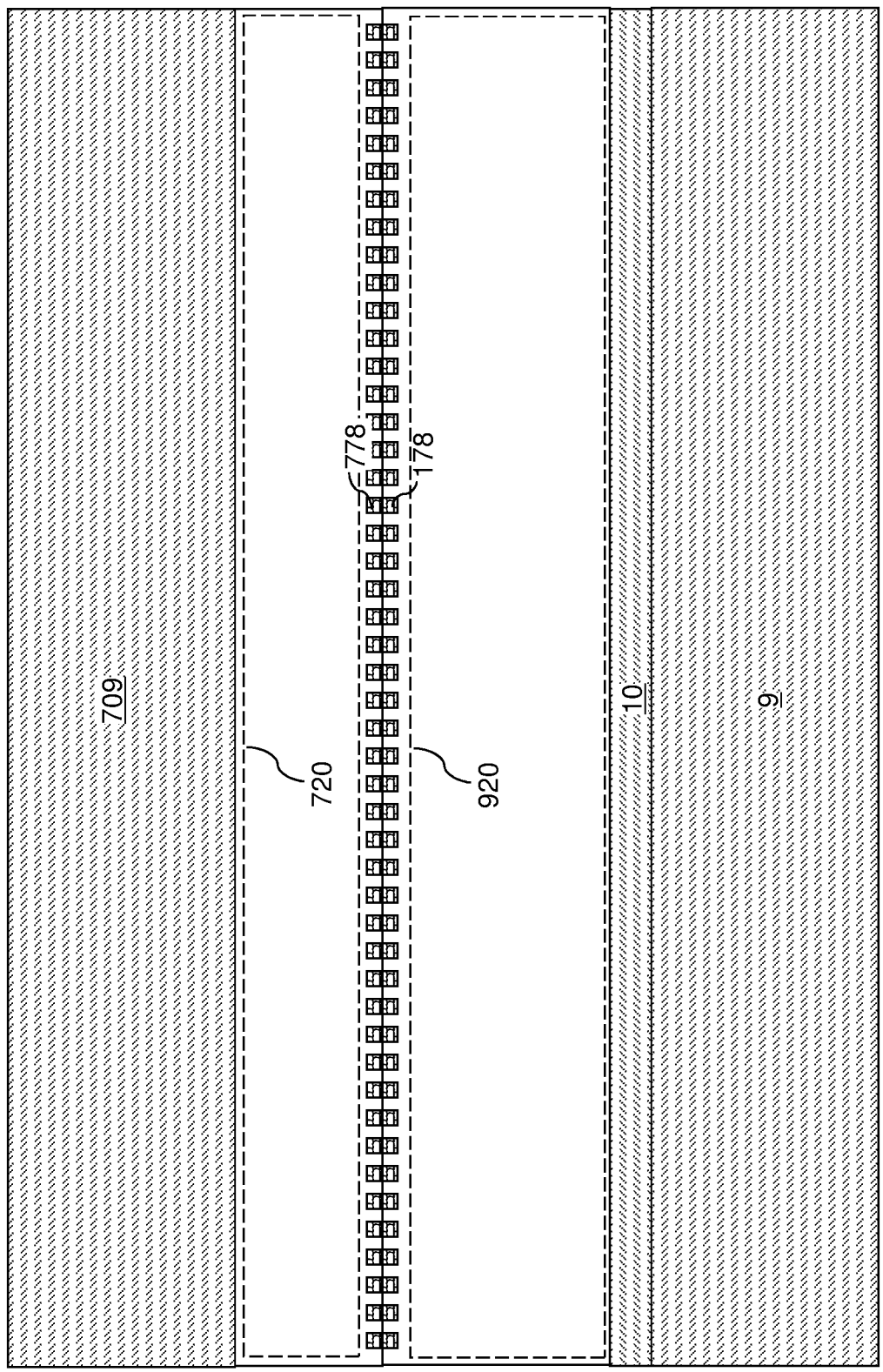
FIG. 17 is a schematic vertical cross-sectional view of the exemplary structure after bonding a logic die to the memory die according to an embodiment of the present disclosure.

Referring to FIG. 17, if the peripheral devices are not located on the substrate 9, then a separate a logic die 700 can be provided. The optional separate logic die 700 includes a logic-side substrate 709, a peripheral circuit 720 located on the logic-side substrate 709 and comprising logic-side semiconductor devices (such as field effect transistors) and logic-side metal interconnect structures, and logic-side bonding pads 778. The peripheral circuit 720 can be configured to control operation of the memory device 920 within the memory die 900. Specifically, the peripheral circuit 720 can be configured to drive various electrical components within the memory device 920 including, but not limited to, the electrically conductive layers (45, 46).

The logic die 700 can be attached to the memory die 900, for example, by bonding the logic-side bonding pads 778 to the memory-side bonding pads 178. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process.

Figure 18:
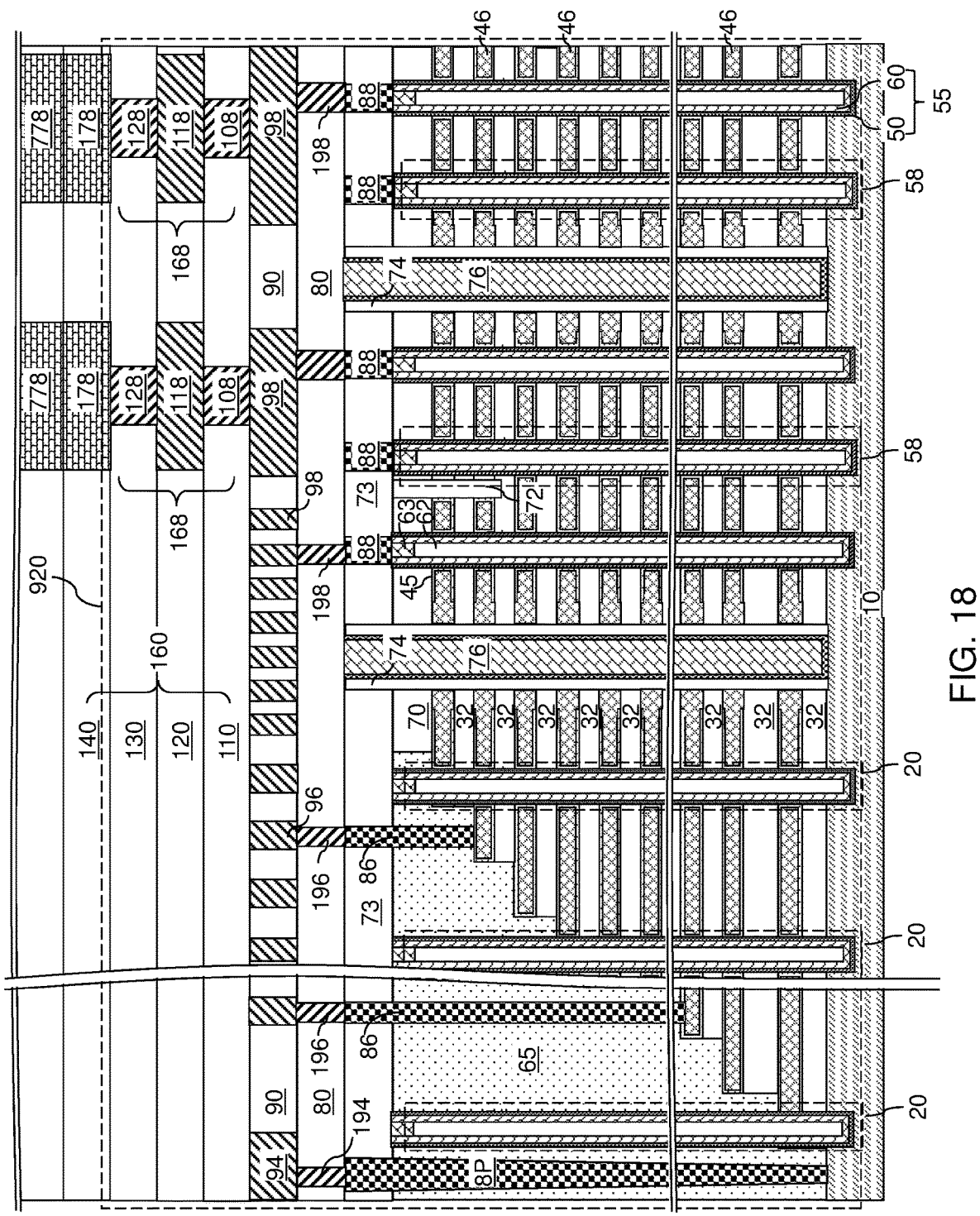
FIG. 18 is a schematic vertical cross-sectional view of a region of the exemplary structure after removal of the substrate layer according to an embodiment of the present disclosure.

Referring to FIG. 18, the carrier substrate 9 can be removed, and bottom surface of the semiconductor material layer 10 can be physically exposed. For example, the carrier substrate 9 can be thinned by grinding, polishing, an isotropic etch process, and/or an anisotropic etch process.

Figure 19:
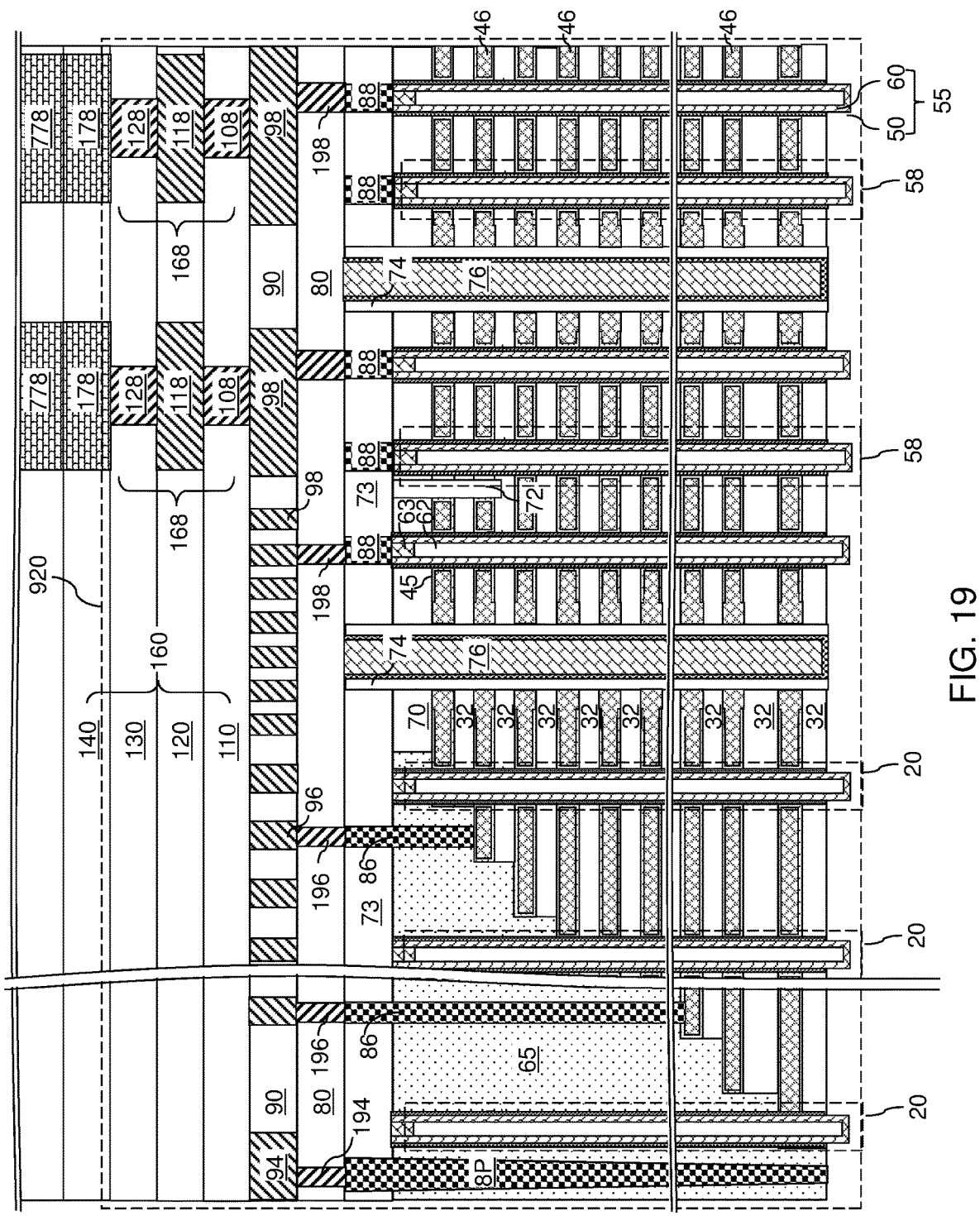
FIG. 19 is a schematic vertical cross-sectional view of a region of the exemplary structure after physically exposing end portions of vertical semiconductor channels according to an embodiment of the present disclosure.

Referring to FIG. 19, the semiconductor material layer 10 can be subsequently removed selective to the memory films 50. In one embodiment, the semiconductor material layer 10 may be removed by a selective etch process that removes the semiconductor material of the semiconductor material layer 10 selective to the dielectric materials of the memory films 50, the insulating layers 32, and the dielectric wall structures 76. For example, a wet etch process employing potassium hydroxide or another suitable etchant may be performed to remove the semiconductor material layer 10.

Subsequently, a sequence of isotropic etch processes may be performed to sequentially etch the materials of the memory films 50. For example, a sequence of wet etch processes may be performed to etch physically exposed bottom portions of the blocking dielectric layers 52, the charge storage layers 54, and the tunneling dielectric layers 56. Generally, end portions of vertical semiconductor channels 60 can be physically exposed by removing a substrate (9, 10) and an end portion of each memory film 50.

Figure 20:
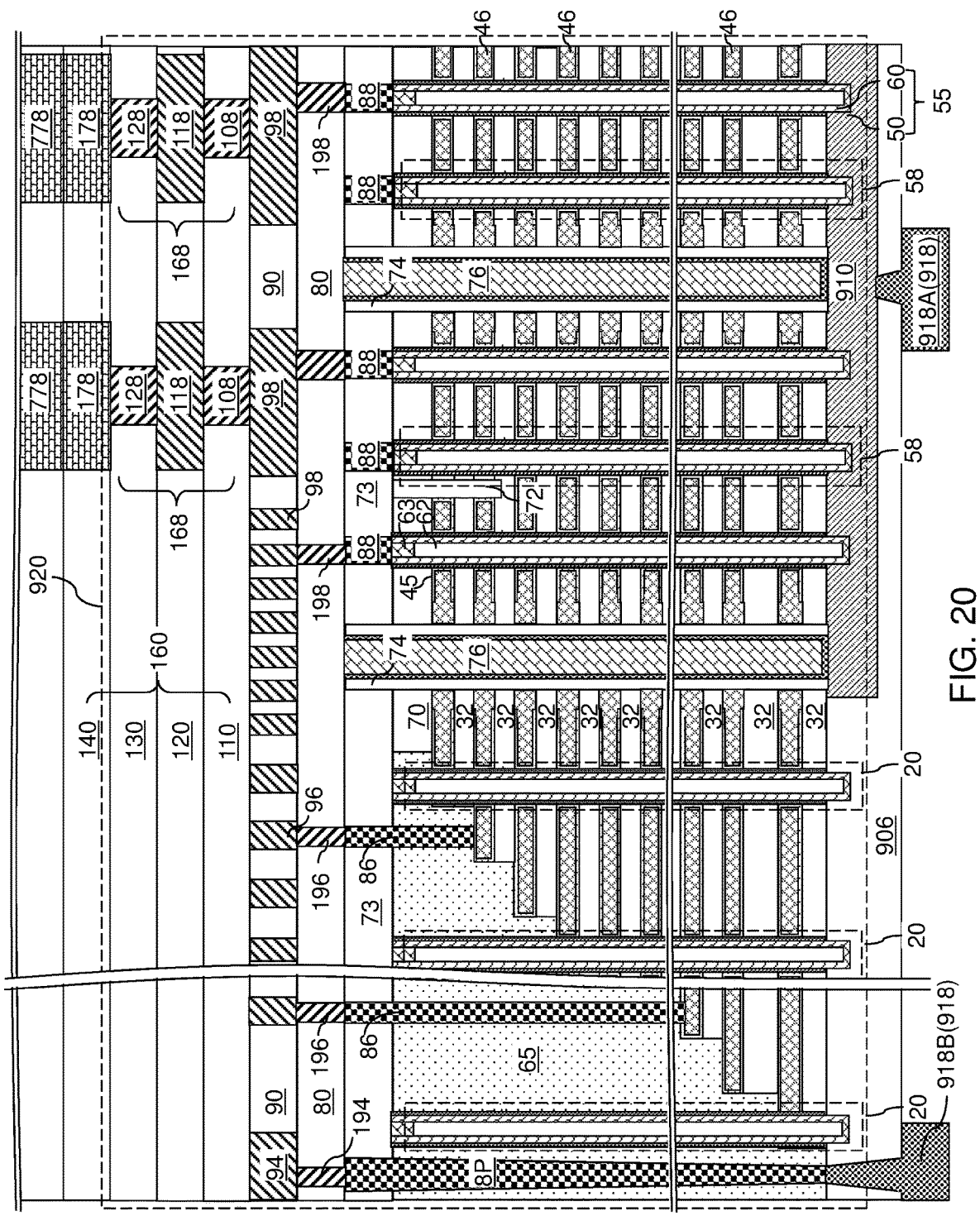
FIG. 20 is a schematic vertical cross-sectional view of a region of the exemplary structure after formation of a source layer and backside bonding structures according to an embodiment of the present disclosure.

Referring to FIG. 20, a semiconductor material layer 910, such as a doped polysilicon layer, can be deposited on the physically exposed surfaces of the vertical semiconductor channels 60 in the memory opening fill structures 58. The semiconductor material layer 910 may be patterned such that the semiconductor material layer 910 does not contact the vertical semiconductor channels 60 within the support pillar structures 20. In one embodiment, the semiconductor material layer 910 may have a same type of doping as the drain regions 63, and may function as a source layer, which is a common source region, for the vertical field effect transistors including the vertical semiconductor channels 60. Generally, a source region comprising the semiconductor material layer 910 can be formed on an end portion of each of the vertical semiconductor channels 60. The semiconductor material layer 910 can be in contact with a horizontal surface of the alternating stack {32, (45, 46)}, such as a horizontal bottom surface of a bottommost insulating layer 32 within the alternating stack {32, (45, 46)}.

A backside insulating layer 906 can be formed on the semiconductor material layer 910 and on any physically exposed surface of the alternating stack {32, (45, 46)}. Backside bonding structures 918 can be formed through backside insulating layer 906. The backside bonding structures 918 may include, for example, at least one source-connection backside bonding structure 918A and at least one additional backside bonding structure 918B that is electrically connected to a respective one of the memory-side metal interconnect structures (86, 88, 194, 94, 196, 96, 198, 98, 168). Generally, each memory opening fill structure 58 comprises a memory film 50, a vertical semiconductor channel 60, and a drain region 63 contacting an upper end of the vertical semiconductor channel 60 that is distal from the semiconductor material layer 910. In one embodiment, the semiconductor material layer 910 comprises a source region having a doping of a same conductivity type as the drain region 63.

Referring to all drawings and according to various embodiments of the present disclosure, a semiconductor structure is provided, which comprises: an alternating stack {32, (45, 46)} of insulating layers 32 and electrically conductive layers (45, 46); memory openings 49 vertically extending through the alternating stack {32, (45, 46)}; memory opening fill structures 58 located in the memory openings 49 and comprising a respective vertical semiconductor channel 60 and a respective vertical stack of memory elements (which may be embodied as portions of a charge storage layer 54 located at levels of the electrically conductive layers (45, 46); and a first backside trench fill structure (74, 76) and a second backside trench fill structure (74, 76) that laterally extend along a first horizontal direction hd1 and are spaced apart along a second horizontal direction hd2, wherein: each of the electrically conductive layers (45, 46) comprises a respective metal nitride liner 45 and a respective metal fill material region 46; and the respective metal fill material region 46 comprises a respective first-thickness portion 46F having a respective first vertical thickness t1 and contacting the respective metal nitride liner 45; and a respective second-thickness portion 46S having a respective second vertical thickness t2 that is greater than the respective first vertical thickness t1 and not contacting the respective metal nitride liner 45, wherein the second-thickness portion 46S located closer to the first backside trench fill structure (74, 76) than the first first-thickness portion 46F.

In the first and third embodiments, the second-thickness portion 46S contacts an overlying insulating layer 32 and an underlying insulating layer 32 of the alternating stack; and the insulating layers 32 comprise silicon oxide layers. In these embodiments, the second-thickness portions are formed in contact with the silicon oxide layers.

In the second and fourth embodiments, the second-thickness portion 46S contacts a silicon nitride liner 47 located between the second-thickness portion 46S and both overlying and underlying insulating layers 32 of the alternating stack; and the insulating layers comprise silicon oxide layers. In these embodiment, the exposed portions of the silicon oxide insulating layers in the second volumes of the backside recesses 43 are converted to the silicon nitride liners 47, and the second-thickness portions 46S are formed in contact with the silicon nitride liners 47.

In one embodiment, for at least one of the electrically conductive layers (45, 46), a top surface of the respective second-thickness portion 46S and a top surface of the respective metal nitride liner 45 are located within a respective first horizontal plane; and a bottom surface of the respective second-thickness portion 46S and a bottom surface of the respective metal nitride liner 45 are located within a respective second horizontal plane.

In one embodiment, each of the electrically conductive layers (45, 46) comprises a respective horizontal top surface located within a respective first horizontal plane and including a top surface segment of the respective metal nitride liner 45 and a top surface segment of the respective second-thickness portion 46S. In one embodiment, each of the electrically conductive layers (45, 46) comprises a respective horizontal top surface located within a respective second horizontal plane and including a bottom surface segment of the respective metal nitride liner 45 and a bottom surface segment of the respective second-thickness portion 46S.

In one embodiment, for at least one of the electrically conductive layers (45, 46), the respective metal nitride liner 45 comprises: a respective two-dimensional array of tubular metal nitride barrier portions laterally surrounding, and contacting, each of the memory opening fill structures; a respective upper horizontally-extending metal nitride barrier portion adjoined to an upper end of each tubular metal nitride barrier portion within the respective two-dimensional array of tubular metal nitride barrier portions; and a respective lower horizontally-extending metal nitride barrier portion adjoined to a lower end of each tubular metal nitride barrier portion within the respective two-dimensional array of tubular metal nitride barrier portions. In one embodiment, the respective upper horizontally-extending metal nitride barrier portion comprises a first tapered end portion including a horizontal top surface segment and a tapered bottom surface segment that adjoins the horizontal top surface segment at a first edge; and the respective lower horizon-tally-extending metal nitride barrier portion comprises a second tapered end portion including a horizontal bottom surface segment and a tapered top surface segment that adjoins the horizontal bottom surface segment at a second edge. In one embodiment, the first edge and the second edge are parallel to the first horizontal direction hd1, and are equidistant from a proximal one among the first backside trench fill structure (74, 76) and the second backside trench fill structure (74, 76).

In one embodiment, the respective metal fill material region 46 comprises: a first metal fill material portion 46A in direct contact with the respective metal nitride liner 45; and two second metal fill material portions 46B laterally spaced from the respective metal nitride liner 45 and in direct contact with a respective one of the first backside trench fill structure (74, 76) and the second backside trench fill structure (74, 76).

In the first and second embodiments, the respective first-thickness portion 46F consists of a first segment of the first metal fill material portion 46A; and the respective second-thickness portion 46S comprises a second segment of the first metal fill material portion 46A and one of the two second metal fill material portions 46B.

In the third and fourth embodiments, the respective first-thickness portion 46F comprises of a first segment of the first metal fill material portion 46A and a first segment of one of the second metal fill material portions 46B; and the respective second-thickness portion 46S comprises a second segment of the first metal fill material portion 46A and a second segment of the one of the two second metal fill material portions 46B.

In one embodiment, the first metal fill material portion 46A comprises a top surface that contains: a first planar top surface segment that contacts a bottom surface of an upper horizontally-extending portion of the respective metal nitride liner 45; a second planar top surface segment that contacts a bottom surface of a respective one of the insulating layers 32; and a tapered top surface segment connecting the first planar top surface segment and the second planar top surface segment and contacting a tapered portion of the upper horizontally-extending portion of the respective metal nitride liner 45.

In one embodiment, the first metal fill material portion 46A and the two second metal fill material portions 46B comprise different metal compositions, or comprise non-metal impurity atoms at different average atomic concentrations that differ at least by 0.1 part per million.

In one embodiment, each of the electrically conductive layers (45, 46) comprises: a first pair of convex surfaces that contacts the first backside trench fill structure (74, 76) and are adjoined at a first horizontal edge that laterally extends along the first horizontal direction hd1; and a second pair of convex surfaces that contacts the second backside trench fill structure (74, 76) and are adjoined at a second horizontal edge that laterally extends along the first horizontal direction hd1.

In one embodiment, for at least one of the electrically conductive layers (45, 46), an entirety of the respective first-thickness portion is laterally offset from the first backside trench fill structure (74, 76) and the second backside trench fill structure (74, 76) by a lateral distance that is greater than a threshold lateral spacing LTS; and an entirety of the respective second-thickness portion is located within a volume defined by a lateral offset distance that equals the threshold lateral spacing LTS from a proximal one of the first backside trench fill structure (74, 76) and the second backside trench fill structure (74, 76).

The various embodiments of the present disclosure provide electrically conductive layers (45, 46) having improved fill properties. Particularly, void formation within the first metal fill material portions 46A can be reduced or eliminated by omitting the metal nitride barrier 45 proximal to the backside trenches 79. This increases the height of the cavities (which equals to the second vertical thickness t2) in the backside recesses 43 that are proximal to the backside trenches 79 during formation of the first metal fill material portions 46A. Thus, a greater amount of metallic precursor may be provided to the voids. Further, void formation of in the second metal fill material portions 46B may be reduced or eliminated by employing a selective metal deposition process for formation of the second metal fill material portions 46B. By reducing or eliminating voids in electrically conductive layers (45, 46), the electrical conductivity of the electrically conductive layers (45, 46) can be increased to reduce the RC delay in the electrically conductive layers (45, 46), which can function as word lines for a three-dimensional memory device. Further, the material compositions of the first metal fill material portions 46A and the second metal fill material portions 46B may be selected to provide enhanced fill properties and high electrical conductivity. For example, the first metal of the first metal fill material portions 46A may be selected to increase the conformity of the deposited first metal, and the second metal of the second metal fill material portions 46B may be selected to increase the overall conductivity of the electrically conductive layers (45, 46).

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure, comprising:
    an alternating stack of insulating layers and electrically conductive layers;
    memory openings vertically extending through the alternating stack;
    memory opening fill structures located in the memory openings and comprising a respective vertical semiconductor channel and a respective vertical stack of memory elements; and
    a first backside trench fill structure and a second backside trench fill structure that laterally extend along a first horizontal direction and are spaced apart along a second horizontal direction, wherein:
    each of the electrically conductive layers comprises a respective metal nitride liner and a respective metal fill material region; and the respective metal fill material region comprises:
  a respective first-thickness portion having a respective first vertical thickness and contacting the respective metal nitride liner; and
  a respective second-thickness portion having a respective second vertical thickness that is greater than the respective first vertical thickness and not contacting the respective metal nitride liner, wherein the second-thickness portion located closer to the first backside trench fill structure than the first first-thickness portion;
the second-thickness portion contacts a silicon nitride liner located between the second-thickness portion and both overlying and underlying insulating layers of the alternating stack; and
the insulating layers comprise silicon oxide layers.

2. A semiconductor structure, comprising:
an alternating stack of insulating layers and electrically conductive layers;
memory openings vertically extending through the alternating stack;
memory opening fill structures located in the memory openings and comprising a respective vertical semiconductor channel and a respective vertical stack of memory elements; and
a first backside trench fill structure and a second backside trench fill structure that laterally extend along a first horizontal direction and are spaced apart along a second horizontal direction, wherein:
each of the electrically conductive layers comprises a respective metal nitride liner and a respective metal fill material region; and
the respective metal fill material region comprises:
  a respective first-thickness portion having a respective first vertical thickness and contacting the respective metal nitride liner; and
  a respective second-thickness portion having a respective second vertical thickness that is greater than the respective first vertical thickness and not contacting the respective metal nitride liner, wherein the second-thickness portion located closer to the first backside trench fill structure than the first first-thickness portion; and
wherein, for at least one of the electrically conductive layers, the respective metal nitride liner comprises:
  a respective two-dimensional array of tubular metal nitride barrier portions laterally surrounding and contacting each of the memory opening fill structures;
  a respective upper horizontally-extending metal nitride barrier portion adjoined to an upper end of each tubular metal nitride barrier portion of the respective two-dimensional array of tubular metal nitride barrier portions; and
  a respective lower horizontally-extending metal nitride barrier portion adjoined to a lower end of each tubular metal nitride barrier portion of the respective two-dimensional array of tubular metal nitride barrier portions.

3. The semiconductor structure of claim 2, wherein:
the respective upper horizontally-extending metal nitride barrier portion comprises a first tapered end portion including a horizontal top surface segment and a tapered bottom surface segment that adjoins the horizontal top surface segment at a first edge;
the respective lower horizontally-extending metal nitride barrier portion comprises a second tapered end portion including a horizontal bottom surface segment and a tapered top surface segment that adjoins the horizontal bottom surface segment at a second edge;
the first edge and the second edge are parallel to the first horizontal direction, and are equidistant from a proximal first backside trench fill structure and the second backside trench fill structure, respectively.

4. A semiconductor structure, comprising:
an alternating stack of insulating layers and electrically conductive layers;
memory openings vertically extending through the alternating stack;
memory opening fill structures located in the memory openings and comprising a respective vertical semiconductor channel and a respective vertical stack of memory elements; and
a first backside trench fill structure and a second backside trench fill structure that laterally extend along a first horizontal direction and are spaced apart along a second horizontal direction, wherein:
each of the electrically conductive layers comprises a respective metal nitride liner and a respective metal fill material region;
the respective metal fill material region comprises:
  a first metal fill material portion in direct contact with the respective metal nitride liner;
  two second metal fill material portions laterally spaced from the respective metal nitride liner and in direct contact with a respective one of the first backside trench fill structure and the second backside trench fill structure;
  a respective first-thickness portion having a respective first vertical thickness and contacting the respective metal nitride liner, wherein the respective first-thickness portion consists of a first segment of the first metal fill material portion or comprises of a first segment of the first metal fill material portion and a first segment of one of the second metal fill material portions; and
  a respective second-thickness portion having a respective second vertical thickness that is greater than the respective first vertical thickness and not contacting the respective metal nitride liner, wherein the second-thickness portion located closer to the first backside trench fill structure than the first first-thickness portion, and wherein the respective second-thickness portion comprises a second segment of the first metal fill material portion and either one of the two second metal fill material portions or a second segment of the one of the two second metal fill material portions.

5. The semiconductor structure of claim 4, wherein:
the respective first-thickness portion consists of the first segment of the first metal fill material portion; and
the respective second-thickness portion comprises the second segment of the first metal fill material portion and the one of the two second metal fill material portions.

6. The semiconductor structure of claim 4, wherein:
the respective first-thickness portion comprises of the first segment of the first metal fill material portion and the first segment of one of the second metal fill material portions; and
the respective second-thickness portion comprises the second segment of the first metal fill material portion and the second segment of the one of the two second metal fill material portions.

7. The semiconductor structure of claim 4, wherein the first metal fill material portion comprises a top surface that contains:
a first planar top surface segment that contacts a bottom surface of an upper horizontally-extending portion of the respective metal nitride liner;
a second planar top surface segment that contacts a bottom surface of a respective one of the insulating layers; and
a tapered top surface segment connecting the first planar top surface segment and the second planar top surface segment and contacting a tapered portion of the upper horizontally-extending portion of the respective metal nitride liner.

8. The semiconductor structure of claim 4, wherein the first metal fill material portion and the two second metal fill material portions comprise different metal compositions, or comprise non-metal impurity atoms at different average atomic concentrations that differ at least by 0.1 part per million.

9. A semiconductor structure, comprising:
an alternating stack of insulating layers and electrically conductive layers;
memory openings vertically extending through the alternating stack;
memory opening fill structures located in the memory openings and comprising a respective vertical semiconductor channel and a respective vertical stack of memory elements; and
a first backside trench fill structure and a second backside trench fill structure that laterally extend along a first horizontal direction and are spaced apart along a second horizontal direction,
wherein:
each of the electrically conductive layers comprises:
a respective metal nitride liner and a respective metal fill material region;
a first pair of convex surfaces of the respective metal fill material region that contacts the first backside trench fill structure and are adjoined at a first horizontal edge that laterally extends along the first horizontal direction; and
a second pair of convex surfaces of the respective metal fill material region that contacts the second backside trench fill structure and are adjoined at a second horizontal edge that laterally extends along the first horizontal direction; and
the respective metal fill material region comprises:
a respective first-thickness portion having a respective first vertical thickness and contacting the respective metal nitride liner; and
a respective second-thickness portion having a respective second vertical thickness that is greater than the respective first vertical thickness and not contacting the respective metal nitride liner, wherein the second-thickness portion located closer to the first backside trench fill structure than the first first-thickness portion.

10. A method of forming a semiconductor structure, the method comprising:
forming an alternating stack of insulating layers and sacrificial material layers over a substrate;
forming memory openings vertically extending through the alternating stack;
forming memory opening fill structures in the memory openings, wherein each of the memory opening fill structures comprises a respective vertical semiconductor channel and a respective vertical stack of memory elements;
forming backside trenches vertically extending through the alternating stack;
forming backside recesses by removing the sacrificial material layers selective to the insulating layers and the memory opening fill structures;
forming metal nitride liners in first volumes of the backside recesses that are more distal from the backside trenches than a threshold lateral spacing such that the metal nitride liners are not present in second volumes of the backside recesses that are less distal from the backside trenches than the threshold lateral spacing; and
forming respective metal fill material regions both in the second volumes of the backside recesses and on the metal nitride liners in the first volumes of the backside recesses;
wherein the metal fill material regions are formed by selective deposition and each comprise:
a respective first-thickness portion having a respective first vertical thickness and contacting the respective metal nitride liner; and
a respective second-thickness portion having a respective second vertical thickness that is greater than the respective first vertical thickness and not contacting the respective metal nitride liner, wherein the second-thickness portion located closer to the backside trenches than the first first-thickness portion; and
further comprising converting exposed portions of the insulating layers in the second volumes of the backside recesses to silicon nitride liners, wherein the second-thickness portions are formed in contact with the silicon nitride liners.

11. A method of forming a semiconductor structure, the method comprising:
forming an alternating stack of insulating layers and sacrificial material layers over a substrate;
forming memory openings vertically extending through the alternating stack;
forming memory opening fill structures in the memory openings, wherein each of the memory opening fill structures comprises a respective vertical semiconductor channel and a respective vertical stack of memory elements;
forming backside trenches vertically extending through the alternating stack;
forming backside recesses by removing the sacrificial material layers selective to the insulating layers and the memory opening fill structures;
forming metal nitride liners in first volumes of the backside recesses that are more distal from the backside trenches than a threshold lateral spacing such that the metal nitride liners are not present in second volumes of the backside recesses that are less distal from the backside trenches than the threshold lateral spacing; and
forming respective metal fill material regions both in the second volumes of the backside recesses and on the metal nitride liners in the first volumes of the backside recesses;
wherein:
the metal fill material regions are formed by:
performing a first selective metal deposition process that grows a respective first metal fill material portion directly on each of the metal nitride liners; and performing a second selective metal deposition process that grows two second metal fill material portions directly on each of the first metal fill material portions;

the first metal fill material portions comprise an upper laterally-extending portion and a lower laterally-extending portion that are separated from each other by a laterally-extending cavity after the first selective metal deposition process; and the second metal fill material portions are formed within and fills the laterally-extending cavities.

* * * * *